United States Patent
Saeki et al.

(10) Patent No.: US 11,169,563 B2
(45) Date of Patent: Nov. 9, 2021

(54) SEMICONDUCTOR CIRCUIT APPARATUS AND SYSTEM EQUIPPED WITH SEMICONDUCTOR CIRCUIT APPARATUS

(71) Applicant: Sony Semiconductor Solutions Corporation, Kanagawa (JP)

(72) Inventors: Takanori Saeki, Kanagawa (JP); Masayuki Katakura, Kanagawa (JP); Tatsuya Shirakawa, Tokyo (JP); Yoshinori Tanaka, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/261,358

(22) PCT Filed: Aug. 9, 2019

(86) PCT No.: PCT/JP2019/031618
§ 371 (c)(1),
(2) Date: Jan. 19, 2021

(87) PCT Pub. No.: WO2020/039977
PCT Pub. Date: Feb. 27, 2020

(65) Prior Publication Data
US 2021/0286400 A1   Sep. 16, 2021

(30) Foreign Application Priority Data

Aug. 21, 2018  (JP) .............................. JP2018-154510

(51) Int. Cl.
*G06F 1/10*    (2006.01)
*H03K 3/012*  (2006.01)
(Continued)

(52) U.S. Cl.
CPC ............... *G06F 1/10* (2013.01); *H03K 3/012* (2013.01); *H03K 5/24* (2013.01); *H03K 2005/00013* (2013.01)

(58) Field of Classification Search
CPC . G06F 1/10; H03K 3/012; H03K 5/24; H03K 2005/00013
(Continued)

(56) References Cited

U.S. PATENT DOCUMENTS 5,734,285 A * 3/1998 Harvey .................. H03K 3/037
                                                                327/291
5,734,882 A * 3/1998 Lopresti .............. G06F 16/5854
                                                                345/179
(Continued)

FOREIGN PATENT DOCUMENTS

| JP | 08-505018 A | 5/1996 |
| JP | 09-321591 A | 12/1997 |
| JP | 2015-534671 A | 12/2015 |

OTHER PUBLICATIONS

International Search Report (PCT/ISA/210), International Application No. PCT/JP2019/025562, dated Sep. 2, 2019.
(Continued)

*Primary Examiner* — Tomi Skibinski
(74) *Attorney, Agent, or Firm* — Michael Best & Friedrich LLP

(57) ABSTRACT

A semiconductor circuit apparatus of the present disclosure includes a control circuit controlling a clock signal externally input, a drive circuit performing a switching operation according to a pulse signal provided by the control circuit, a series connection circuit including an inductor element, a switch element, and a capacitive element connected in series between a signal line and a fixed potential node, the series connection circuit forming an LC resonance circuit, and a
(Continued)

level detection circuit having an input end connected to the signal line. An output from the level detection circuit is fed back to the control circuit.

20 Claims, 58 Drawing Sheets

(51) Int. Cl.
  *H03K 5/24* (2006.01)
  *H03K 5/00* (2006.01)
(58) Field of Classification Search
  USPC .......................................................... 327/261
  See application file for complete search history.

(56) References Cited

U.S. PATENT DOCUMENTS

| | | | | |
|---|---|---|---|---|
| 8,854,100 | B2* | 10/2014 | Sathe | ................... H03K 19/003 |
| | | | | 327/291 |
| 8,941,432 | B2* | 1/2015 | Sathe | ....................... H03K 3/57 |
| | | | | 327/304 |
| 2004/0145411 | A1* | 7/2004 | Harvey | .............. H03K 17/6872 |
| | | | | 330/251 |
| 2018/0226969 | A1* | 8/2018 | Salem | ................ H03K 19/0963 |

OTHER PUBLICATIONS

Notification of Transmittal of the International Search Report and the Written Opinion of the International Searching Authority, or the Declaration (PCT/ISA/220), International Application No. PCT/JP2019/025562, dated Sep. 10, 2019.
Written Opinion of the International Search Authority (PCT/ISA/237), International Application No. PCT/JP2019/025562, dated Sep. 10, 2019.
Rahman Fahim ur et al., "Quasi-Resonant Clocking:Continuous Voltage-Frequency Scalable Resonant Clocking System for Dynamic Voltage-Frequency Scaling Systems", IEEE Jounal of Solid-State Circuits, 2018, vol. 53, No. 3, p. 924-935.

* cited by examiner

DURING Active STATE : $S_1 \rightarrow$ on
DURING Sleep STATE : $S_2 \rightarrow$ on

FIG.34

| FORWARD LOGIC (Fsel) | BACKWARD LOGIC (Bsel) | FORWARD DRIVE RATIO | BACKWARD DRIVE RATIO | DELAY TIME RATIO |
|---|---|---|---|---|
| 0 | 0 | 1 | 1 | 1 |
| 0 | 1 | 1 | 0.9 | 0.9 |
| 1 | 0 | 1.25 | 1 | 0.8 |
| 1 | 1 | 1.25 | 0.9 | 0.72 |

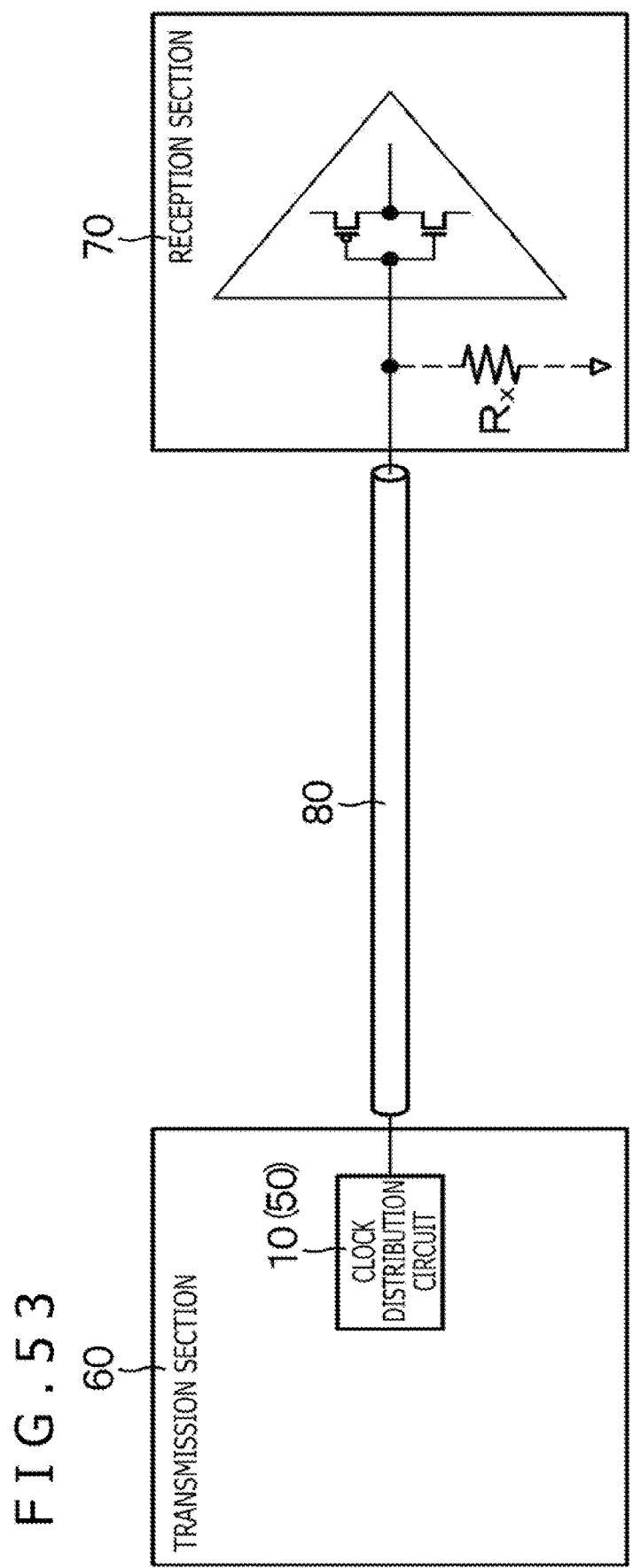

F I G . 5 4
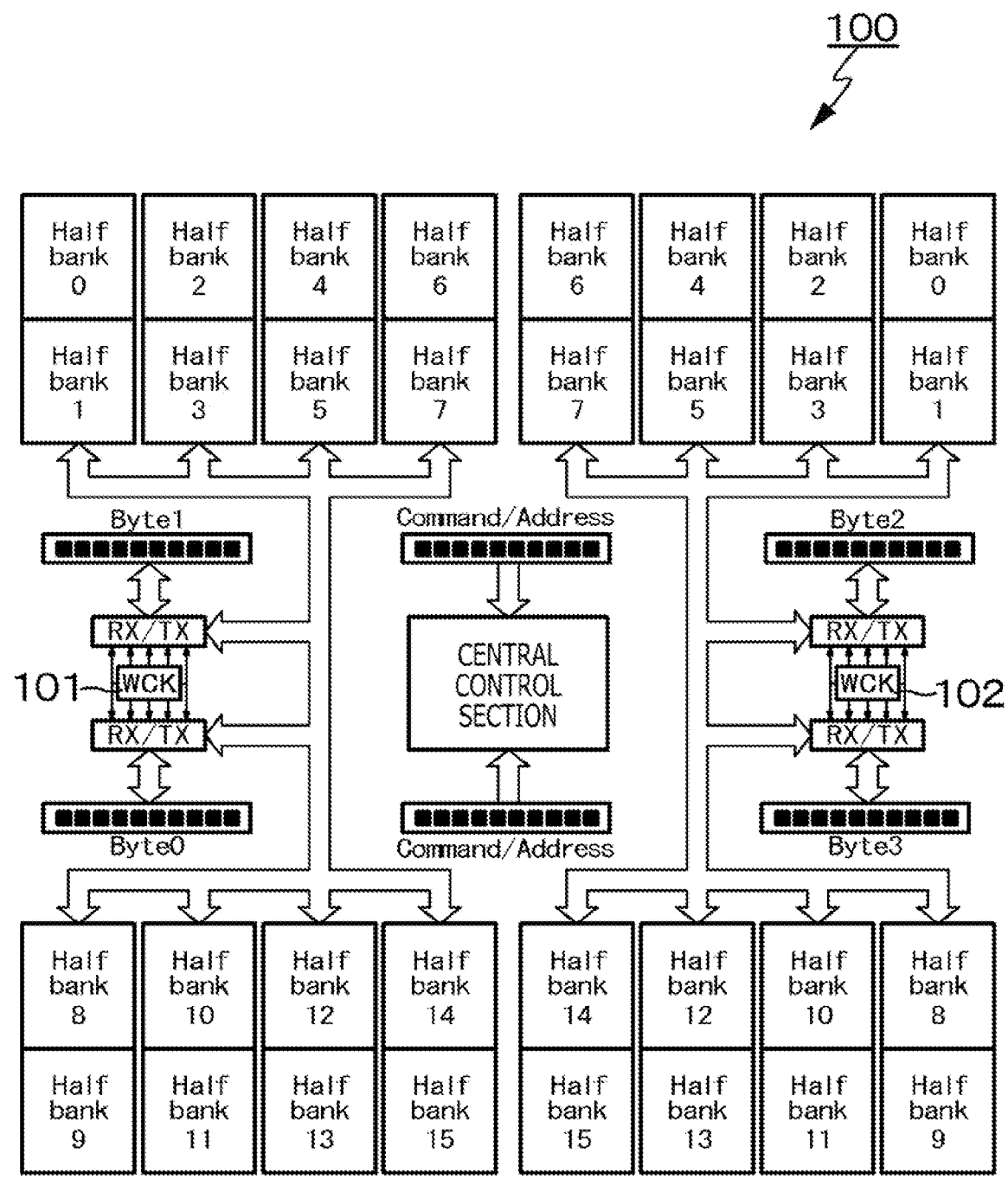

SEMICONDUCTOR CIRCUIT APPARATUS AND SYSTEM EQUIPPED WITH SEMICONDUCTOR CIRCUIT APPARATUS

TECHNICAL FIELD

The present disclosure relates to a semiconductor circuit apparatus and a system equipped with the semiconductor circuit apparatus.

BACKGROUND ART

Among semiconductor circuit apparatuses, a clock distribution circuit is known that distributes a clock signal within a predetermined system. As a low-power clock distribution technique, a clock distribution circuit has been proposed that uses, as a clock buffer circuit, an LC resonance circuit that causes intermittent resonance under pulse control (see, for example, NPL 1).

CITATION LIST

Non Patent Literature

[NPL 1]
ISSCC2016 19.6 Voltage-Scalable Frequency-Independent Quasi-Resonant Clocking Implementation of-a 0.7-to1.2V DVFS System

SUMMARY

Technical Problem

In the clock distribution circuit using the LC resonance circuit causing intermittent resonance, pulse control is used to control the resonance in the LC resonance circuit. However, synchronizing timing for the pulse control with the resonance period of the LC resonance circuit is difficult. Thus, in the above-described related art, for example, a DLL (Delay Locked Loop) circuit, which requires a long time for measurement, is used to detect a peak current with a very small resonance amplitude.

An object of the present disclosure is to provide a semiconductor circuit apparatus that can synchronize the timing for the pulse control with the resonance period of the LC resonance circuit without a need for detection of a peak current with a very small resonance amplitude.

Solution to Problem

A semiconductor circuit apparatus of the present disclosure for achieving the above-described object, includes:
a control circuit controlling a clock signal externally input,
a drive circuit performing a switching operation according to a pulse signal provided by the control circuit,
a series connection circuit including an inductor element, a switch element, and a capacitive element connected in series between a signal line and a fixed potential node, the series connection circuit forming an LC resonance circuit, and
a level detection circuit having an input end connected to the signal line,
in which an output from the level detection circuit is fed back to the control circuit.

Additionally, a system of the present disclosure for achieving the above-described object is equipped with the semiconductor circuit apparatus configured as described above.

BRIEF DESCRIPTION OF DRAWINGS

FIG. 34 is a diagram illustrating a relationship among a forward logic (Fsel) and a backward logic (Bsel), a forward drive ratio, a backward drive ratio, and a delay time ratio.

FIG. 53 is a configuration diagram of a transmission system performing clock distribution through a transmission cable.

FIG. 54 is a block diagram illustrating a configuration of a system according to Applied Example 1.

DESCRIPTION OF EMBODIMENTS

Figure 1:
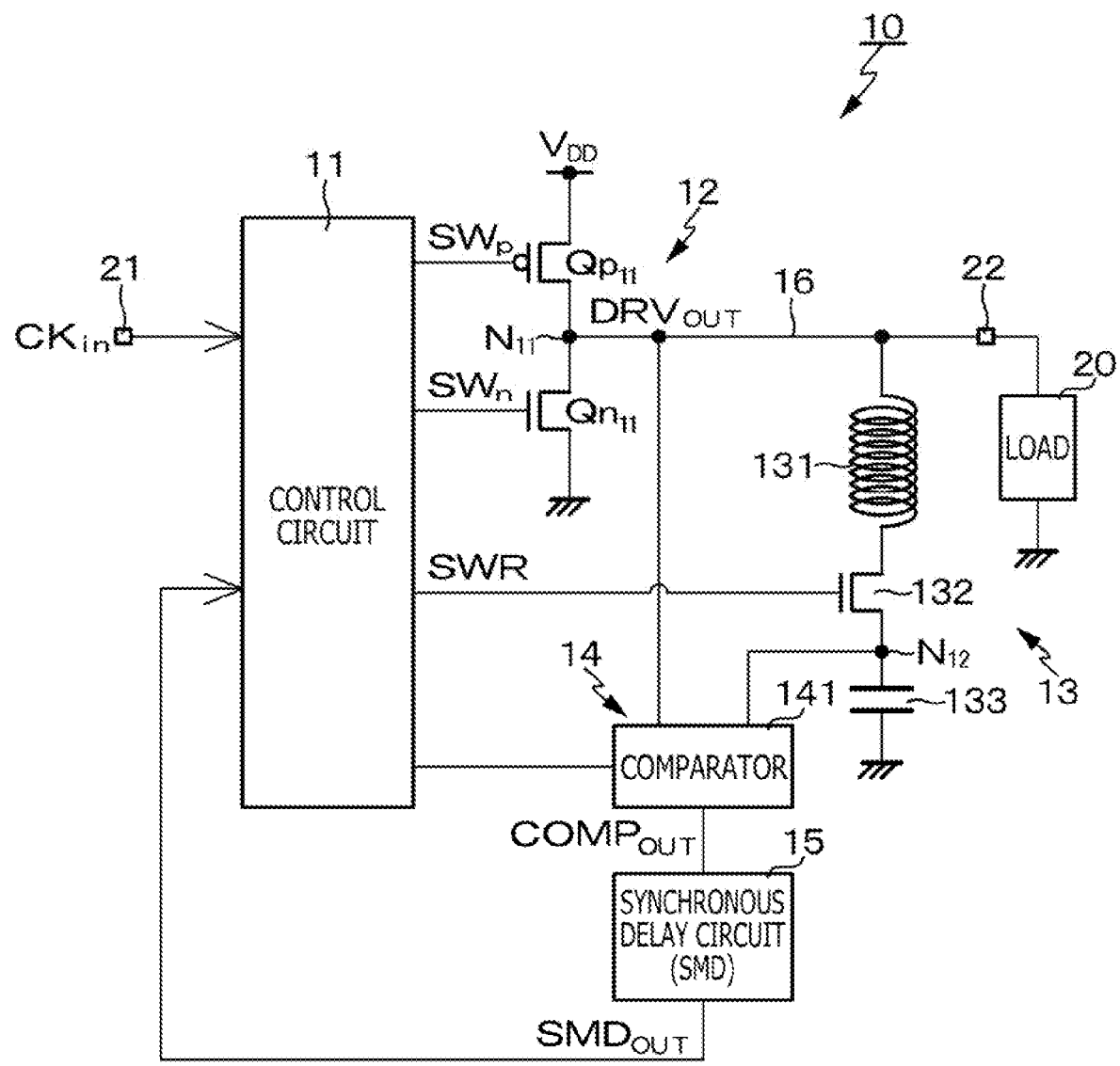
FIG. 1 is a circuit diagram illustrating a circuit configuration of a clock distribution circuit according to Example 1.

Embodiments of techniques of the present disclosure (hereinafter referred to as an "embodiment") will be described below in detail using the drawings. The techniques of the present disclosure are not limited to the embodiment. In the description below, for the same elements or elements having the same functions, the same reference signs are used, and duplicated descriptions are omitted. The description is in the following order.

1. Description of Semiconductor Circuit Apparatus and System Equipped with Semiconductor Circuit Apparatus in General
2. First Embodiment (Example of Intermittent LC Resonance Circuit under Pulse Control)
   2-1. Example 1 (Single Phase Configuration: Example in which ($\frac{1}{2}$)$V_{DD}$ of Resonance Amplitude Is Detected)
   2-2. Example 2 (Single Phase Configuration: Example in which ($\frac{1}{4}$)$V_{DD}$ of Resonance Amplitude Is Detected)
   2-3. Example 3 (Example in which ($\frac{1}{2}$)$V_{DD}$ Is Generated According to Enable Signal)
   2-4. Example 4 (Modified Example of Example 3: Example in which ($\frac{1}{4}$)$V_{DD}$ of Resonance Amplitude Is Detected)
   2-5. Example 5 (Modified Example of Example 4: Example in which N Channel MOS Transistor Is Used for Pull-Up Element)
   2-6. Example 6 (Differential Configuration: Example in which Single Phase Configuration in Example 1 is Changed to Differential Configuration)
   2-7. Example 7 (Modified Example of Example 6: Example in which ($\frac{1}{4}$)$V_{DD}$ of Resonance Amplitude Is Detected)
   2-8. Example 8 (Modified Example of Example 6: Example in which N Channel MOS Transistor Is used for Pull-Up Element)
   2-9. Example 9 (Modified Example of Synchronous Delay Circuit)
   2-10. Example 10 (Example of Alternative Circuit of Synchronous Delay Circuit)
   2-11. Example 11 (Modified Example of Example 3: Example in which Control Pulse for N Channel MOS Transistor for Pulse Control Is controlled)
   2-12. Example 12 (Example in which Small-Amplitude Power Supply Generation Circuit is Built in Apparatus)
   2-13. Example 13 (Modified Example of Example 6: Example in which Delay Caused by Synchronous Delay Circuit is Minimized)
   2-14. Example 14 (Modified Example of Example 13: Example in which Synchronous Delay Circuit Is Driven Directly by Clock Output)
   2-15. Example 15 (Modified Example of Example 6 and Example in which Pulse Width of Control Pulse is Generated by Circuit Delay
   2-16. Example 16 (Example in which Opposite Ends of Inductor Element are Selectively Short-Circuited)
3. Second Embodiment (Example of LC Resonance Circuit Using No Pulse Control)
   3-1. Example 17 (Example Using Negative Delay Pulse Generation Circuit)
4. Modified Examples
5. System Equipped with Clock Distribution Circuit
6. Configuration that can Be Taken by Present Disclosure <Description of Semiconductor Circuit Apparatus and System Equipped with Semiconductor Circuit Apparatus in General>

A semiconductor circuit apparatus and a system equipped with the semiconductor circuit apparatus in the present disclosure can be configured such that a level detection circuit detects an intermediate transition point of LC resonance. Additionally, the semiconductor circuit apparatus and the system equipped with the semiconductor circuit apparatus in the present disclosure can be configured such that the level detection circuit includes a comparator at a first input end connected to a signal line and at a second input end connected to a node between the inductor element and the capacitive element.

The semiconductor circuit apparatus of the present disclosure including the above-described preferred configuration and the system equipped with the semiconductor circuit apparatus can be configured such that the comparator detects an intermediate transition point of LS resonance. The intermediate transition point of LC resonance may correspond to a level of a half of a power supply voltage or a level of a quarter of the power supply voltage.

Additionally, the semiconductor circuit apparatus of the present disclosure including the above-described preferred configuration and the system equipped with the semiconductor circuit apparatus can be configured such that a synchronous delay circuit is provided in a feedback path from the level detection circuit to the control circuit. In this case, the semiconductor circuit apparatus of the present disclosure including the above-described preferred configuration and the system equipped with the semiconductor circuit apparatus can be configured such that the synchronous delay circuit detects a time when an intermediate transition point of a resonance amplitude is reached and reproduces a time identical to the time detected.

Additionally, semiconductor circuit apparatus of the present disclosure including the above-described preferred configuration and the system equipped with the semiconductor circuit apparatus can be configured such that a pull-up element of the drive circuit includes an N channel MOS transistor.

In addition, the semiconductor circuit apparatus of the present disclosure including the above-described preferred configuration and the system equipped with the semiconductor circuit apparatus can be configured such that two drive circuits and two signal lines are provided, and the two drive circuits output a differential signal. Additionally, the semiconductor circuit apparatus of the present disclosure including the above-described preferred configuration and the system equipped with the semiconductor circuit apparatus can be configured such that the level detection circuit detects the level of a quarter of the power supply voltage. In addition, the semiconductor circuit apparatus of the present disclosure including the above-described preferred configuration and the system equipped with the semiconductor circuit apparatus can be configured such that pull-up elements of the two drive circuits each include an N channel MOS transistor.

Additionally, the semiconductor circuit apparatus of the present disclosure including the above-described preferred configuration and the system equipped with the semiconductor circuit apparatus can be configured such that the synchronous delay circuit provided in the feedback path from the level detection circuit to the control circuit is enabled to adjust a delay time in a forward direction and in a backward direction.

Additionally, the semiconductor circuit apparatus of the present disclosure including the above-described preferred configuration and the system equipped with the semiconductor circuit apparatus can be configured such that, when the switch element of the series connection circuit includes an N channel MOS transistor, the semiconductor circuit apparatus includes a circuit adjusting a voltage value of a control pulse driving the switch element.

In addition, the semiconductor circuit apparatus of the present disclosure including the above-described preferred configuration and the system equipped with the semiconductor circuit apparatus can be configured such that, when the intermediate transition position of LC resonance corresponds to the level of a quarter of the power supply voltage, the semiconductor circuit apparatus internally includes a small-amplitude power supply generation circuit generating a power supply voltage.

Additionally, the semiconductor circuit apparatus of the present disclosure including the above-described preferred configuration and the system equipped with the semiconductor circuit apparatus can be configured such that two synchronous delay circuits are provided corresponding to the two drive circuits. The semiconductor circuit apparatus of the present disclosure including the above-described preferred configuration and the system equipped with the semiconductor circuit apparatus can be configured such that the two synchronous delay circuits detect a time when the intermediate transition position of the resonance amplitude is reached and reproduces a time identical to the time detected, on the basis of outputs from the two drive circuits and the control pulse driving the switch element.

The semiconductor circuit apparatus of the present disclosure including the above-described preferred configuration and the system equipped with the semiconductor circuit apparatus can be configured such that the control circuit generates the control pulse driving the switch element on the basis of the clock signal externally input and each of the outputs from the two drive circuits.

Additionally, the semiconductor circuit apparatus of the present disclosure including the above-described preferred configuration and the system equipped with the semiconductor circuit apparatus can be configured such that, when the control pulse driving the switch element is in an inactive state, opposite ends of the inductor element are short-circuited.

In addition, the semiconductor circuit apparatus of the present disclosure including the above-described preferred configuration and the system equipped with the semiconductor circuit apparatus can be configured such that the semiconductor circuit apparatus is a clock distribution circuit distributing a clock signal through the signal line.

First Embodiment

A first embodiment of the present disclosure is an example of an intermittent LC resonance circuit under pulse control. The semiconductor circuit apparatus of the first embodiment is a clock distribution circuit using, as a clock buffer circuit, an LC resonance circuit causing intermittent resonance under pulse control.

In the first embodiment, the clock distribution circuit using the LC resonance circuit as a clock buffer circuit detects the intermediate transition position (intermediate level) of LC resonance to detect the time when the intermediate level of the resonance amplitude is reached, and reproduces the same time as the time detected. This allows a change in intermediate potential involving a significant change in resonance amplitude to be detected instead of a very small change in peak current. Thus, timing for the control pulse can be synchronized with the resonance period of the LC resonance circuit without a need for detection of a peak current with very small resonance.

Here, the "intermediate level of the resonance amplitude" is preferably a midpoint level of the resonance amplitude. However, the meaning of the "intermediate level of the resonance amplitude" includes a case where the "intermediate level of the resonance amplitude" is substantially the midpoint level of the resonance amplitude (a level near the midpoint level) as well as a case where the "intermediate level of the resonance amplitude" is strictly the midpoint level of the resonance amplitude, and the presence of various variations resulting from design or manufacture is accepted.

Examples of a method for detecting the intermediate level of the resonance amplitude may include a method using a logic circuit such as an inverter circuit, a method using a comparator, and the like. Additionally, examples of a method for generating a duration for switch control may include a method using a synchronous delay circuit (Synchronous Mirror Delay: SMD), a method of detecting the intermediate level of the resonance amplitude and then using a circuit delay caused by a delay circuit to create a delay width similar to the delay width obtained in a case of using a synchronous delay circuit.

A specific example of a clock distribution circuit according to the first embodiment will be described, the clock distribution circuit detecting, instead of a very small change in peak current, a change in intermediate potential involving a significant change in resonance amplitude and reproducing an LC resonance time.

Example 1

Example 1 is an example in which, when the power supply voltage for the clock distribution circuit is $V_{DD}$, $(1/2)V_{DD}$ is detected as the intermediate level of the resonance amplitude. FIG. 1 illustrates the clock distribution circuit according to Example 1. As illustrated in FIG. 1, the clock distribution circuit 10 according to Example 1 includes a control circuit 11, a drive circuit 12, a series connection circuit 13, a level detection circuit 14, and a synchronous delay circuit (SMD) 15.

The control circuit 11 controls a clock signal $C_{in}$ externally input via a circuit input terminal 21. More specifically, the control circuit 11 generates two clock pulses $SW_p$ and $SW_n$ for driving the drive circuit 12 on the basis of the clock signal $C_{in}$ externally input. A specific circuit configuration of the control circuit 11 will be described below.

The drive circuit 12 includes a P channel MOS transistor $Qp_{11}$ and an N channel MOS transistor $Qn_{11}$ connected in series between a node with the power supply voltage $V_{DD}$ and a predetermined fixed potential, for example, a node with a ground potential GND. The P channel MOS transistor $Qp_{11}$ on the power supply voltage $V_{DD}$ side is an element pulling up the potential of the signal line 16, and performs a switching operation (on/off operation) according to a clock pulse $SW_p$ provided by the control circuit 11. The N channel MOS transistor $Qn_{11}$ on the ground potential GND side is an element pulling down the potential of the signal line 16, and performs a switching operation according to a clock pulse $SW_n$ provided by the control circuit 11.

In the drive circuit 12, an N channel MOS transistor can be used instead of the P channel MOS transistor $Qp_{11}$. A common connection node $N_{11}$ for the P channel MOS transistor $Qp_{11}$ and the N channel MOS transistor $Qn_{11}$ corresponds to an output end of the drive circuit 12. The signal line 16 is connected between the output end node $N_{11}$ of the drive circuit 12 and a circuit output terminal 22.

The series connection circuit 13 includes an inductor element 131, a MOS transistor 132 including an N channel and used as a switch element, and a capacitive element 133 connected in series between the signal line 16 and a node with a fixed potential (for example, the ground potential GND).

In the series connection circuit 13, the inductor element 131 forms an LC resonance circuit along with a wiring capacity of the signal line 16. The resonance frequency of the LC resonance circuit is determined by the inductance of the inductor element 131 and the capacitance of wiring capacity of the signal line 16. The N channel MOS transistor 132 performs an on/off operation under pulse control of a control pulse SWR provided by the control circuit 11 to control intermittent resonance for the LC resonance circuit. In other words, the N channel MOS transistor 132 is a switch element for pulse control. Note that the inductor element 131 may include metal wiring in a chip or have a 3D-inductor configuration including a plurality of layers of metal. Inductor elements described below may all have a 3D-inductor configuration including a plurality of layers of metal.

The capacitive element 133 provides an intermediate level of the resonance amplitude of the LC resonance circuit, for example, $(½)V_{DD}$. Here, for the intermediate level of the resonance amplitude, the meaning of the intermediate level of the resonance amplitude includes a case where the "intermediate level of the resonance amplitude" is substantially $½V_{DD}$ as well as a case where the "intermediate level of the resonance amplitude" is strictly $½V_{DD}$, and the presence of various variations resulting from design or manufacture is accepted.

The level detection circuit 14 includes, for example, a comparator 141. One input end of the comparator 141 is connected to the signal line 16 and is provided with an output $DRV_{OUT}$ from the drive circuit 12. The other input end of the comparator 141 is connected to a node $N_{12}$ between the inductor element 131 and the capacitive element 133 and is provided with $(½)V_{DD}$. Consequently, the level detection circuit 14, that is, the comparator 141, detects an intermediate transition position of LC resonance (intermediate level $(½)V_{DD}$).

An output $COMP_{OUT}$ from the comparator 141 is fed, as a measurement result for the time corresponding to half the period of LC resonance, to the synchronous delay circuit 15 provided in a feedback path from the comparator 141 to the control circuit 11. The synchronous delay circuit 15 senses the time when the intermediate level of the resonance amplitude is reached, on the basis of the output $COMP_{OUT}$ of the intermediate transition position of LC resonance detected by the comparator 141 (intermediate level), and reproduces the same time as the detected time. The principle and circuit examples of the synchronous delay circuit 15 will be described below.

An output $SMD_{OUT}$ from the synchronous delay circuit 15 is fed to the control circuit 11. Consequently, an output from the level detection circuit 14 (comparator 141) is fed back to the control circuit 11 through the synchronous delay circuit 15.

Figure 2:
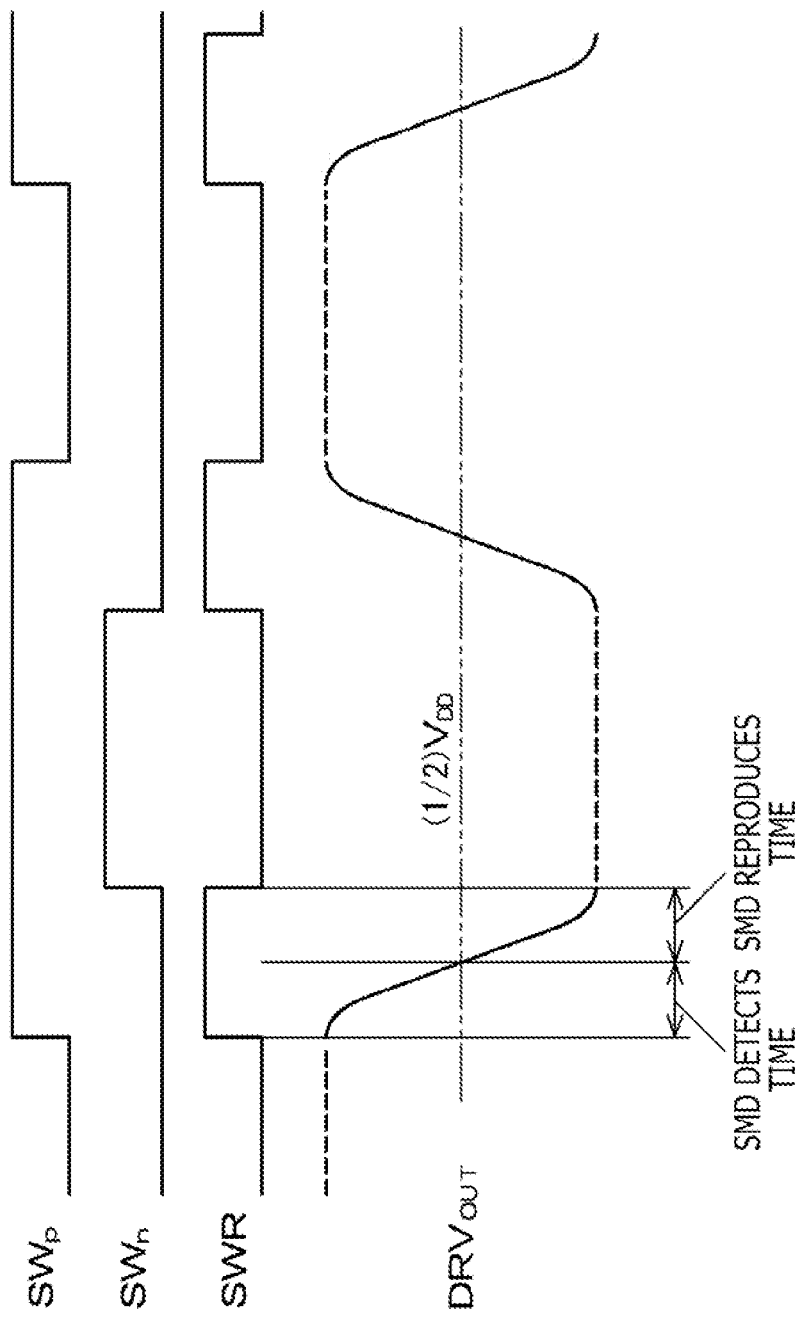
FIG. 2 is a timing waveform diagram illustrating a timing relationship among waveforms of sections of the clock distribution circuit according to Example 1.

FIG. 2 illustrates a timing relationship among the clock pulses $SW_p$ and $SW_n$ driving the drive circuit 12 in the clock distribution circuit 10 according to Example 1, the control pulse SWR controlling the MOS transistor 132, and the resonance waveform of the LC resonance circuit.

As is apparent from a timing waveform chart in FIG. 2, an active period of the control pulse SWR corresponds to a period from a transition timing when the clock pulse $SW_p$ transitions from a low level to a high level until a transition timing when the clock pulse $SW_n$ transitions from the low level to the high level. During an inactive period of the control pulse SWR, a MOS transistor Tr comes into an off state to stop resonance of the LC resonance circuit.

The clock distribution circuit 10 according to Example 1 configured as described above distributes a clock signal to a load 20 through the circuit output terminal 22 by using the LC resonance circuit as a clock buffer circuit. In the clock distribution circuit 10, the level detection circuit 14 detects the intermediate level of LC resonance, specifically, $(½)V_{DD}$. The synchronous delay circuit 15 detects the time when the intermediate level of the resonance amplitude is reached, and reproduces the same time as the detected time.

As described above, the clock distribution circuit 10 according to Example 1 detects the intermediate transition position of LC resonance (intermediate level), and on the basis of the detection output (detection timing), detects the time when the intermediate level of the resonance amplitude is reached, and reproduces the same time as the detected time. Consequently, a change in intermediate potential involving a significant change in the resonance amplitude of LC resonance is detected to allow the LC resonance time to be reproduced. Thus, the timing for the control pulse SWR can be synchronized with the resonance period of the LC resonance circuit without a need for detection of a peak current with very small resonance.

Note that, in the present example, the comparator 141 is used as the level detection circuit 14 but that no such limitation is intended and that, for example, a logic circuit such as an inverter circuit may be used to detect the intermediate transition position of LC resonance (intermediate level).

(Control Circuit)

Here, a specific circuit configuration of the control circuit 11 will be described by taking two circuit examples. The clock signal $C_{in}$ is externally input to the control circuit 11, and the output $SMD_{OUT}$ from the synchronous delay circuit 15 is also input to the control circuit 11

First Circuit Example

Figure 3A:
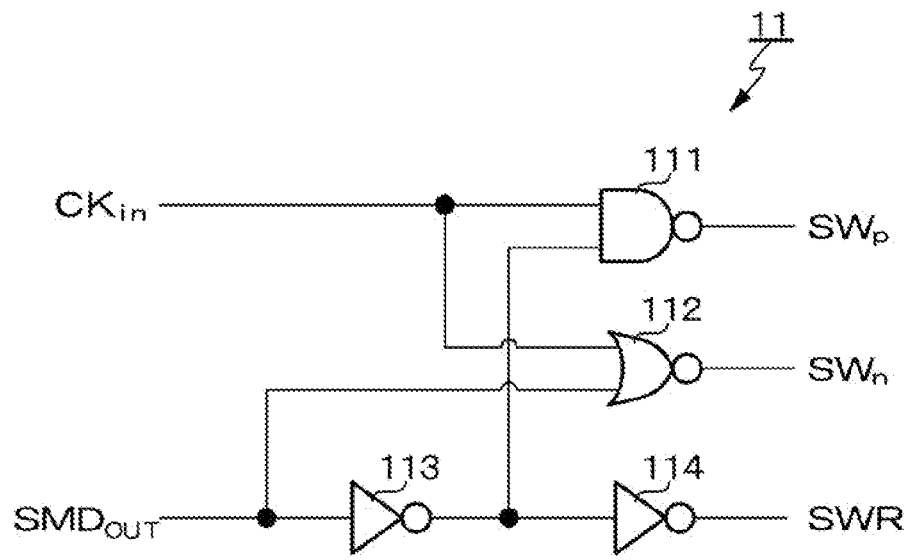
FIG. 3A is a circuit diagram illustrating a first circuit example of a control circuit.

FIG. 3A illustrates a first circuit example of the control circuit 11. The control circuit 11 according to the first circuit example includes a two-input NAND circuit 111, a two-input NOR circuit 112, and two inverter circuits 113 and 114.

The clock signal $C_{in}$ is used as one input of a NAND circuit 111 and as one input of a NOR circuit 112. The output $SMD_{OUT}$ from the synchronous delay circuit 15 is used as the other input of the NOR circuit 112, and is inverted by an inverter circuit 113 into the other input to the NAND circuit 111. Consequently, an output from the NAND circuit 111 is derived as the clock pulse $SW_p$, and an output from the NOR circuit 112 is derived as the clock pulse $SW_n$. Additionally, the output $SMD_{OUT}$ from the synchronous delay circuit 15 is derived via the two inverter circuits 113 and 114 as the control pulse SWR controlling the MOS transistor 132.

Second Circuit Example

Figure 3B:
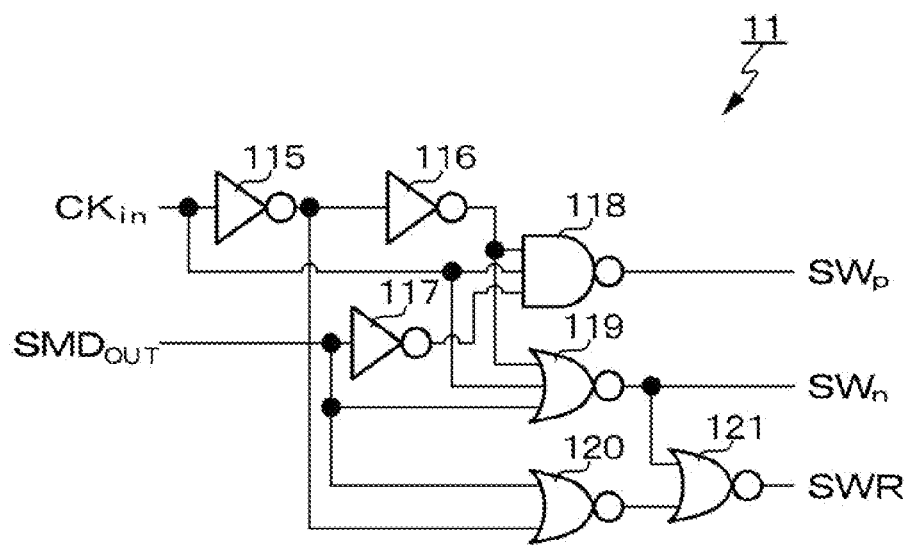
FIG. 3B is a circuit diagram illustrating a second circuit example of the control circuit.

FIG. 3B illustrates a second circuit example of the control circuit 11. The control circuit 11 according to the second circuit example includes three inverters 115, 116, and 117, a three-input NAND circuit 118, a three-input NOR circuit 119, and two two-input NOR circuits 120 and 121.

The clock signal $C_{in}$ is used as a first input to the NAND circuit 111 and as a first input to the NOR circuit 119, and is inverted into one input to the NOR circuit 120 by the inverter circuit 115, and is further inverted into a second input to the NAND circuit 111 and a second input to the NOR circuit 119 by the inverter circuit 116. The output $SMD_{OUT}$ from the synchronous delay circuit 15 is used directly as a third input to the NOR circuit 119 and as the other input to the NOR circuit 120, and is inverted into a third input to the NAND circuit 111 by the inverter circuit 117.

Then, an output from the NAND circuit 111 is derived as the clock pulse $SW_p$, and an output from the NOR circuit 119 is derived as the clock pulse $SW_n$. Additionally, the output from the NOR circuit 119 is used as one input to the NOR circuit 121, and the output from the NOR circuit 120 is used as the other input to the NOR circuit 121. Then, an output from the NOR circuit 121 is derived as the control pulse SWR controlling the MOS transistor 132.

(Synchronous Delay Circuit)

Now, the principle and circuit examples of the synchronous delay circuit 15 in Example 1 will be described.

Figure 4A:
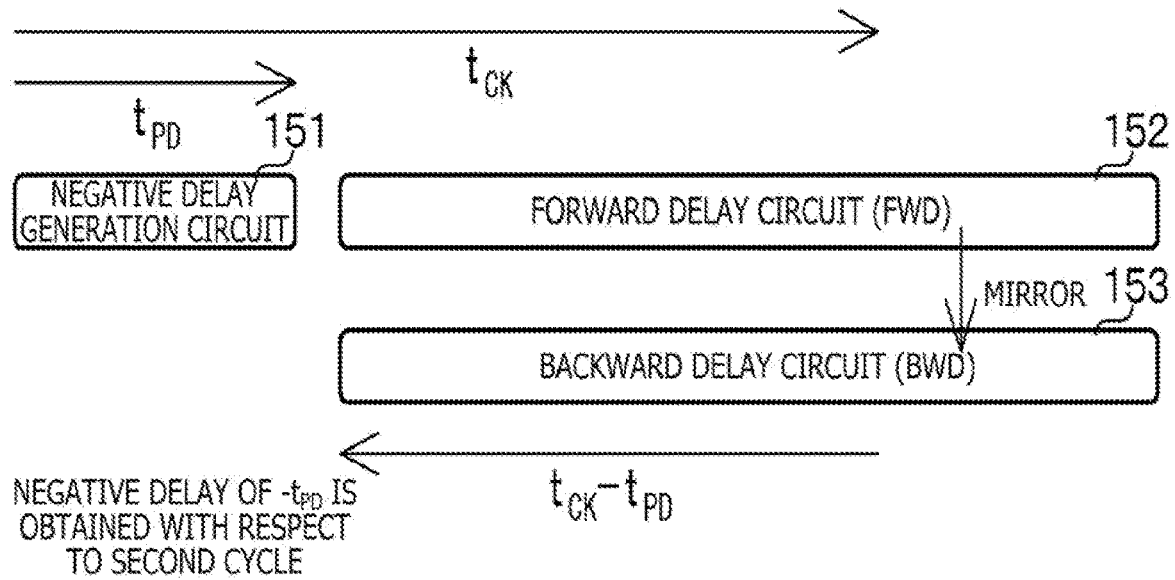
FIG. 4A is a simplified block diagram for describing a basic principle of a synchronous delay circuit.

First, the basic principle of the synchronous delay circuit will be described. As illustrated in FIG. 4A, the synchronous delay circuit includes, in a basic configuration, a negative delay generation circuit 151, a forward delay (FWD) circuit 152, and a backward delay (BWD) circuit 153, and measures a delay time during the first cycle and reproduces the delay time during the second cycle.

Figure 4B:
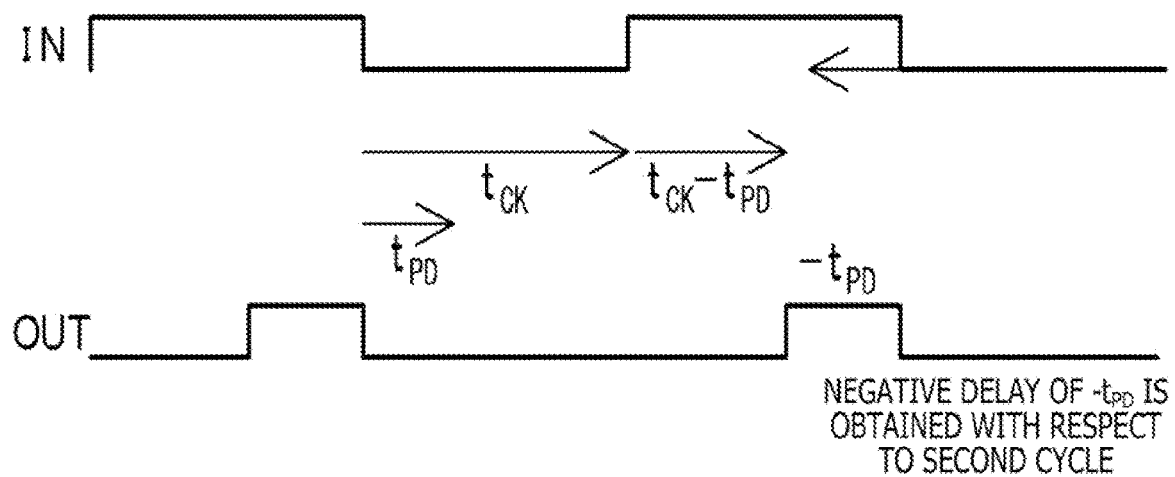
FIG. 4B is a timing chart illustrating a timing relationship for the basic principle.

A delay time $t_{PD}$ to be generated by a negative delay is set in the negative delay generation circuit 151. A clock pulse with a pulse width $(t_{CK}-t_{PD})$ during the first cycle passes through the negative delay generation circuit 151 and the forward delay circuit 152. When the clock pulse during the second cycle catches up with the clock pulse during the first cycle, the clock pulse during the first cycle is mirrored by the backward delay circuit 153, and when passing through the backward delay circuit 153, the clock pulse during the second cycle is subjected to a negative delay equivalent to the delay time $t_P p$ involved in the first cycle $(t_{CK}-t_{PD})$. As a result, the negative delay of $-t_{PD}$ is provided to the second cycle. Consequently, the synchronous delay circuit 15 can perform phase control during two cycles, corresponding to a very short lock up time. FIG. 4B illustrates a timing chart for the basic principle.

Figure 5A:
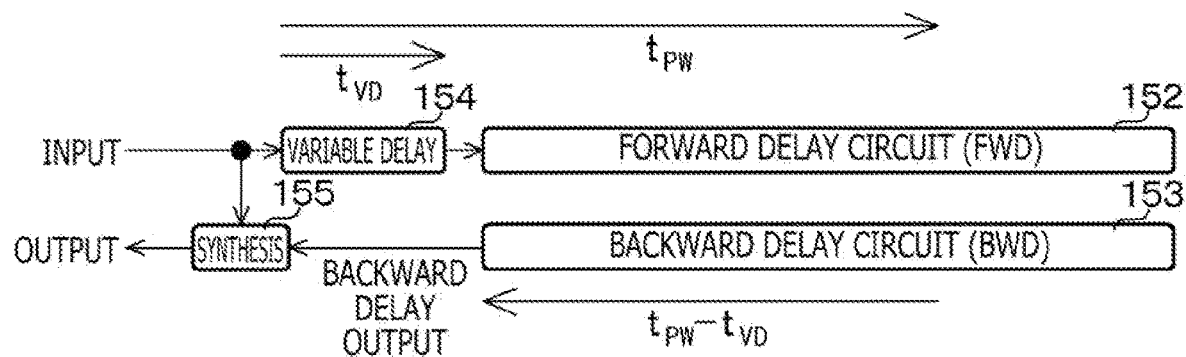
FIG. 5A is a simplified block diagram for describing a synchronous delay circuit according to Example 1.
Figure 5B:
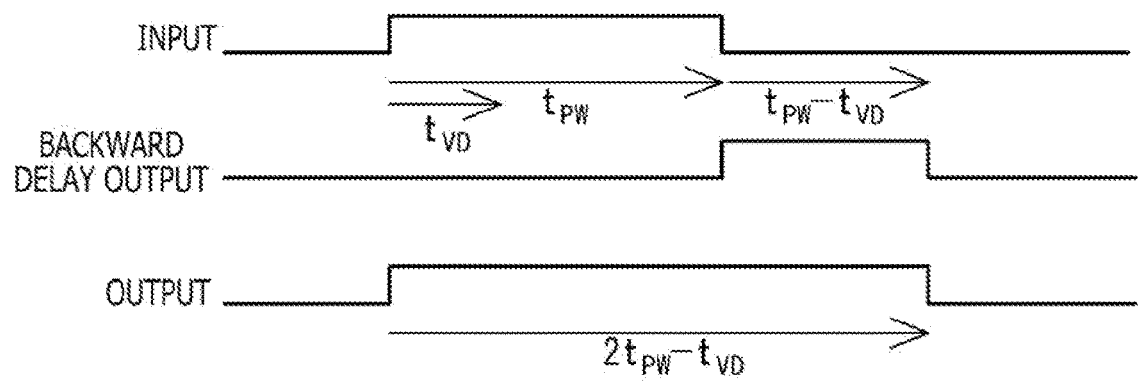
FIG. 5B is a timing chart for describing operation of the synchronous delay circuit according to Example 1.

The synchronous delay circuit 15 according to Example 1 is application of the basic principle of the above-described synchronous delay circuit. FIG. 5A illustrates a simplified block diagram for describing the synchronous delay circuit 15 according to Example 1, and FIG. 5B illustrates a timing chart for describing operation of the synchronous delay circuit 15 according to Example 1.

The synchronous delay circuit 15 according to Example 1 includes a variable delay circuit 154 instead of the negative delay generation circuit 151 in the basic configuration in FIG. 4A based on the basic principle and includes a synthesis circuit 155 synthesizing an input pulse with a backward delay output pulse from the backward delay circuit 153. The variable delay circuit 154 has a function to generate a negative delay like the negative delay generation circuit 151, and is configured to provide a variable delay time $t_{VD}$.

The synchronous delay circuit 15 according to Example 1 configured as described above measures the pulse width $(t_{PW}-t_{VD})$ of the input pulse, and reproduces the pulse width $(t_{PW}-t_{VD})$ as a backward delay output pulse from the backward delay circuit 153. Specifically, the delay time $t_{VD}$ to be generated for a negative delay is set for the first cycle to allow a negative delay of $-t_{VD}$ to be obtained in the second cycle.

Then, in the synthesis circuit 155 totals the input pulse with the pulse width $t_{PW}$ and the backward delay output pulse with the pulse width $(t_{PW}-t_{VD})$ to allow an output pulse with a pulse width $(2t_{PW}-t_{VD})$ to be generated. Additionally, for the variable delay circuit 154, by externally changing the delay time $t_{VD}$ to adjust the pulse width $(2t_{PW}-t_{VD})$ of the output pulse, a Q-value representing the sharpness of peak of a resonance frequency property of LC resonance can be adjusted after manufacture in a case where the Q-value indicates degradation or the like.

Figure 6:
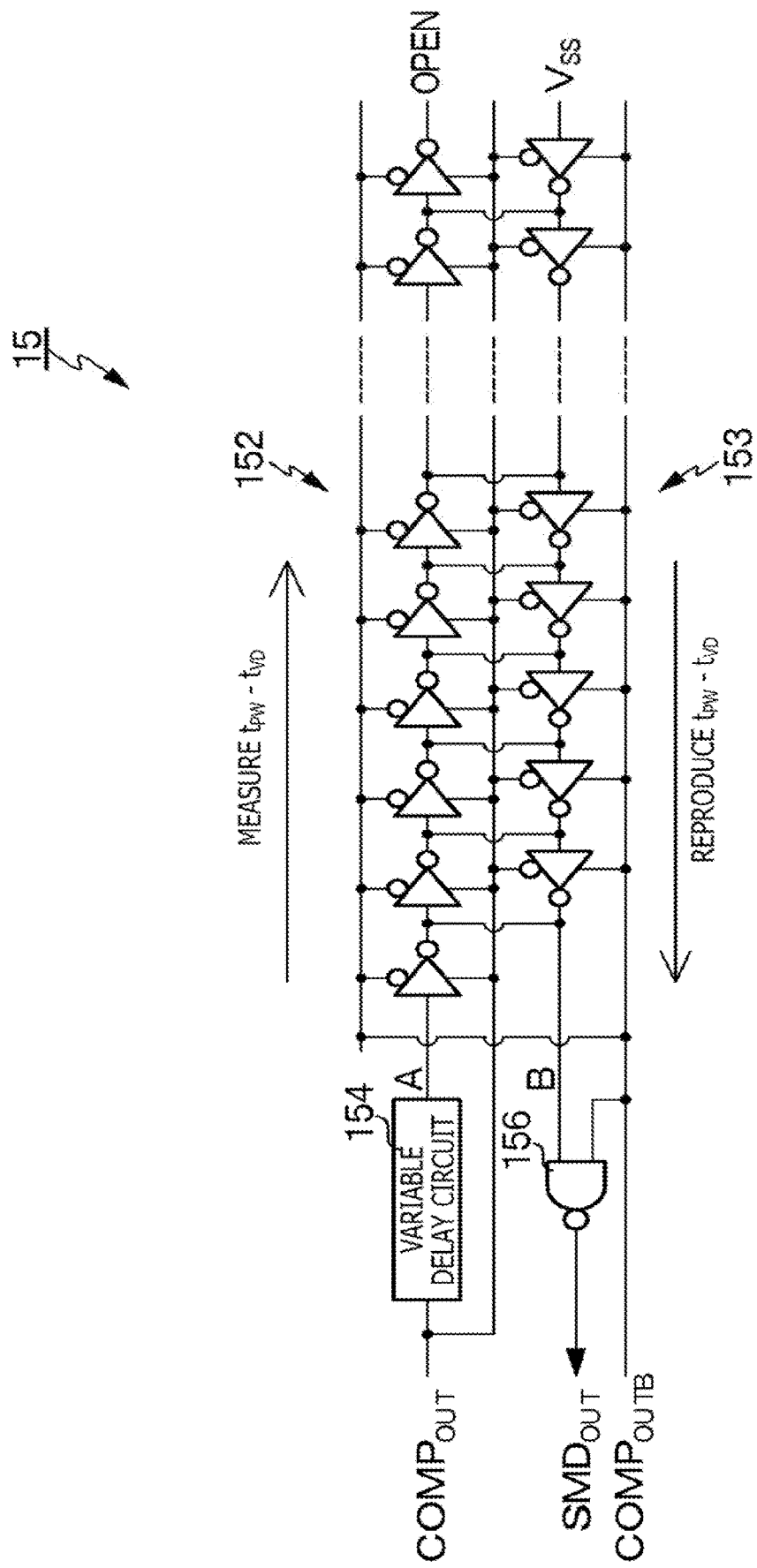
FIG. 6 is a circuit diagram illustrating a specific circuit example of the synchronous delay circuit according to Example 1.
Figure 7:
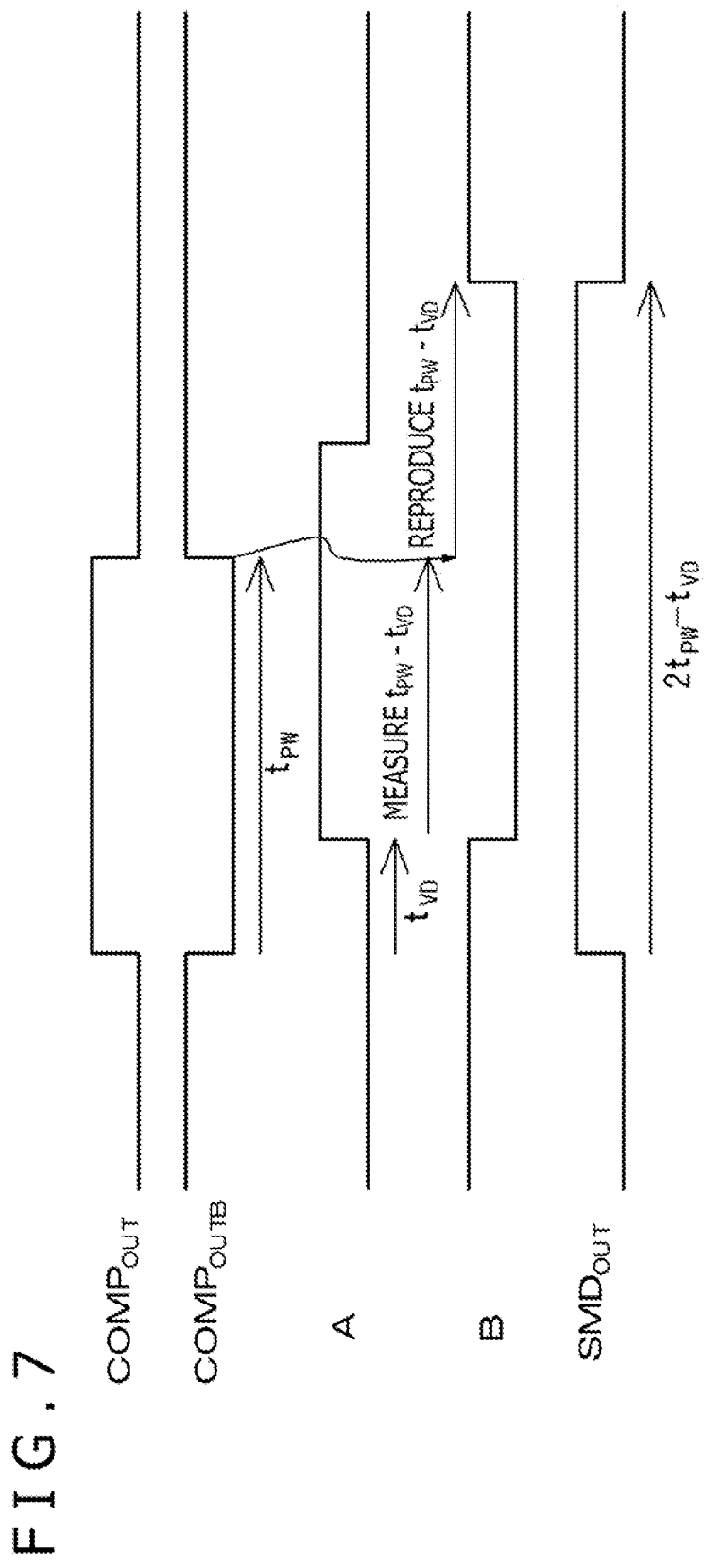
FIG. 7 is a timing chart illustrating waveforms of sections in the specific circuit example of the synchronous delay circuit according to Example 1.

FIG. 6 illustrates a specific circuit example of the synchronous delay circuit 15 according to Example 1, and FIG. 7 illustrates waveforms for sections in the specific circuit example of the synchronous delay circuit 15.

As illustrated in FIG. 7, in the synchronous delay circuit 15 according to the present circuit example, the forward delay circuit 152 includes a group of multiple delay unit circuits connected together in series and using, as clock inputs, an output $COMP_{OUT}$ from the comparator 141 (see FIG. 1) and an inverted output $COMP_{OUTX}$ of the output $COMP_{OUT}$. An output A from the variable delay circuit 154 is input to the delay unit circuit in the first stage of the delay unit circuit group. Additionally, an output end of the delay unit circuit in the final stage is open.

The backward delay circuit 153 includes a group of multiple delay unit circuits connected together in series and using, as clock inputs, the output $COMP_{OUT}$ from the comparator 141 and the inverted output $COMP_{OUTX}$ of the output $COMP_{OUT}$, and a two-input NAND circuit 156. A power supply voltage $V_{SS}$ on a low potential side is applied to an input end of the delay unit circuit in the first stage of the delay unit circuit group. Additionally, an output B from the delay unit circuit in the final stage is used as one input to the NAND circuit 156. The NAND circuit 156 has the inverted output $COMP_{OUTX}$ from the comparator 141 as the other input. An output from the comparator 141 is used as the output $SMD_{OUT}$ from the synchronous delay circuit 15.

A timing chart in FIG. 7 illustrates a timing relationship among the output $COMP_{OUT}$ from the comparator 141, the inverted output $COMP_{OUTX}$ of the output $COMP_{OUT}$, the output A from the variable delay circuit 154, the output B from the final delay unit circuit of the backward delay circuit 153, and the output $SMD_{OUT}$ from the synchronous delay circuit 15.

Example 2

Figure 8:
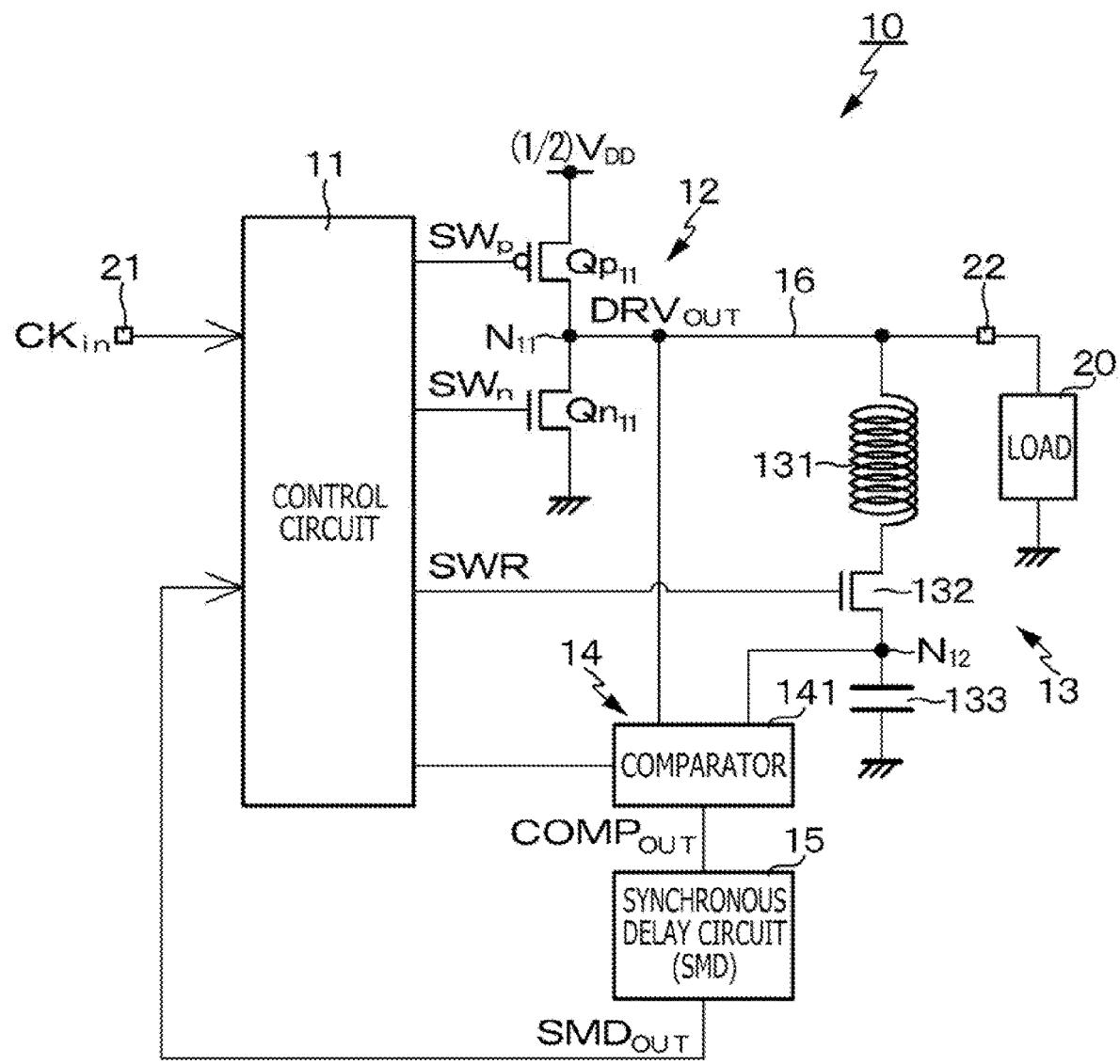
FIG. 8 is a circuit diagram illustrating a circuit configuration of a clock distribution circuit according to Example 2.
Figure 9:
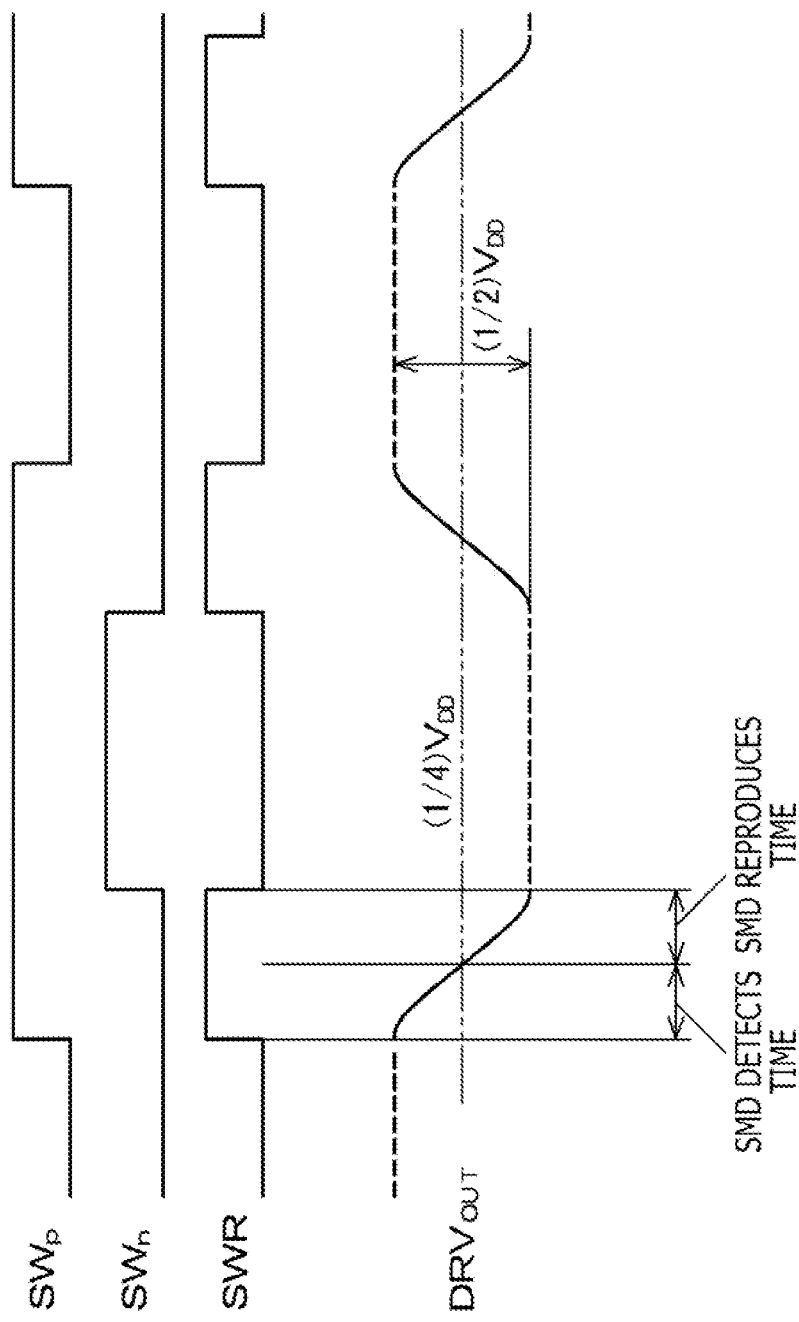
FIG. 9 is a timing chart illustrating a timing relationship among signals from sections of the clock distribution circuit according to Example 2.

Example 2 is an example in which $(\frac{1}{4})V_{DD}$ is detected as the intermediate level of the resonance amplitude. FIG. 8 illustrates a circuit configuration of a clock distribution circuit according to Example 2. Additionally, FIG. 9 illustrates a timing relationship among signals from sections of the clock distribution circuit 10 according to Example 2, specifically, the clock pulses $SW_p$ and $SW_n$ driving the drive circuit 12, the control pulse SWR controlling the MOS transistor 132, and the resonance waveform of the LC resonance circuit.

The clock distribution circuit 10 according to Example 2 is the same as that in Example 1 in that the clock distribution circuit 10 includes the control circuit 11, the drive circuit 12, the series connection circuit 13, the level detection circuit 14, and the synchronous delay circuit (SMD) 15.

Example 2 differs from Example 1 in that the power supply voltage for the clock distribution circuit 10 is changed from $V_{DD}$ to $(\frac{1}{2})V_{DD}$. Consequently, the midpoint level of the resonance amplitude of the LC resonance circuit, provided by the capacitive element 133, is $(\frac{1}{4})V_{DD}$. Here, for the midpoint level of the resonance amplitude, the meaning of "$(\frac{1}{4})V_{DD}$" includes a case where the "midpoint level of the resonance amplitude" is substantially $(\frac{1}{4})V_{DD}$ as well as a case where the "midpoint level of the resonance amplitude" is strictly $(\frac{1}{4})V_{DD}$, and the presence of various variations resulting from design or manufacture is accepted.

In the clock distribution circuit 10 according to Example 2 configured as described above, the level detection circuit 14, that is, the comparator 141, detects the intermediate level of LC resonance, specifically, $(¼)V_{DD}$. The synchronous delay circuit 15 detects the time when the intermediate level of the resonance amplitude is reached, and reproduces the same time as the detected time. Consequently, a change in intermediate potential involving a significant change in the resonance amplitude of LC resonance is detected to allow the LC resonance time to be reproduced. Thus, the timing for the control pulse SWR can be synchronized with the resonance amplitude of the LC resonance circuit without the need for detection of a peak current with very small resonance.

The intermittent LC resonance circuit, causes intermittent resonance under pulse control, performs control via the MOS transistor 132 connected in series with the inductor element 131 and the capacitive element 133, reducing the Q-value, representing the sharpness of peak of the resonance frequency property, to decrease resonance efficiency. Thus, increasing power efficiency is difficult.

For this problem, in the clock distribution circuit 10 according to Example 2, the intermediate level of LC resonance is reduced to $(¼)V_{DD}$ to decrease the gate voltage of the N channel MOS transistor 132 by $(¼)V_{DD}$, enabling an increase in ON current. This allows resonance efficiency to be increased. In addition, the resonance amplitude can be reduced to $(½)V_{DD}$, and thus power consumption can be decreased more significantly than in a case where the power supply voltage is $V_{DD}$.

In the present example, as a technique for reducing the resonance amplitude, a technique is used in which the power supply voltage for the clock distribution circuit 10, specifically, the voltage of the drive circuit 12, is reduced to $(½)V_{DD}$. However, no such limitation is intended. For example, a technique can be adopted in which, with the power supply voltage at $V_{DD}$, the size of the P channel MOS transistor $Qp_{11}$ is reduced to decrease the resonance amplitude or the pulse width of the clock pulse $SW_p$ driving the P channel transistor $Qp_{11}$, is reduced to decrease the resonance amplitude. Additionally, the technique for reducing the resonance amplitude to increase resonance efficiency can also be applied to the clock distribution circuit not using the synchronous delay circuit 15.

With the clock distribution circuit 10 according to Example 2 described above, the resonance amplitude is reduced to $(½)V_{DD}$ to enable an increase in driving capability of the N channel MOS transistor 132 for stopping LC resonance, allowing a regenerative effect of LC resonance to be enhanced. This also applies to an example described below in which the resonance amplitude is reduced to $(½)V_{DD}$.

Example 3

Figure 10:
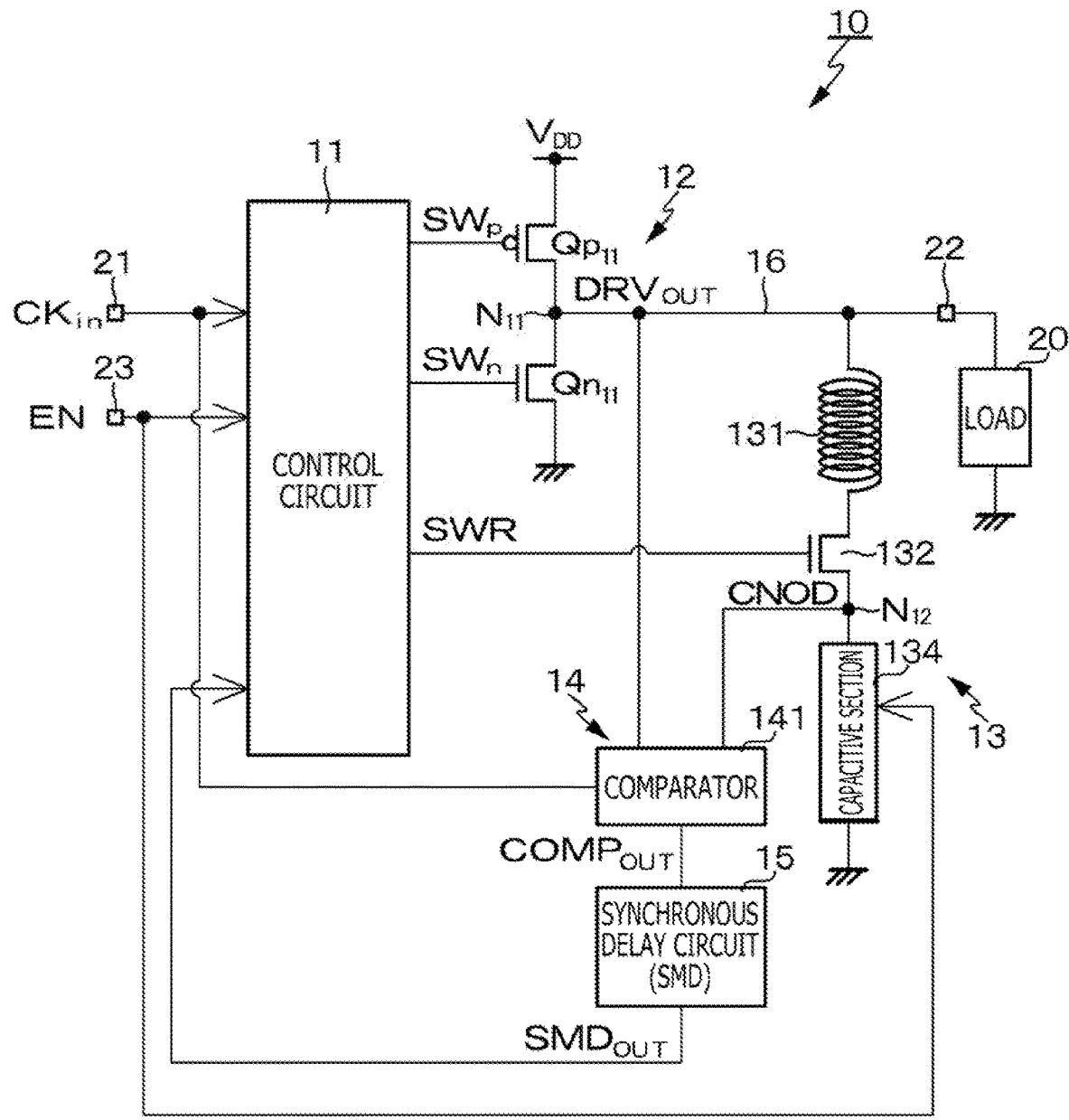
FIG. 10 is a circuit diagram illustrating a circuit configuration of a clock distribution circuit according to Example 3.

Example 3 is an example in which $(½)V_{DD}$ is generated according to the enable signal EN. FIG. 10 illustrates a circuit configuration of a clock distribution circuit according to Example 3.

The clock distribution circuit 10 according to Example 3 is configured such that the series connection circuit 13 is provided with a capacitive circuit section 134 is provided instead of the capacitive element 133 in Example 1. The enable signal EN is a trigger signal for generating $(½)V_{DD}$, and is externally fed via an input terminal 23 and fed to the control circuit 11 and the capacitive circuit section 134.

The capacitive circuit section 134 uses the enable signal EN as a trigger to generate the $(½)V_{DD}$ such that the potential CNOD of a node $N_{12}$ between the inductor element 131 and the capacitive circuit section 134 is $(½)V_{DD}$, corresponding to the intermediate level of LC resonance. The comparator 141, an example of the level detection circuit 14, is at one input end connected to the signal line 16 and at the other input end connected to the node $N_{12}$ between the inductor element 131 and the capacitive circuit section 134.

The comparator 141 detects a cross point between the potential of the signal line 16, that is, the output $DRV_{OUT}$ from the drive circuit 12, and $(½)V_{DD}$ and feeds the detection output $COMP_{OUT}$ to the synchronous delay circuit 15. The synchronous delay circuit 15 detects a transition time from the power supply voltage $V_{DD}$ or the ground potential GND to $(½)V_{DD}$, and further reproduces the same time as the transition time, generating the period of LC resonance.

Description will be given of circuit examples of the capacitive circuit section 134, the comparator 141, and the synchronous delay circuit 15 in the clock distribution circuit 10 according to Example 3.

(Capacitive Circuit Section)

Figure 11:
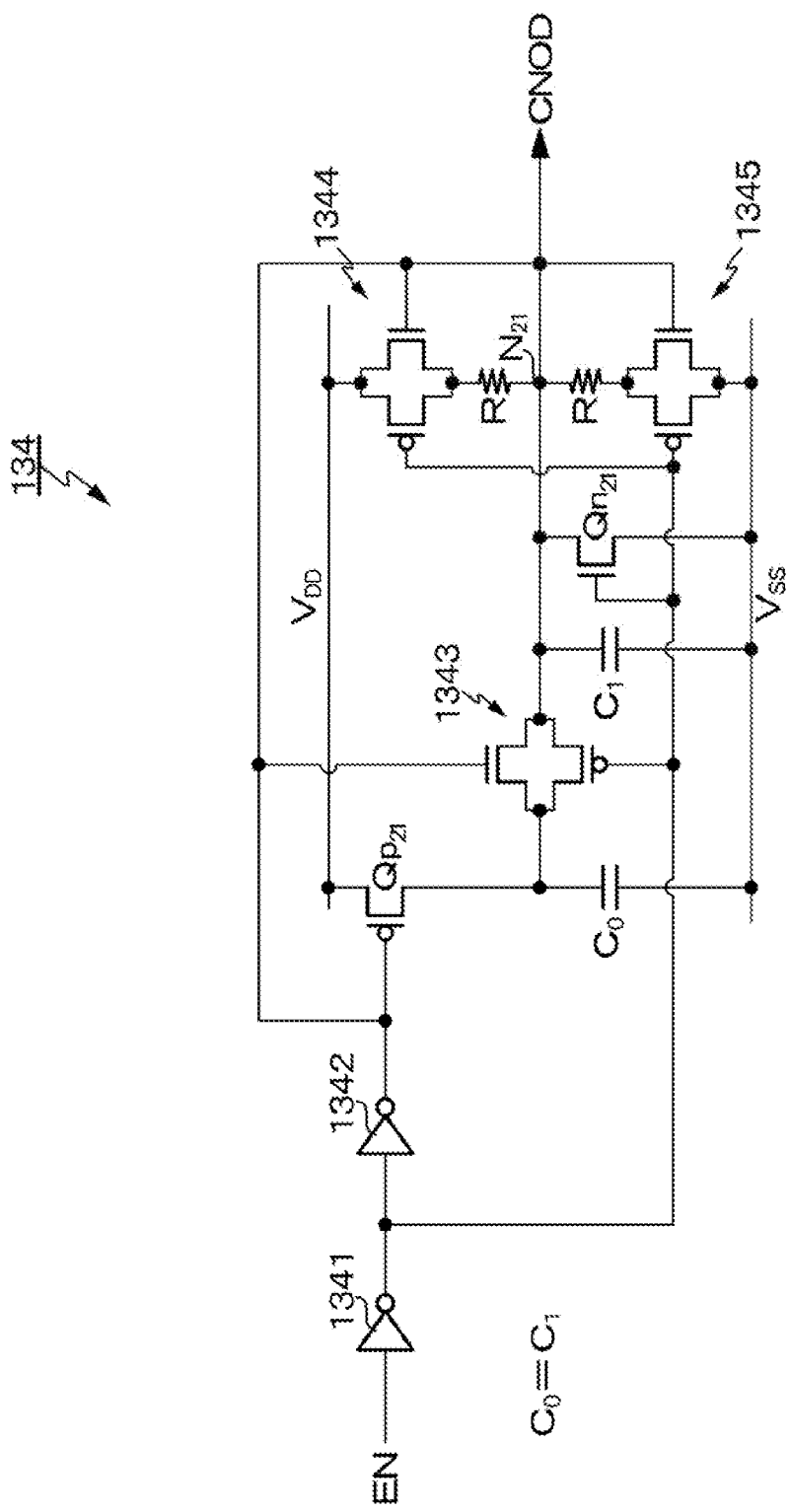
FIG. 11 is a circuit diagram illustrating a circuit example of a capacitive circuit section in the clock distribution circuit according to Example 3.

FIG. 11 illustrates a circuit example of the capacitive circuit section 134 in the clock distribution circuit 10 according to Example 3. The capacitive circuit section 134 according to the present circuit example has a switched capacitor configuration including two inverter circuits 1341 and 1342, a P channel MOS transistor $QP_{21}$, two capacitive elements $C_0$, $C_0$ with the same capacitance value, three transfer gates 1343, 1344, and 1345, an N channel MOS transistor $Qn_{21}$, and two resistive elements R, R with the same resistance value.

In response to the enable signal EN, the capacitive circuit section 134 configured as described above immediately generates $(½)V_{DD}$ using a switched capacitor, and the level is maintained by the resistive elements R, R. Then, the potential of a common connection node N21 connected to the resistive elements R, R is derived as the potential CNOD of the node $N_{12}$ in FIG. 10.

Figure 12A:
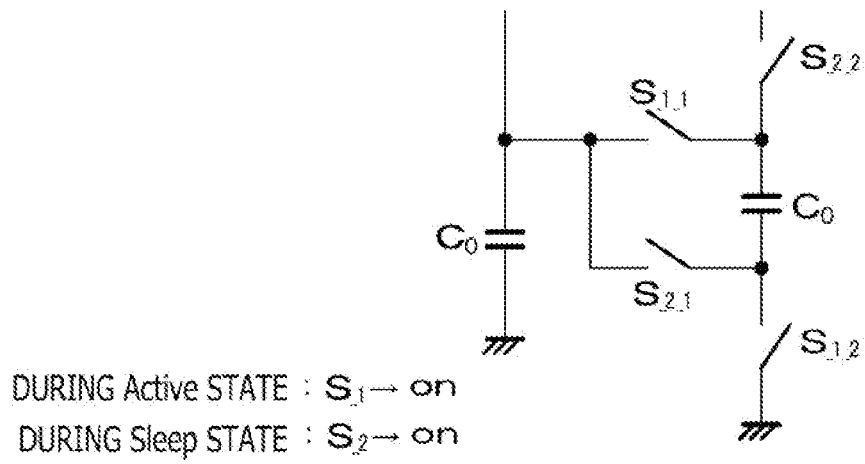
FIG. 12A is a circuit diagram illustrating an equivalent circuit of a switched capacitor circuit in the capacitive circuit section.
Figure 12B:
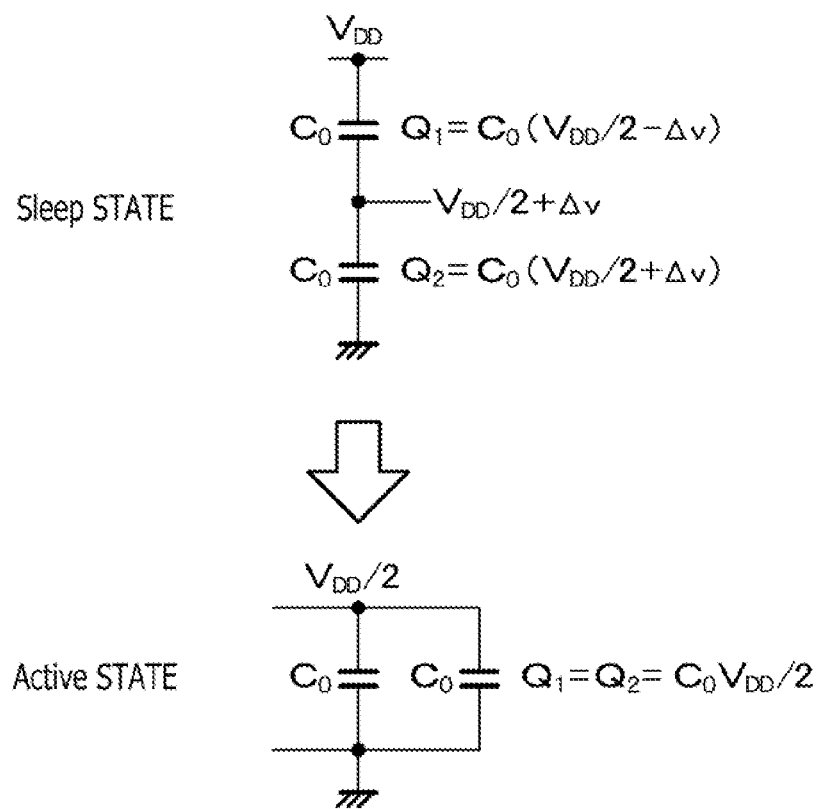
FIG. 12B is a circuit diagram illustrating an equivalent circuit of the switched capacitor circuit during a Sleep state and during an Active state.

FIG. 12 illustrates the operating principle of the switched capacitor circuit. FIG. 12A is a circuit diagram illustrating an equivalent circuit of the switched capacitor circuit of the capacitive circuit section 134, and FIG. 12B is a circuit diagram illustrating equivalent circuits of the switched capacitor circuit during a Sleep state and during an Active state. In the equivalent circuit in FIG. 12A, when the switched capacitor circuit is in the Active state, the switch $S_{-1}(S_{-1\_1}, S_{-1\_2})$ is in an on (closed) state to generate $(½)V_{DD}$. When the switched capacitor circuit is in the Sleep state, the switch $S_{-2}(S_{-2\_1}, S_{-2\_2})$ is in the on state.

(Comparator)

Figure 13:
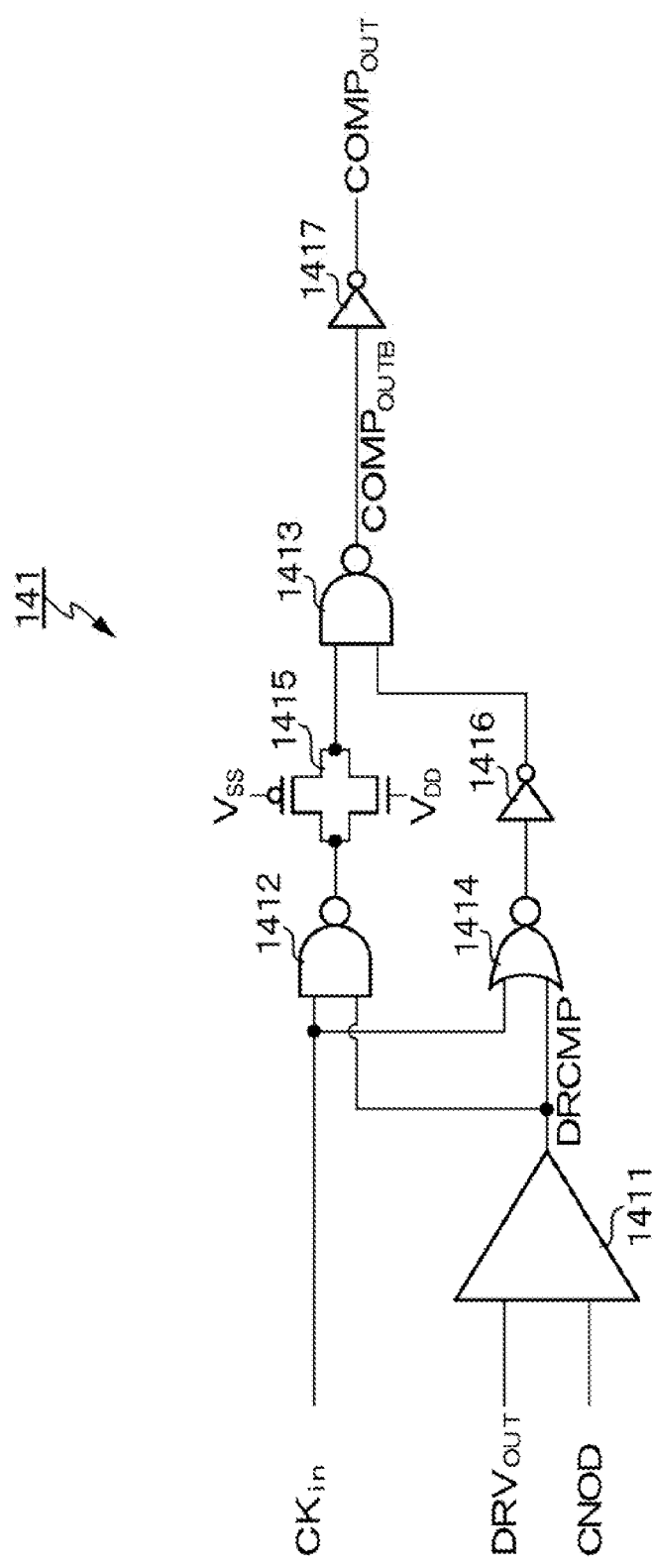
FIG. 13 is a circuit diagram illustrating a circuit example of a comparator in the clock distribution circuit according to Example 3.

FIG. 13 illustrates a circuit example of the comparator 141 in the clock distribution circuit 10 according to Example 3. The comparator 141 according to the present circuit example includes a differential comparator 1411, two two-input NAND circuits 1412 and 1413, a two-input NOR circuit 1414, a transfer gate 1415, and two inverter circuit 1416 and 1417.

The clock signal $C_{in}$ externally input is used as one input to the NAND circuit 1412 and as one input to the NOR circuit 1414. The differential comparator 1411 uses, as differential inputs, the output $DRV_{OUT}$ from the drive circuit 12, corresponding to the potential of the signal line 16, and the potential CNOD of the node $N_{12}$ between the inductor element 131 and the capacitive circuit section 134. An output DRCMP from the differential comparator 1411 is used as the other input to the NAND circuit 1412 and as the other input to the NOR circuit 1414.

An output from the NAND circuit 1412 is used as one input to the NAND circuit 1413 via the transfer gate 1415. The output from the NOR circuit 1414 is inverted into the other input to the NAND circuit 1413 by the inverter circuit 1416. Then, an output from the NAND circuit 1413 is used as a negative phase output $COMP_{OUTB}$ from the comparator 141 and is further inverted into a positive phase output $COMP_{OUT}$ from the comparator 141 by the inverter circuit 1417.

(Synchronous Delay Circuit)

Figure 14:
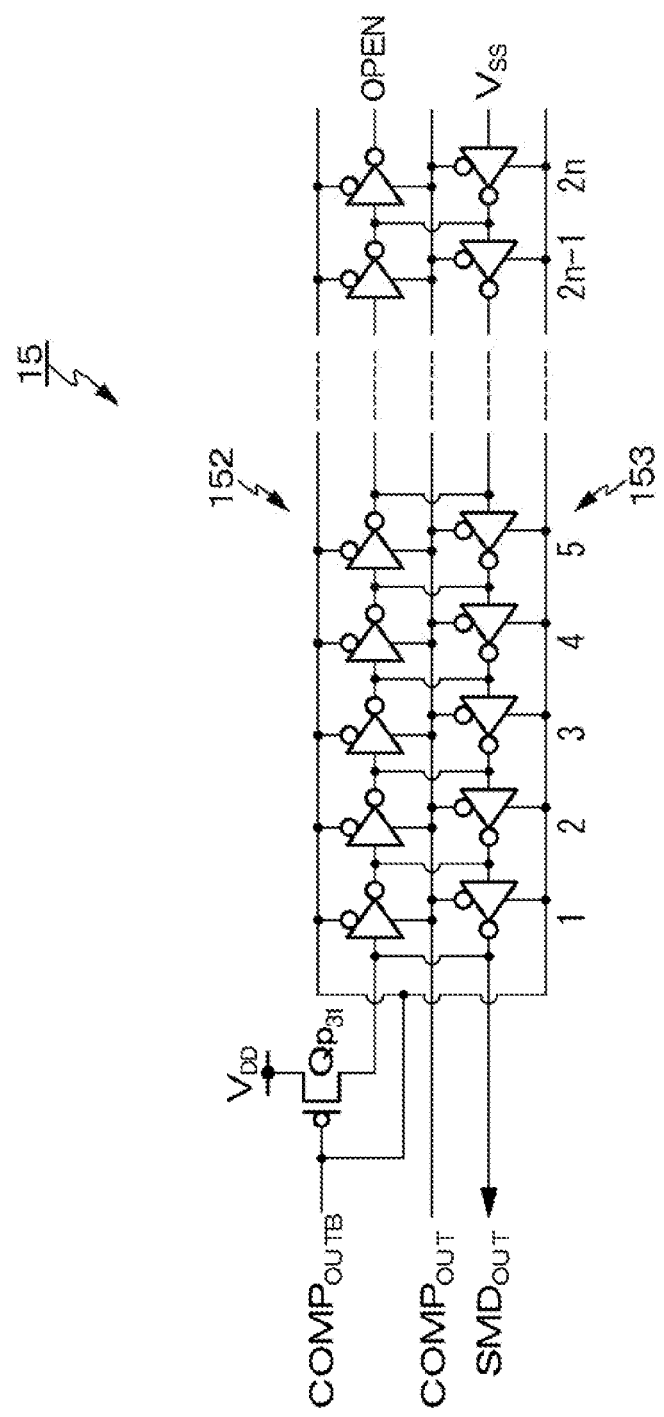
FIG. 14 is a circuit diagram illustrating a circuit example of a synchronous delay circuit in the clock distribution circuit according to Example 3.

FIG. 14 illustrates a circuit example of the synchronous delay circuit 15 in the clock distribution circuit 10 according to Example 3. The synchronous delay circuit 15 according to the present circuit example includes a P channel MOS transistor $Qp_{31}$ provided in an input stage, the forward delay circuit 152, and the backward delay circuit 153. The synchronous delay circuit 15 detects the transition time from the power supply voltage $V_{DD}$ or the ground potential GND to $(\frac{1}{2})V_{DD}$, and reproduces the same time as the transition time.

The forward delay circuit 152 includes a group of multiple delay unit circuits connected together in series and using, as clock inputs, the positive phase output $COMP_{OUT}$ and negative phase output $COMP_{OUTX}$ from the comparator 141. The power supply voltage $V_{DD}$ on a high potential side is input to the delay unit circuit in the first stage of the delay unit circuit group via a MOS transistor $Qp_{31}$. Additionally, an output end of the delay unit circuit in the final stage is open.

Note that the delay unit circuits (delay elements) in the synchronous delay circuit 15 have a clocked inverter configuration as illustrated in FIG. 14. As a clocked inverter X, a CMOS clocked inverter configuration is typically used. However, the delay unit circuits in the synchronous delay circuit 15 are not limited to the CMOS clocked inverter configuration. For example, the delay unit circuits may have a differential inverter configuration including a differential level shifter illustrated in FIG. 15A. A differential clocked inverter XX can be replaced with the typical clocked inverter X and can be applied to all the synchronous delay circuits (SMD) 15 described herein. In the differential clocked inverter XX illustrated in FIG. 15A, an input $IN_1$ and an input $IN_2$ are differential inputs, and an output $OUT_1$ and an output $OUT_2$ are differential outputs.

The backward delay circuit 153 includes a group of multiple delay unit circuits connected together in series and using, as clock inputs, the positive phase output $COMP_{OUT}$ and the negative phase output $COMP_{OUTX}$ of the comparator 141. The power supply voltage $V_{SS}$ on a low potential side is input to the delay unit circuit in the first stage of the delay unit circuit group. Additionally, an output from the delay unit circuit in the final stage is derived as the output $SMD_{OUT}$ from the synchronous delay circuit 15.

Figure 15A:
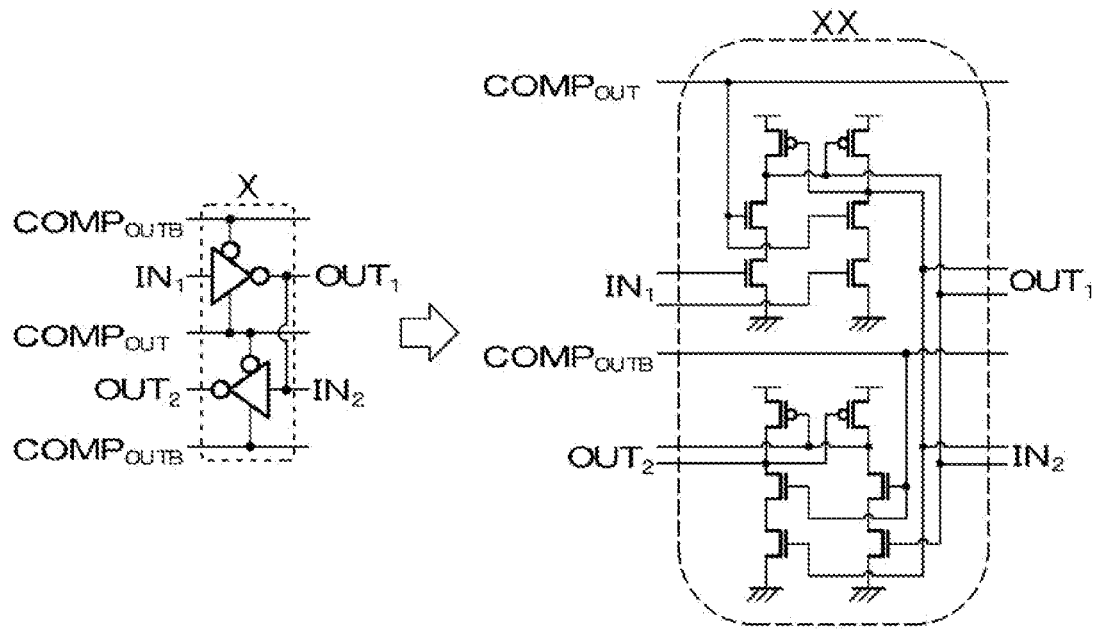
FIG. 15A is a circuit diagram illustrating a configuration of a differential clocked inverter.
Figure 15B:
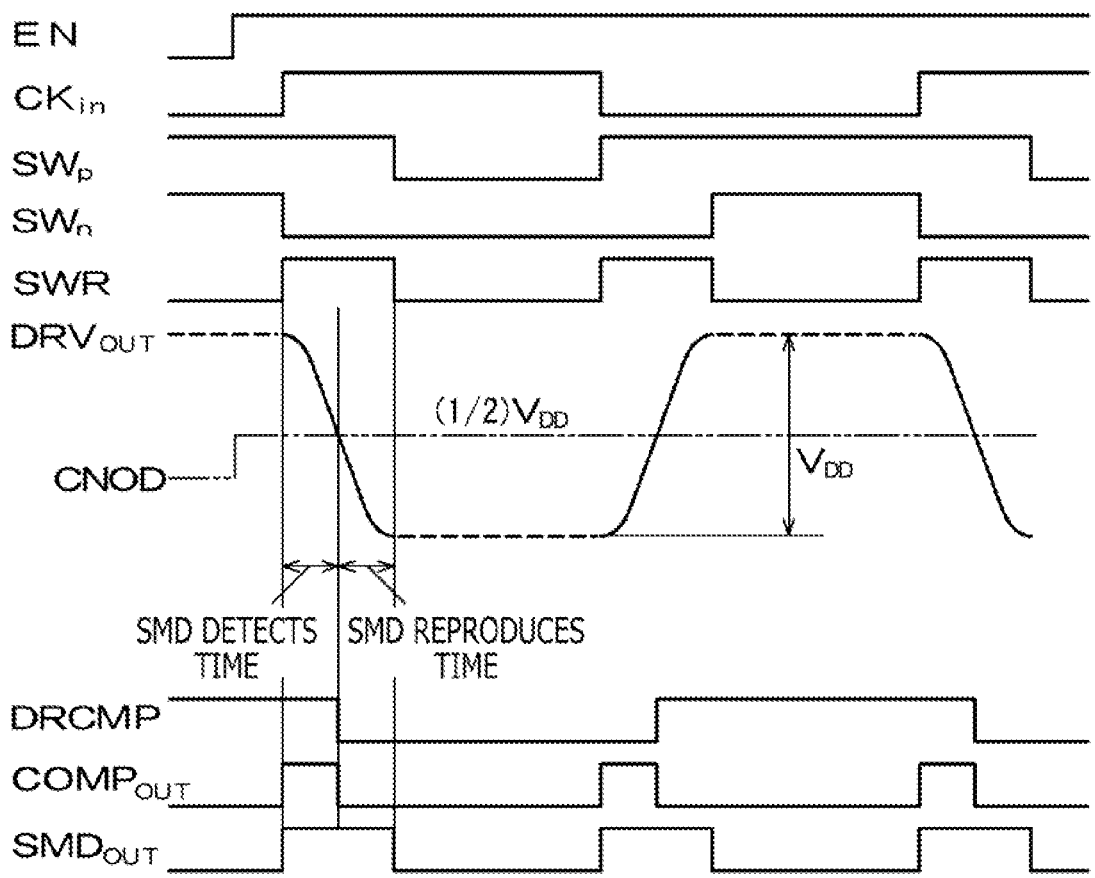
FIG. 15B is a timing chart illustrating a timing relationship among signals from sections of the clock distribution circuit according to Example 3.

FIG. 15B illustrates a timing relationship among signals from sections of the clock distribution circuit 10 according to Example 3 including the capacitive circuit section 134, the comparator 141, and the synchronous delay circuit 15 described above. A timing chart in FIG. 15B illustrates a timing relationship among the enable signal EN, the clock signal $C_{in}$, the clock pulses $SW_p$ and $SW_n$, the control pulse SWR, the output $DRV_{OUT}$ from the drive circuit 12, the potential CNOD of the node $N_2$, the output DRCMP from the differential comparator 1411, the positive phase output $COMP_{OUT}$ from the comparator 141, and the output $SMD_{OUT}$ from the synchronous delay circuit 15. The output $DRV_{OUT}$ from the drive circuit 12 has an amplitude $V_{DD}$.

Example 4

Figure 16:
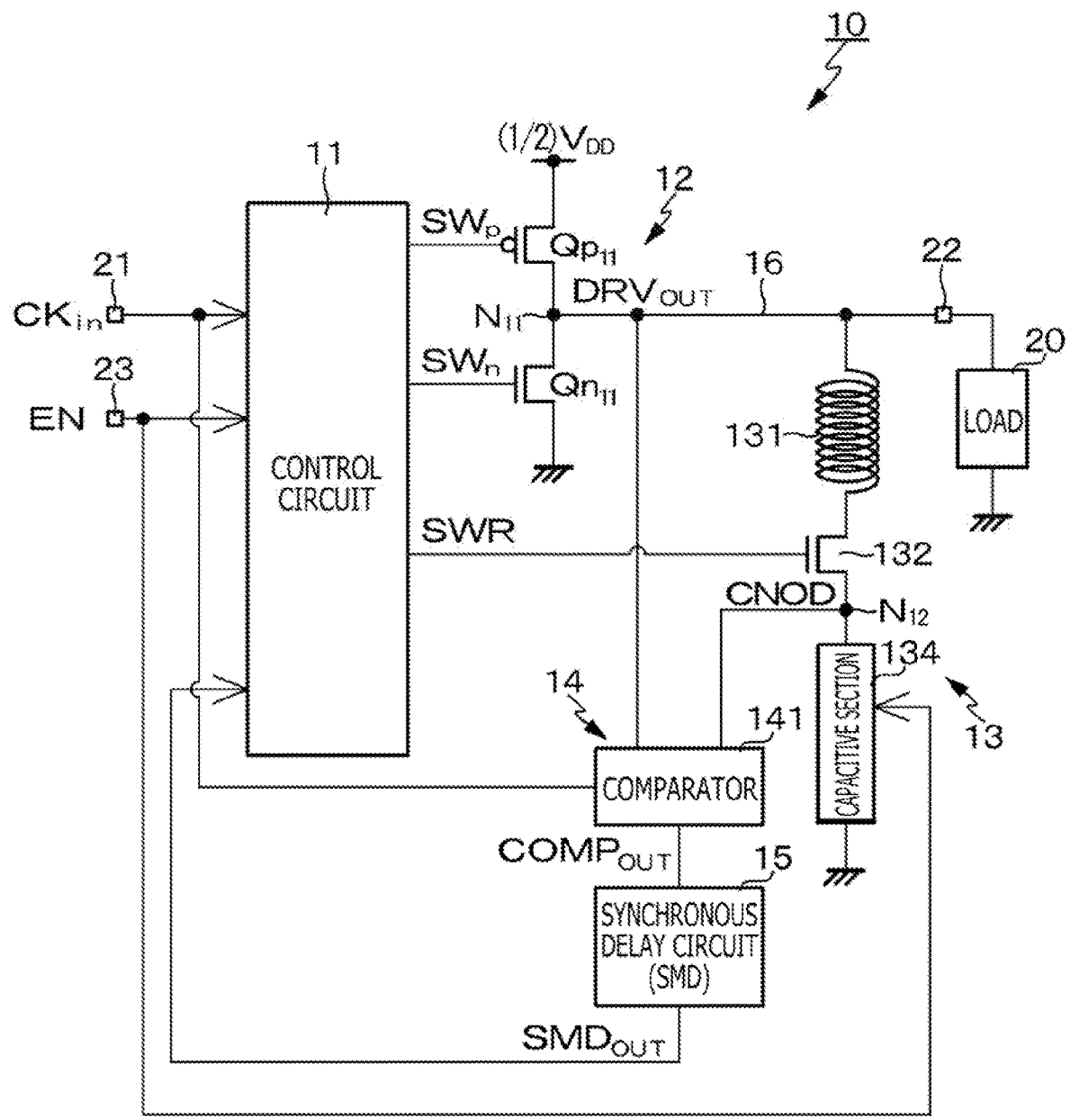
FIG. 16 is a circuit diagram illustrating a circuit configuration of a clock distribution circuit according to Example 4.

Example 4 is a modified example of Example 3 in which, as the intermediate level of the resonance amplitude, $(\frac{1}{4})V_{DD}$ is detected. Example 4 differs from Example 3 in that the power supply voltage for the drive circuit 12 is changed from $V_{DD}$ to $(\frac{1}{2})V_{DD}$. FIG. 16 illustrates a circuit configuration of a clock distribution circuit according to Example 4.

The clock distribution circuit 10 according to Example 4 is basically the same as the clock distribution circuit 10 according to Example 3 except that the power supply voltage for the drive circuit 12 is set to $(\frac{1}{2})V_{DD}$. However, in Example 4, $(\frac{1}{4})V_{DD}$ is detected as the intermediate level of the resonance amplitude, and thus the capacitive circuit section 134 uses the enable signal EN as a trigger to generate $(\frac{1}{4})V_{DD}$ corresponding to the intermediate level of LC resonance such that the potential CNOD of the node $N_{12}$ between the inductor element 131 and the capacitive circuit section 134 is the $(\frac{1}{4})V_{DD}$.

(Capacitive Circuit Section)

Figure 17:
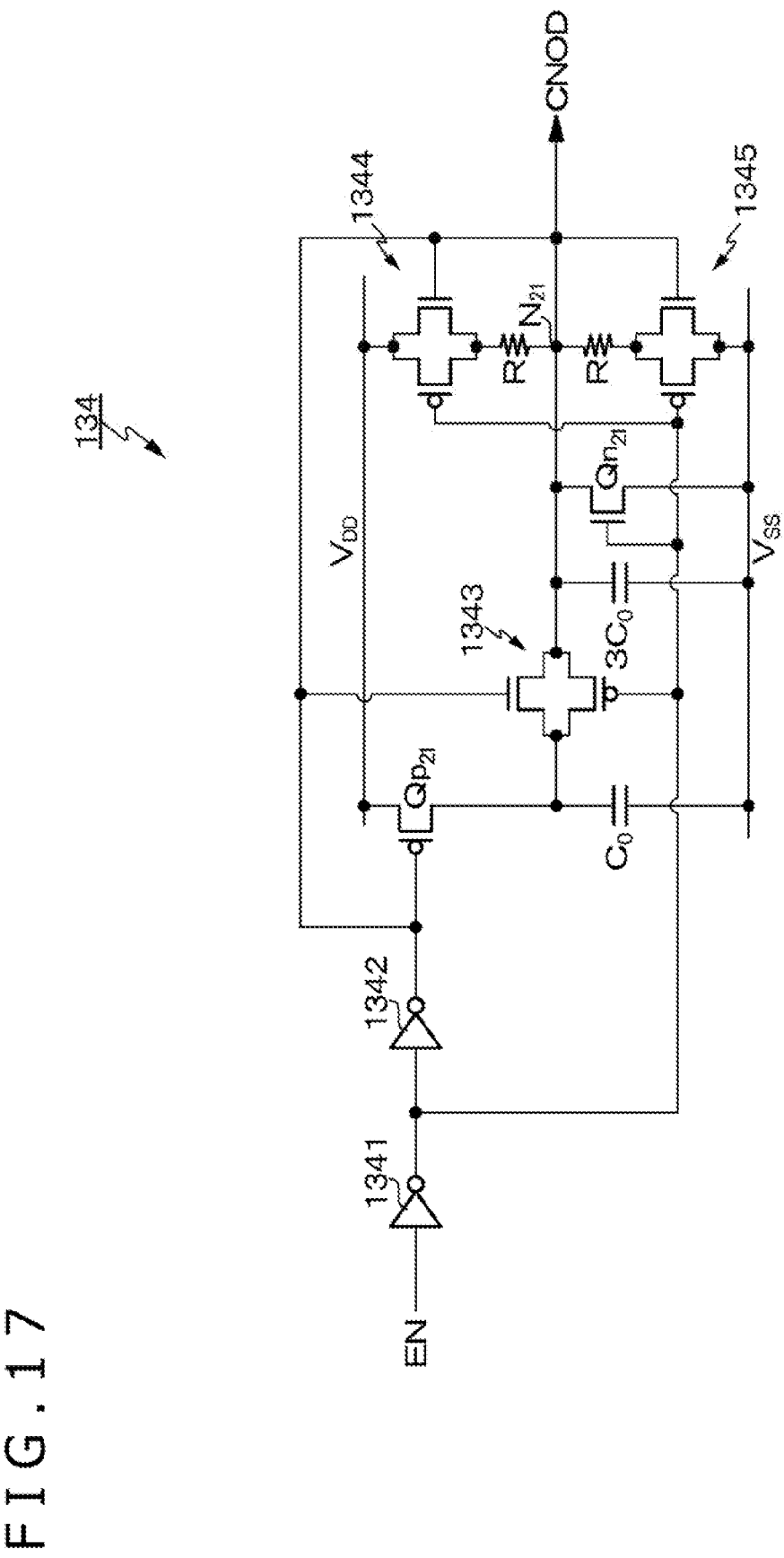
FIG. 17 is a circuit diagram illustrating a circuit example of a capacitive circuit section in the clock distribution circuit according to Example 4.

FIG. 17 illustrates a circuit example of the capacitive circuit section 134 in the clock distribution circuit 10 according to Example 4. The capacitive circuit section 134 according to the present circuit example basically has the same circuit configuration as that of the capacitive circuit section 134 in the clock distribution circuit 10 according to Example 4 except that capacitance values of two capacitive elements $C_0$ and $3C_0$ are in a relationship of 1:3 (See FIG. 11).

Since the capacitance values of two capacitive elements $C_0$ and $3C_0$ are set to 1:3, the capacitive circuit section 134 in the clock distribution circuit 10 according to Example 4 can generate $(\frac{1}{4})V_{DD}$ as the potential CNOD of the node $N_{12}$ between the inductor element 131 and the capacitive circuit section 134.

With the clock distribution circuit 10 according to Example 4 configured as described above, advantages and effects similar to those in Example 3 can be obtained. In other words, reducing the intermediate level of LC resonance to $(\frac{1}{4})V_{DD}$ allows the gate voltage of the MOS transistor 132 to be relatively increased by $(\frac{1}{4})V_{DD}$, increasing an on current. Thus, resonance efficiency can be increased. In addition, this configuration can reduce the resonance amplitude to $(\frac{1}{2})V_{DD}$, thus decreasing power consumption compared to the case where the power supply voltage is $V_{DD}$.

Figure 18:
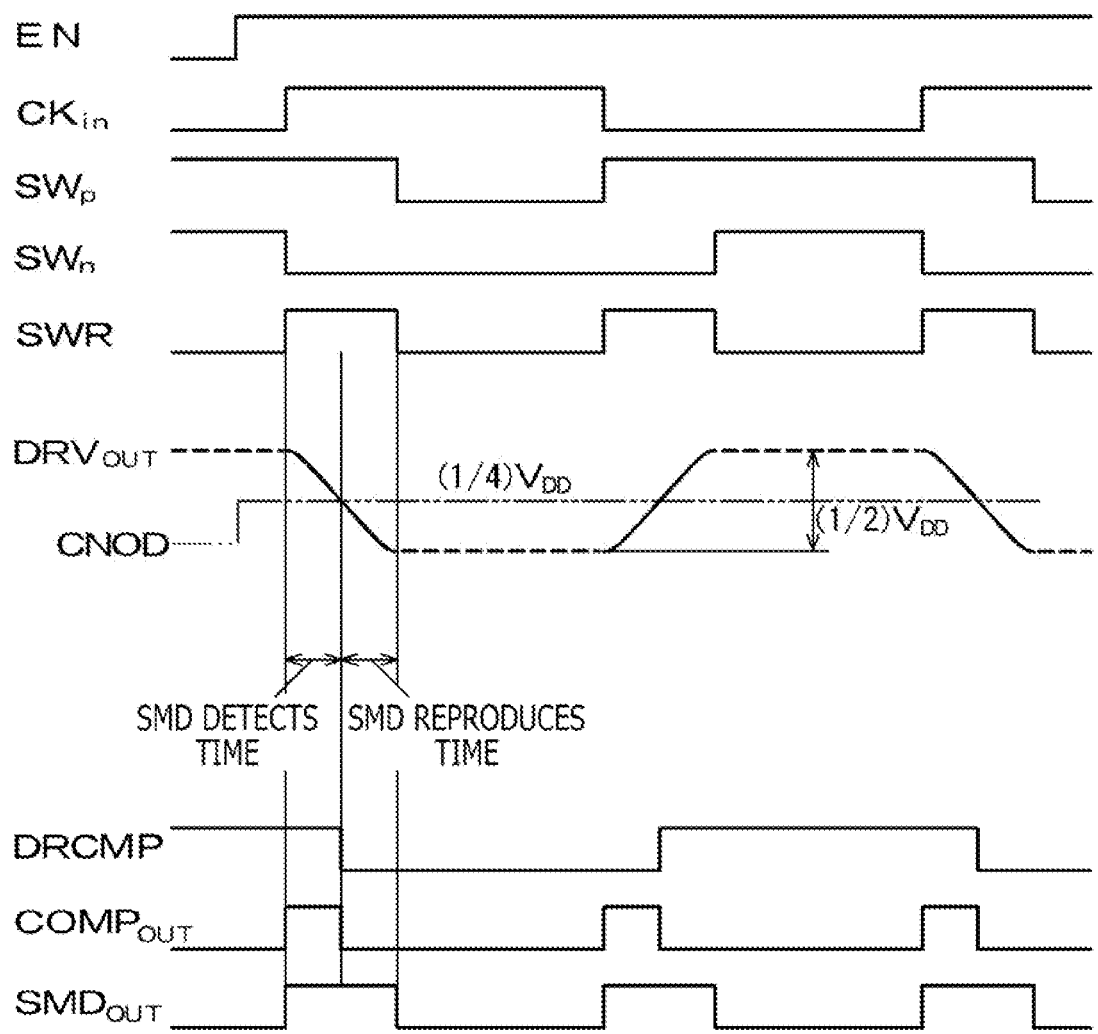
FIG. 18 is a timing chart illustrating a timing relationship among signals from sections of the clock distribution circuit according to Example 4.

FIG. 18 illustrates a timing relationship among signals from sections of the clock distribution circuit 10 according to Example 4 including the capacitive circuit section 134 described above. A timing chart in FIG. 18 illustrates a timing relationship among the enable signal EN, the clock signal $C_{in}$, the clock pulses $SW_p$ and $SW_n$, the control pulse SWR, the output $DRV_{OUT}$ from the drive circuit 12, the potential CNOD of the node $N_{12}$, the output DRCMP from the differential comparator 1411, the positive phase output $COMP_{OUT}$ from the comparator 141, and the output $SMD_{OUT}$ from the synchronous delay circuit 15. The output $DRV_{OUT}$ from the drive circuit 12 has an amplitude of $(\frac{1}{2})V_{DD}$.

Example 5

Figure 19:
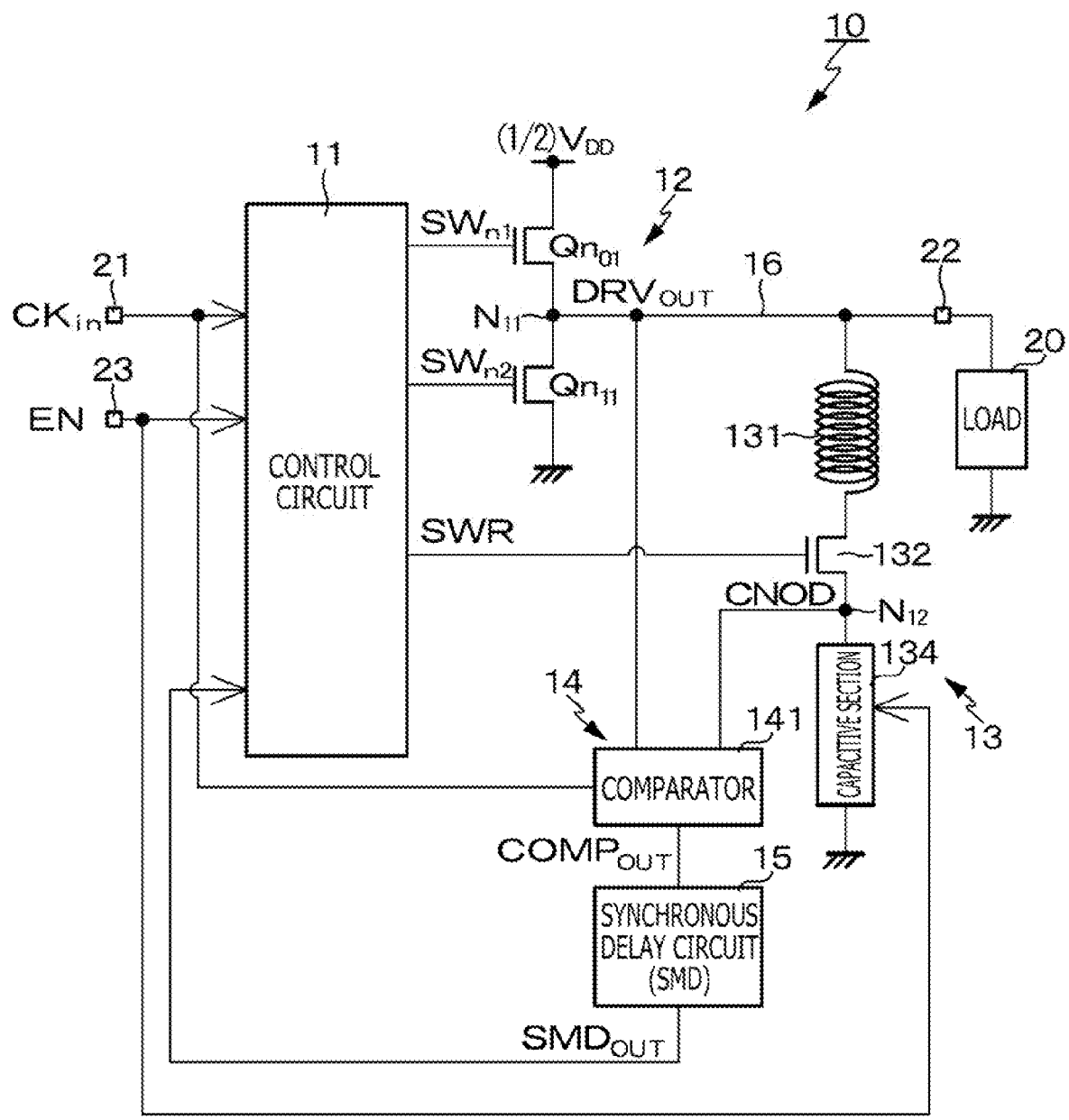
FIG. 19 is a circuit diagram illustrating a circuit configuration of a clock distribution circuit according to Example 5.

Example 5 is a modified example of Example 4 in which an N channel MOS transistor is used as the pull-up element of the drive circuit. FIG. 19 illustrates a circuit configuration of a clock distribution circuit according to Example 5. In the clock distribution circuit 10 according to Example 5, the power supply voltage for the drive circuit is set to $(1/2)V_{DD}$ as is the case with Example 4.

In the clock distribution circuit 10 according to Example 5, the drive circuit 12 includes transistors $Qn_{01}$ and $Qn_{02}$ both including an N channel and connected in series between a node with the power supply voltage $(1/2)V_{DD}$ and a node with the ground potential GND. The N channel MOS transistor $Qn_{01}$ on the power supply voltage $(1/2)V_{DD}$ side is a pull-up element, and the N channel MOS transistor $Qn_{02}$ on the ground potential GND side is a pull-down element.

In the clock distribution circuit 10 according to Example 5, the power supply voltage for the drive circuit 12 is set to $(1/2)V_{DD}$, and an output $DTVR_{OUT}$ from the drive circuit 12 has an amplitude of $(1/2)V_{DD}$. Thus, even in a case where an N channel MOS transistor is utilized as the pull-up element of the drive circuit 12, there is a potential difference of $(1/2)V_{DD}$ between the ON voltage $V_{DD}$ of a clock pulse $SW_{n1}$ and an output voltage $(1/2)V_{DD}$. Consequently, in a case where the MOS transistor $Qn_{01}$ has a threshold voltage lower than $(1/2)V_{DD}$, $(1/2)V_{DD}$ can be output as the output voltage $DTVR_{OT}$ of the drive circuit 12.

Under the potential relationship described above, in the clock distribution circuit 10 according to Example 5, the N channel MOS transistor $Qn_{01}$ is used as the pull-up element of the drive circuit 12. Thus, the drive circuit 12 can be controlled using a control signal for the drive circuit 12, that is, a waveform in which clock pulse $SW_{n1}$ on a pull-up side is shifted by just 90 degrees from the clock pulse $SW_2$ on a pull-down side. As a result, the control circuit 11 generating a clock pulse $SW_{n1}$ and a clock pulse $SW_{n2}$ can be implemented using a simple circuit configuration.

A specific circuit example of the control circuit 11 in the clock distribution circuit 10 according to Example 5 will be described. The comparator 141 and the synchronous delay circuit 15 may have the same circuit configurations (see FIG. 13 and FIG. 14) as those of the comparator 141 and the synchronous delay circuit 15 in the clock distribution circuit 10 according to Example 3.

(Control Circuit)

Figure 20:
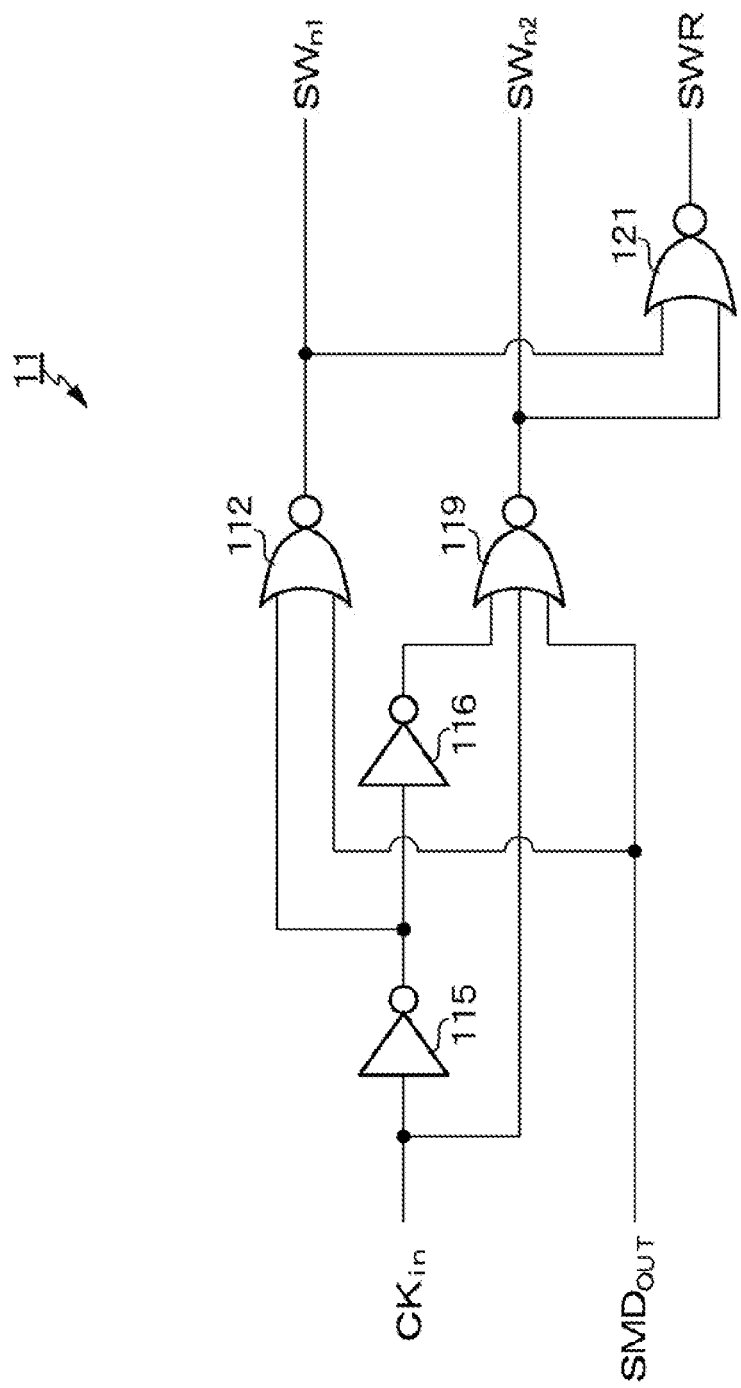
FIG. 20 is a circuit diagram illustrating a circuit example of a control circuit in the clock distribution circuit according to Example 5.

FIG. 20 illustrates a circuit example of the control circuit 11 in the clock distribution circuit 10 according to Example 5. The control circuit 11 according to the present circuit example includes two inverter circuits 115, 16, two two-input NOR circuits 112 and 121, and a three-input NOR circuit 119.

The clock signal $C_{in}$ externally input is inverted into one input to the NOR circuit 112 by the inverter circuit 115, and the clock signal $C_{in}$ inverted is further inverted into a first input to the NOR circuit 119 by the inverter circuit 116, and the clock signal $C_{in}$ is also used directly as a second input to the NOR circuit 119. The output $SMD_{OUT}$ from the synchronous delay circuit 15 is used as the other input to the NOR circuit 112 and as a third input to the NOR circuit 119.

Then, the output from the NOR circuit 112 is derived as the clock pulse $SW_{n1}$ driving the MOS transistor $Qn_{01}$ on the pull-up side and as the clock pulse $SW_{n2}$ driving the MOS transistor $Qn_{02}$ on the pull-down side. The outputs from the NOR circuit 112 and the NOR circuit 119 are derived as the control pulse SWR controlling the N channel MOS transistor 132 for pulse control through the NOR circuit 121.

Figure 21:
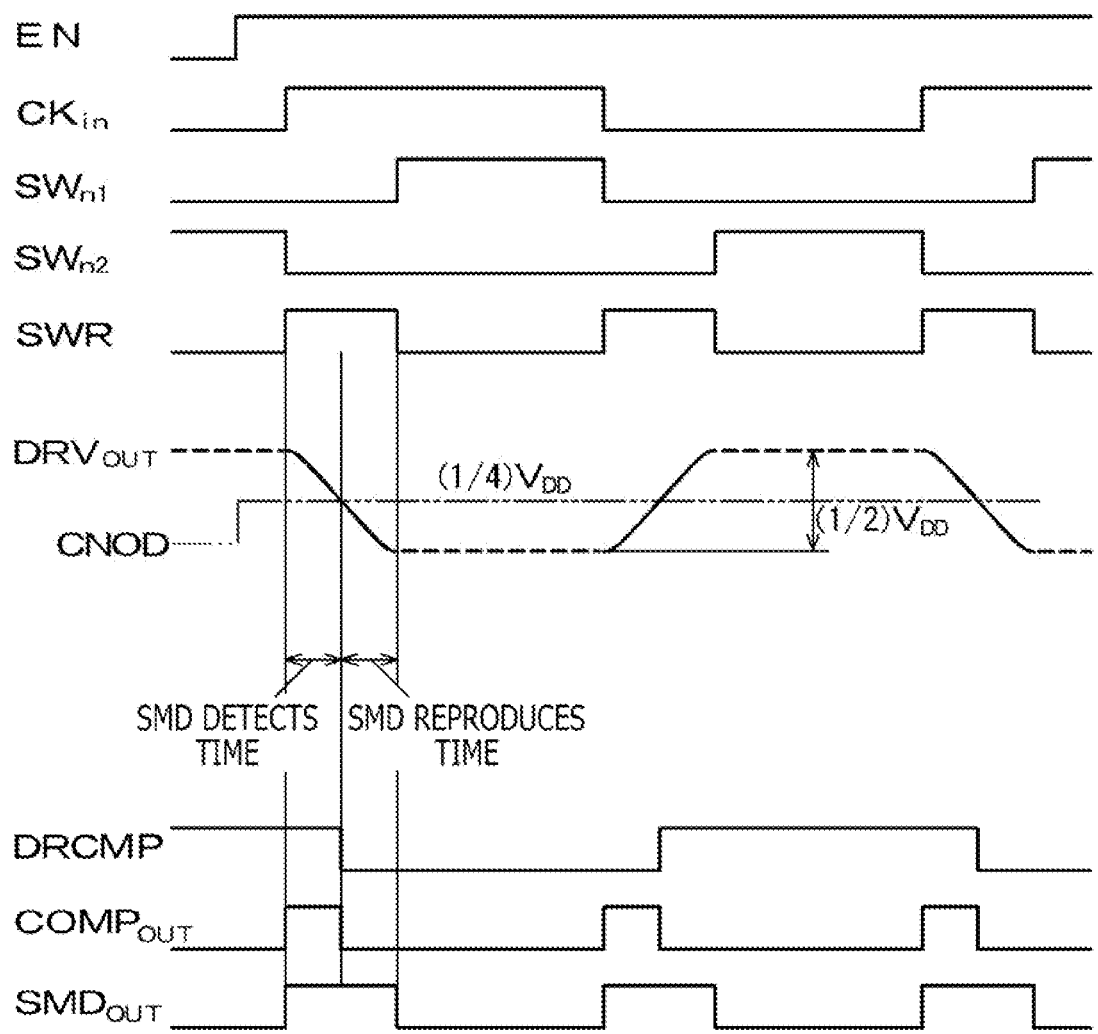
FIG. 21 is a timing chart illustrating a timing relationship among signals from sections of the clock distribution circuit according to Example 5.

FIG. 21 illustrates a timing relationship among signals from sections of the clock distribution circuit 10 according to Example 5 including the control circuit 11. A timing chart in FIG. 21 illustrates a timing relationship among the enable signal EN, the clock signal $C_{in}$, the clock pulses $SW_{n1}$ and $SW_{n2}$, the control pulse SWR, the output $DRV_{OUT}$ from the drive circuit 12, the potential CNOD of the node $N_{12}$, the output $COMP_{OUT}$ from the comparator 141, and the output $SMD_{OUT}$ from the synchronous delay circuit 15. The output $DRV_{OUT}$ from the drive circuit 12 has an amplitude of $(1/2)V_{DD}$.

Example 6

Figure 22:
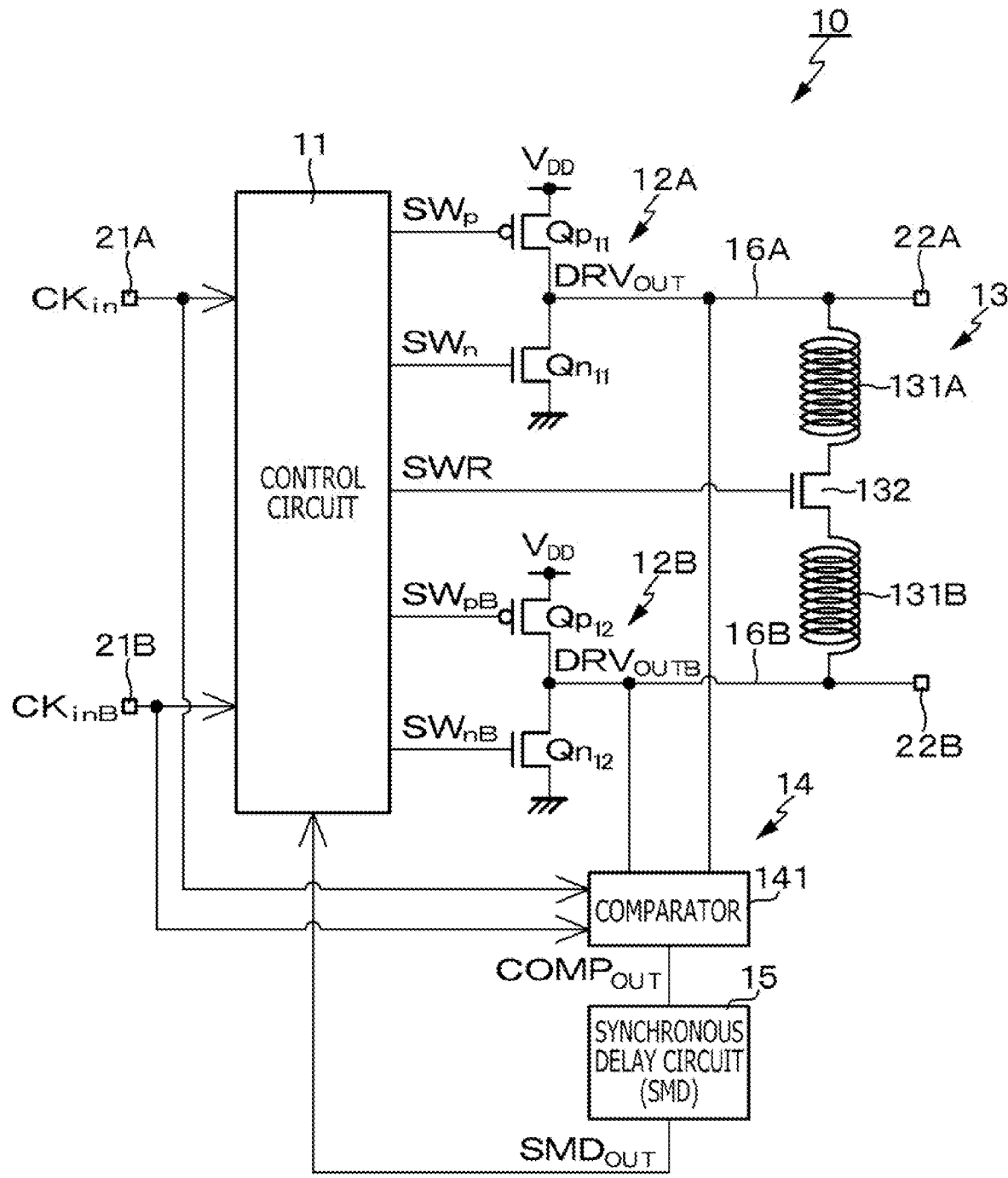
FIG. 22 is a circuit diagram illustrating a circuit configuration of clock distribution circuit according to Example 6.

Example 6 is an example of a differential configuration in which the single phase configuration in Example 1 is changed to a differential configuration. FIG. 22 illustrates a circuit configuration of a clock distribution circuit according to Example 6. Due to the differential configuration, Example 6 includes two drive circuits 12A and 12B, while eliminating a need for the capacitive element (capacitive circuit section) generating the intermediate level of the resonance amplitude of the LC resonance circuit.

Clock signals $C_{in}$ and $C_{inB}$ having opposite phases are externally input to the control circuit 11 via circuit input terminals 21A and 21B. On the basis of the clock signals $C_{in}$ and $C_{inB}$, the control circuit 11 generates clock pulses $SW_p$ and $SW_n$ for driving the drive circuit 12A, clock pulses $SW_{pB}$ and $SW_{nB}$ for driving the drive circuit 12B, and the control pulse SWR for driving the N channel MOS transistor 132 for pulse control.

The drive circuit 12A includes a P channel MOS transistor $Qp_{11}$ and an N channel MOS transistor $Qn_{11}$ connected in series between the node with the power supply voltage $V_{DD}$ and the node with the ground potential GND. The P channel MOS transistor $Qp_{11}$ performs a switching operation according to the clock pulse $SW_p$ provided by the control circuit 11, and the N channel MOS transistor $Qn_{11}$ performs a switching operation according to the clock pulse $SW_n$ provided by the control circuit 11.

The drive circuit 12B includes a P channel MOS transistor $Qp_{12}$ and an N channel MOS transistor $Qn_{12}$ connected in series between the node with the power supply voltage $V_{DD}$ and the node with the ground potential GND. The P channel MOS transistor $Qp_{12}$ performs a switching operation according to the clock pulse $SW_{pB}$ provided by the control circuit 11, and the N channel MOS transistor $Qn_{12}$ performs a switching operation according to the clock pulse $SW_{nB}$ provided by the control circuit 11.

A signal line 16A is connected between an output end of the drive circuit 12A and a circuit output terminal 22A, and a signal line 16B is connected between an output end of the drive circuit 12B and a circuit output terminal 22B. The series connection circuit 13 of an inductor element 131A, a MOS transistor 132 with, for example, an N channel, and an inductor element 131B is connected between the signal line 16A and the signal line 16B. Note that, with the inductor element 131A and 131B not provided, a drain electrode of the MOS transistor 132 may be connected directly to the signal line 16A, whereas a source electrode of the MOS transistor 132 may be connected directly to the signal line 16B.

In the series connection circuit 13, the inductor element 131A forms an LC resonance circuit along with the wiring capacity of the signal line 16A, and the resonance frequency is determined by the inductance of the inductor element 131A and the capacitance of the wiring capacity of the signal line 16A. Additionally, the inductor element 131B forms an LC resonance circuit along with the wiring capacity of the signal line 16B, and the resonance frequency is determined by the inductance of the inductor element 131B and the capacitance of the wiring capacity of the signal line 16A.

The level detection circuit 14 includes, for example, the comparator 141. One input end of the comparator 141 is connected to the signal line 16A and provided with the output $DRV_{OUT}$ from the drive circuit 12A. The other input end of the comparator 141 is connected to the signal line 16B and provided with the output $DRV_{OUTB}$ from the drive circuit 12B. The comparator 141 detects, as the intermediate level of the resonance amplitude, a differential output from the drive circuits 12A and 12B, that is, a cross point between the output $DRV_{OUT}$ and the output $DRV_{OUTB}$.

On the basis of the detection output $COMP_{OUT}$ of the intermediate transition position of LC resonance (intermediate level), the output $COMP_{OUT}$ from the comparator 141 is fed to the synchronous delay circuit 15. The synchronous delay circuit 15 detects the time when the intermediate level of the resonance amplitude is reached, and reproduces the same time as the detected time. The principle and circuit examples of the synchronous delay circuit 15 will be described below.

The output $COMP_{OUT}$ from the comparator 141 is fed to the synchronous delay circuit 15 provided in the feedback path from the comparator 141 to the control circuit 11 as a result of measurement of a time corresponding to half the period of LC resonance. On the basis of the cross point between the output $DRV_{OUT}$ and the output $DRV_{OUTB}$ detected by the comparator 141, the synchronous delay circuit 15 detects the time when the intermediate level of the resonance amplitude is reached and reproduces the same time as the detected time. The output $SMD_{OUT}$ from the synchronous delay circuit 15 is fed to the control circuit 11.

In the clock distribution circuit 10 according to Example 6 configured as described above, the two drive circuits 12 and the two signal lines 16 are provided, and the outputs $DRV_{OUT}$ and $DRV_{OUT}E$ from the two drive circuits 12A and 12B are differential signals. Thus, effective utilization of inverted signals allow simplification of circuit configurations of the control circuit 11 and the comparator 141. Additionally, the cross point of the differential signal can be utilized for detection of a change in intermediate potential involving a significant change in resonance amplitude of LC resonance. As a result, this configuration generally allows more simplification of the circuit configuration than the single phase configuration in Example 1.

Specific circuit examples of the comparator 141 and the control circuit 11 in the clock distribution circuit 10 according to Example 6 will be described. Note that the synchronous delay circuit 15 may have the same circuit configuration (see FIG. 14) as that of the synchronous delay circuit 15 in the clock distribution circuit 10 according to Example 3.

(Comparator)

Figure 23:
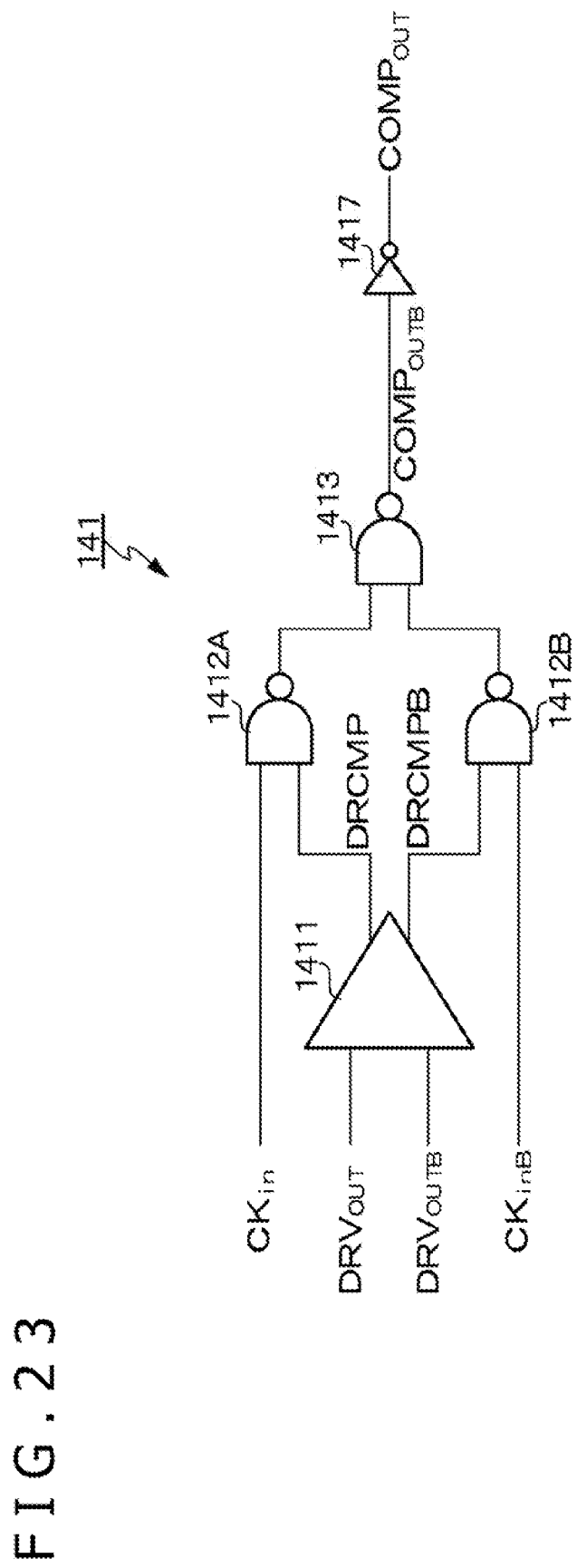
FIG. 23 is a circuit diagram illustrating a circuit example of a comparator in the clock distribution circuit according to Example 6.

FIG. 23 illustrates a circuit example of the comparator 141 in the clock distribution circuit 10 according to Example 6. The comparator 141 according to the present circuit example includes the differential comparator 1411, three two-input NAND circuit 1412A, 1412B, and 1413, and two inverter circuits 1417.

The differential comparator 1411 uses, as differential inputs, the output $DRV_{OUT}$ from the drive circuit 12A, corresponding to the potential of the signal line 16A, and the output $DRV_{OUTB}$ from the drive circuit 12B, corresponding to the potential of the signal line 16B. Differential outputs DRCMP and DRCMPB from the differential comparator 1411 are used as one input to the NAND circuit 1412A and as one input to the NAND circuit 1412B. Note that it is sufficient that the differential comparator 1411 can detect the inversion level of a signal and thus that an inverter circuit, a NAND circuit, or the like can be used instead of the differential comparator 1411.

The clock signals $C_{in}$ and $C_{inB}$ externally input are used as the other input to the NAND circuit 1412A and as the other input to the NAND circuit 1412B. Outputs from the NAND circuits 1412A and 1412B are used as two inputs to the NAND circuit 1413. An output from the NAND circuit 1413 is used as the negative phase output $COMP_{OUTB}$ from the comparator 141, which is further inverted into a positive phase output $COMP_{OUT}$ from the comparator 141 by the inverter circuit 1417.

(Control Circuit)

Figure 24:
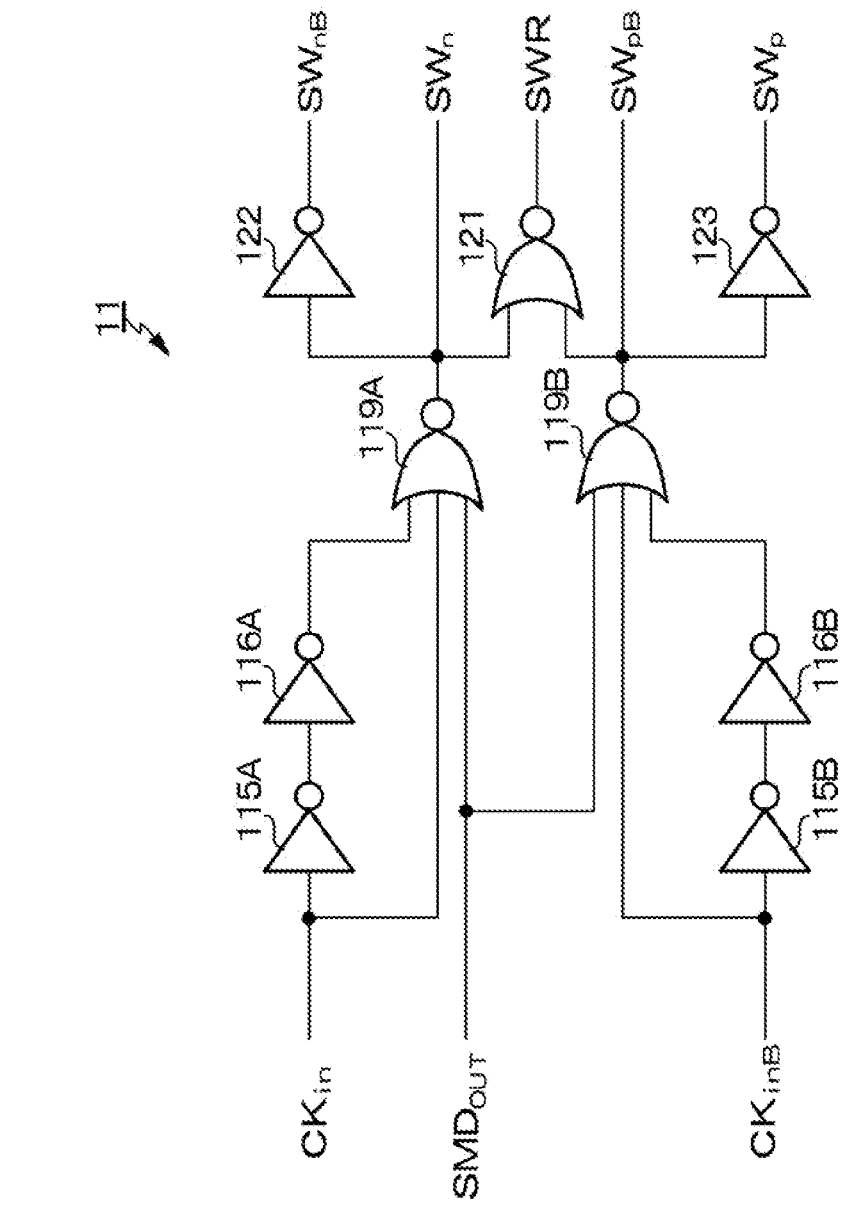
FIG. 24 is a circuit diagram illustrating a circuit example of a control circuit in the clock distribution circuit according to Example 6.

FIG. 24 illustrates a circuit example of the control circuit 11 in the clock distribution circuit 10 according to Example 6. The control circuit 11 according to the present circuit example includes four inverter circuits 115A, 115B, 116A, and 116B, two three-input NOR circuits 119A and 119B, a two-input NOR circuit 121, and two inverter circuits 122 and 123.

The clock signal $C_{in}$ externally input is used as a first input to the NOR circuit 119A via the inverter circuit 115A and the inverter circuit 116A, and is used directly as a second input to the NOR circuit 119A. The clock signal $C_{inB}$ is used as a first input to the NOR circuit 119B via the inverter circuit 115B and the inverter circuit 116B, and is used directly as a second input to the NOR circuit 119B.

The output $SMD_{OUT}$ from the synchronous delay circuit 15 is used as a third input to the NOR circuit 119A and to the NOR circuit 119B. Outputs from the NOR circuit 119A and the NOR circuit 119B are each derived through an input NOR circuit 121 as the control pulse SWR controlling the N channel MOS transistor 132 of the series connection circuit 13.

Additionally, the output from the NOR circuit 119A is derived directly as the clock pulse $SW_n$ driving the N channel MOS transistor $Qn_{11}$ of the drive circuit 12A, and, through the inverter circuit 122, is derived as the clock pulse $SW_{nB}$ driving the N channel MOS transistor $Qn_{12}$ of the drive circuit 12B.

In addition, the output from the NOR circuit 119B is derived directly as the clock pulse $SW_{nB}$ driving the P channel MOS transistor $Qp_{12}$ of the drive circuit 12B, and, through the inverter circuit 123, is derived as the clock pulse $SW_p$ driving the P channel MOS transistor $Qp_{12}$ of the drive circuit 12A.

Figure 25:
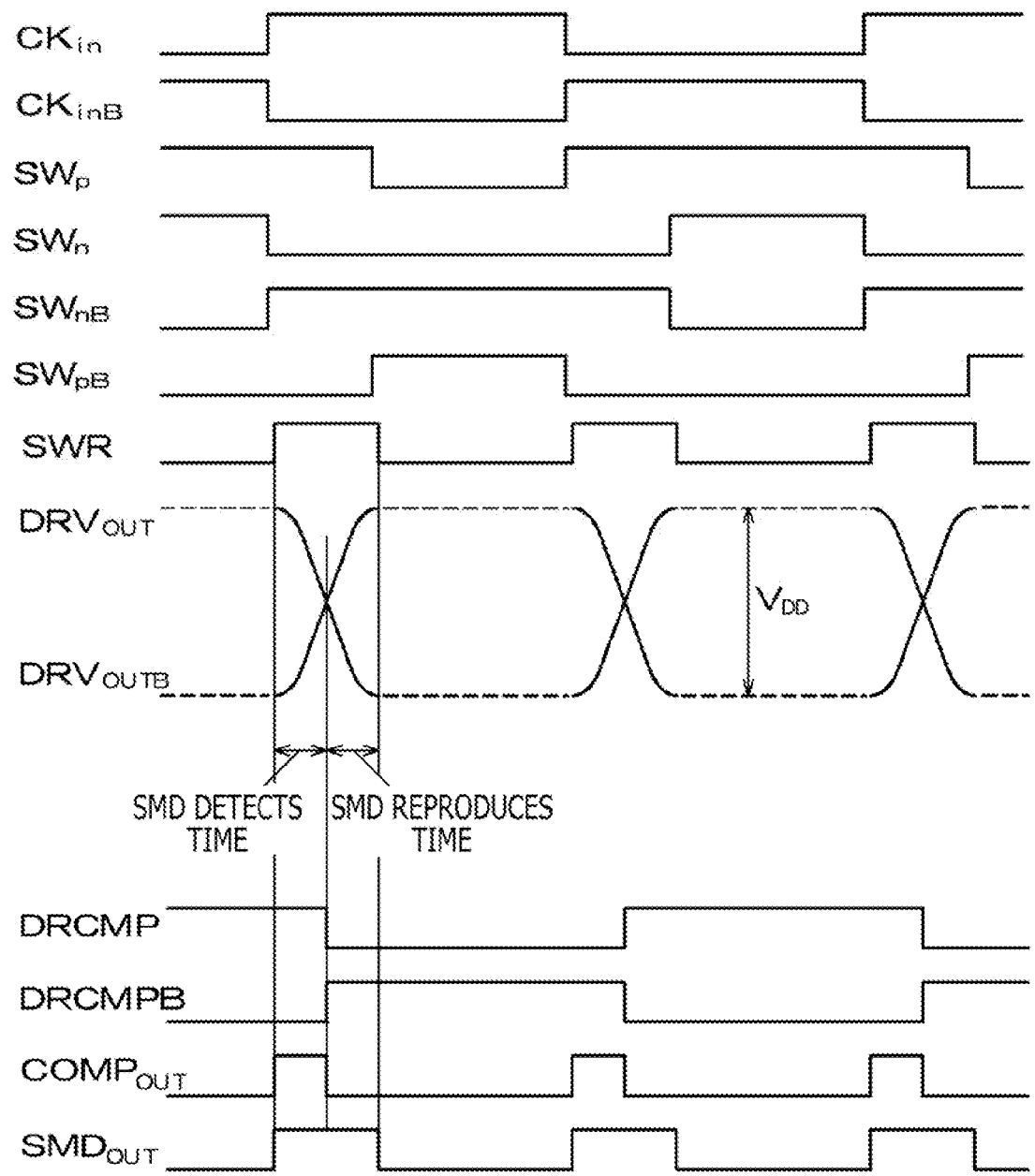
FIG. 25 is a timing chart illustrating timing relationship among signals from sections of the clock distribution circuit according to Example 6.

FIG. 25 illustrates a timing relationship among signals from sections of the clock distribution circuit 10 according to Example 6 including the comparator 141 and the control circuit 11 described above. A timing chart in FIG. 25 illustrates a timing relationship among the clock signals $C_{in}$ and $C_{inB}$, the clock pulses $SW_p$ and $SW_n$, the clock pulses $SW_{nB}$ and $SW_{pB}$, the control pulse SWR, the outputs $DRV_{OUT}$ and $DRV_{OUTB}$ from the two drive circuits 12A and 12B, outputs DRCMP and DRCMPB from the differential comparator 1411, the output $COMP_{OUT}$ from the comparator 141, and the output $SMD_{OUT}$ from the synchronous delay circuit 15. The output $DRV_{OUT}$ from the drive circuit 12 and The output $DRV_{OUTB}$ from the drive circuit 12B have an amplitude of $V_{DD}$.

Example 7

Figure 26:
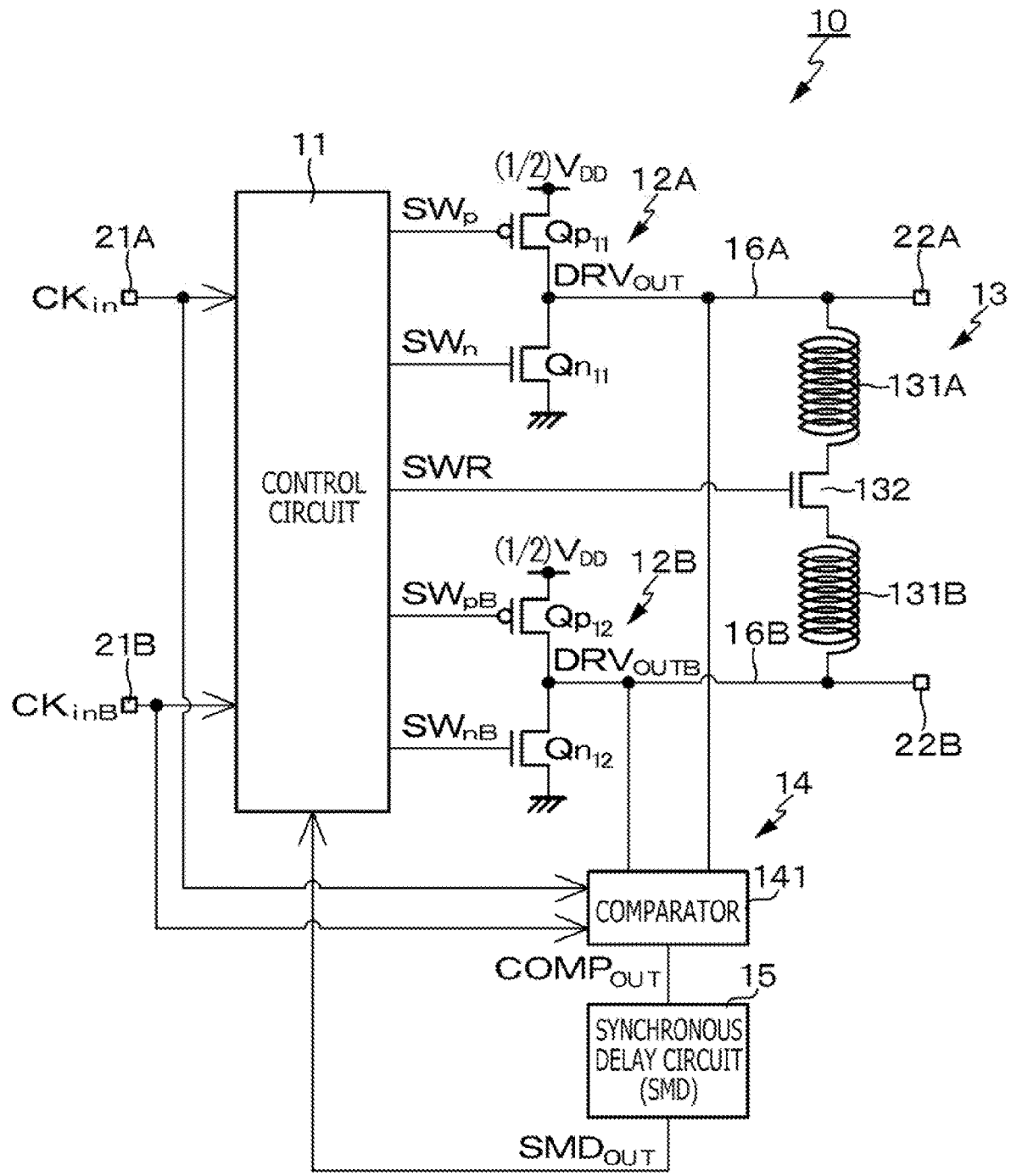
FIG. 26 is a circuit diagram illustrating a circuit configuration of a clock distribution circuit according to Example 7.

Example 7 is a modified example of Example 6 with a differential configuration, and is an example in which, as the intermediate level of the resonance amplitude, $(¼)V_{DD}$ is detected. FIG. 26 illustrates a circuit configuration of a clock distribution circuit according to Example 7.

The clock distribution circuit 10 according to Example 7 is the same as the clock distribution circuit 10 according to Example 6 in that the clock distribution circuit includes the control circuit 11, the two drive circuits 12A and 12B, the series connection circuit 13, the level detection circuit 14 (specifically, the comparator 141), and the synchronous delay circuit (SMD) 15. Note that, with the inductor elements 131A and 131B not provided, the drain electrode of the MOS transistor 132 may be connected directly to the signal line 16A and that the source electrode of the MOS transistor 132 may be connected directly to the signal line 16B.

Example 7 differs from Example 6 in that the power supply voltage for the two drive circuits 12A and 12b is changed from $V_{DD}$ to $(\frac{1}{2})V_{DD}$. Consequently, the midpoint level of resonance amplitude of the LC resonance circuit, provided by the capacitive element 133, is $(\frac{1}{4})V_{DD}$.

In the clock distribution circuit 10 according to Example 7 configured as described above, the level detection circuit 14, that is, the comparator 141, detects the intermediate level of LC resonance, specifically, $(\frac{1}{4})V_{DD}$. The synchronous delay circuit 15 detects the time when the intermediate level of the resonance amplitude is reached, and reproduces the same time as the detected time.

The clock distribution circuit 10 according to Example 7 also has a differential configuration, and thus advantages and effects similar to those in Example 6 can be obtained. Specifically, with the differential signal available, effective utilization of inverted signals allow simplification of circuit configurations of the control circuit 11 and the comparator 141. Additionally, reducing the intermediate level of LC resonance to $(\frac{1}{4})V_{DD}$ allows advantages and effects similar to those in Example 2 to be obtained. Specifically, the gate voltage of the MOS transistor 132 can be relatively increased by $(\frac{1}{4})V_{DD}$ to increase the on current, and thus resonance efficiency can be increased. In addition, this configuration can reduce the resonance amplitude to $(\frac{1}{2})V_{DD}$, allowing power consumption to be decreased compared to the case where the power supply voltage is $V_{DD}$.

Figure 27:
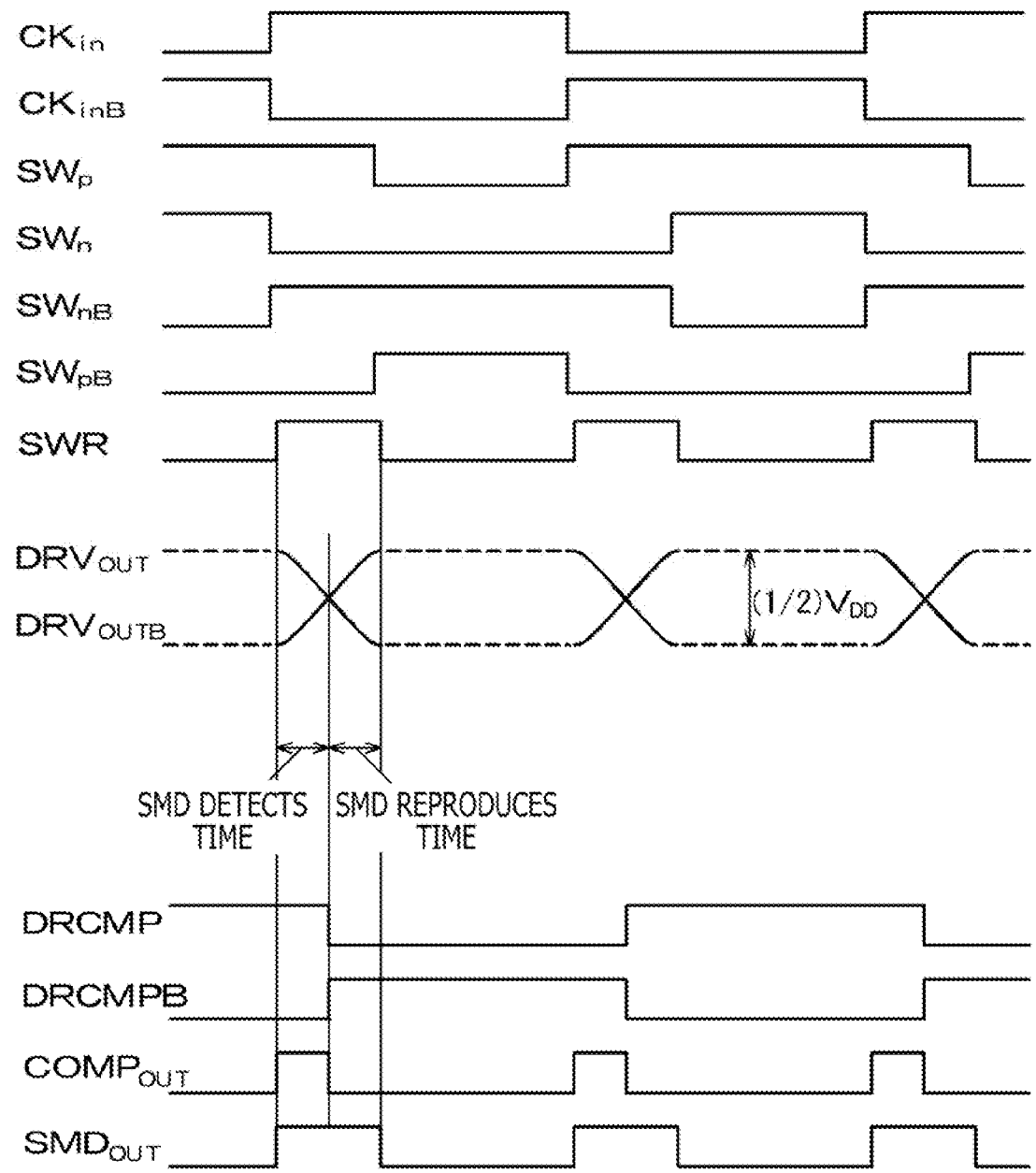
FIG. 27 is a timing chart illustrating a timing relationship among signals from sections of the clock distribution circuit according to Example 7.

FIG. 27 illustrates a timing relationship among signals from sections of the clock distribution circuit 10 according to Example 7. A timing chart in FIG. 27 illustrates a timing relationship among the clock signals $C_{in}$ and $C_{inB}$, the clock pulses $SW_p$ and $SW_n$, the clock pulses $SW_{nB}$ and $SW_{pB}$, the control pulse SWR, the outputs $DRV_{OUT}$ and $DRV_{OUTB}$ from the two drive circuits 12A and 12B, the output $COMP_{OUT}$ from the comparator 141, and the output $SMD_{OUT}$ from the synchronous delay circuit 15. The output $DRV_{OUT}$ from the drive circuit 12 and The output $DRV_{OUTB}$ from the drive circuit 12B have an amplitude of $(\frac{1}{2})V_{DD}$.

Example 8

Figure 28:
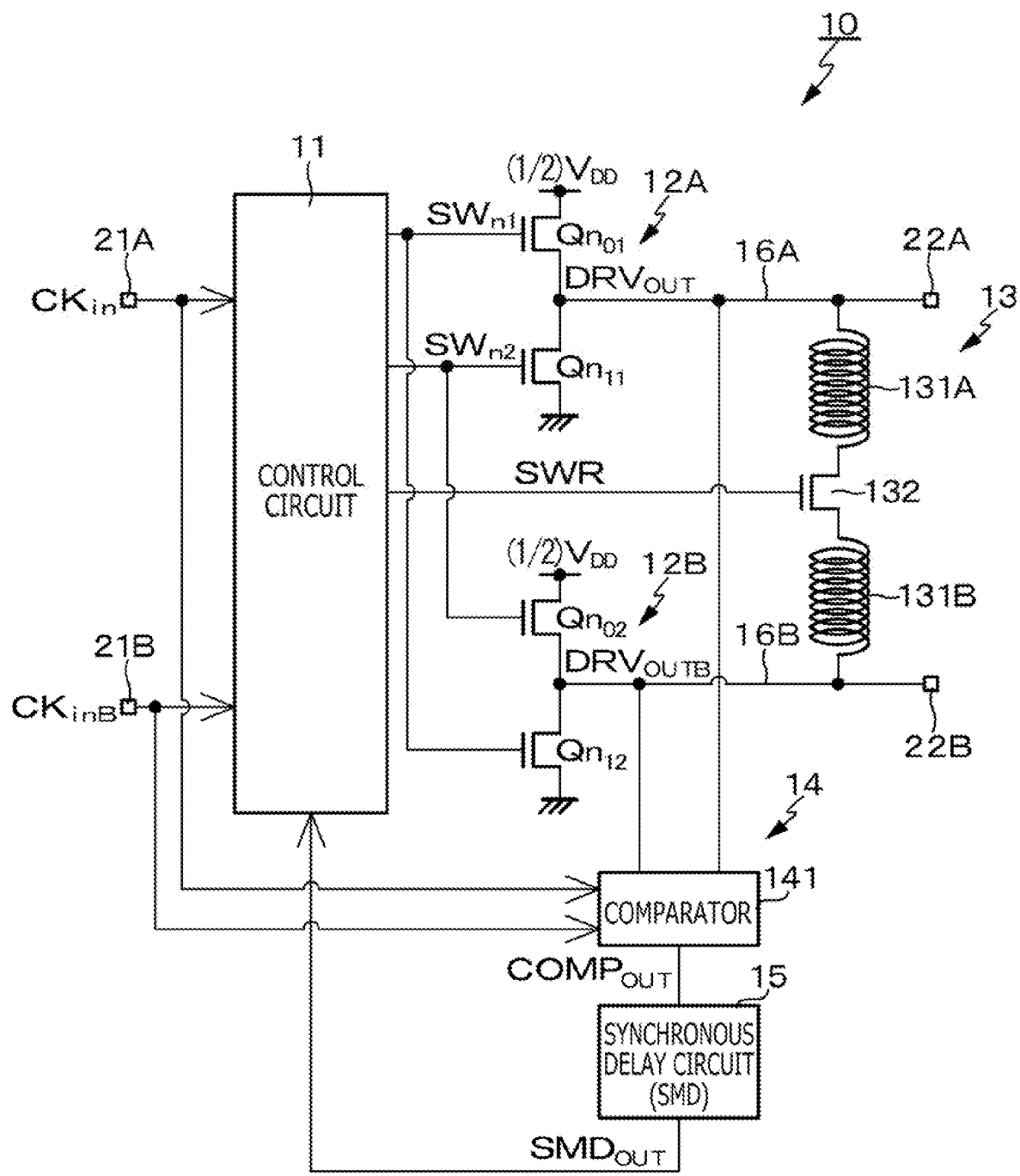
FIG. 28 is a circuit diagram illustrating a circuit configuration of a clock distribution circuit according to Example 8.

Example 8 is a modified example of Example 6, and is an example in which N channel MOS transistors are used for pull-up elements of two drive circuits. FIG. 28 illustrates a circuit configuration of a clock distribution circuit according to Example 8. In the clock distribution circuit 10 according to Example 8, the power supply voltage for the two drive circuits is set to $(\frac{1}{2})V_{DD}$, as is the case with Example 7.

In the clock distribution circuit 10 according to Example 8, the drive circuit 12A includes the MOS transistor $Qn_{01}$ and $Qn_{11}$ both including an N channel and connected in series between the node with the power supply voltage $(\frac{1}{2})V_{DD}$ and the node with the ground potential GND.

The drive circuit 12B includes the MOS transistor $Qn_{02}$ and $Qn_{12}$ both including an N channel and connected in series between the node with the power supply voltage $(\frac{1}{2})V_{DD}$ and the node with the ground potential GND.

In the two drive circuits 12A and 12B, the N channel MOS transistors $Qn_{01}$ and $Qn_{02}$ are pull-up elements, whereas the N channel MOS transistor $Qn_{11}$ and $Qn_{12}$ on the ground potential GND side are pull-down elements. The MOS transistor $Qn_{01}$ in the drive circuit 12A and the MOS transistor $Qn_{12}$ in the drive circuit 12B are driven by the clock pulse $SW_{n1}$ generated by the control circuit 11. The MOS transistor $Qn_{11}$ in the drive circuit 12A and the MOS transistor $Qn_{02}$ in the drive circuit 12B are driven by the clock pulse $SW_{n2}$ generated by the control circuit 11.

In the clock distribution circuit 10 according to Example 8, the power supply voltage for the two drive circuits 12A and 12B is set to $(\frac{1}{2})V_{DD}$, and the output voltage $DTVR_{OUT}$ from the drive circuit 12 is $(\frac{1}{2})V_{DD}$. Consequently, when the N channel MOS transistors are used as the pull-down elements in the two drive circuits 12A and 12B, the control circuit 11 generating the clock pulses $SW_{n1}$ and $SW_{n2}$ can be implemented using a simple circuit configuration, for reasons similar to the reasons in Example 5.

A specific circuit example of the control circuit 11 in the clock distribution circuit 10 according to Example 8 will be described below. The comparator 141 and the synchronous delay circuit 15 may have the same circuit configurations as those of the comparator 141 in the clock distribution circuit 10 according to Example 3 (see FIG. 23) and the synchronous delay circuit 15 in the clock distribution circuit 10 according to Example 6 (see FIG. 14).

(Control Circuit)

Figure 29:
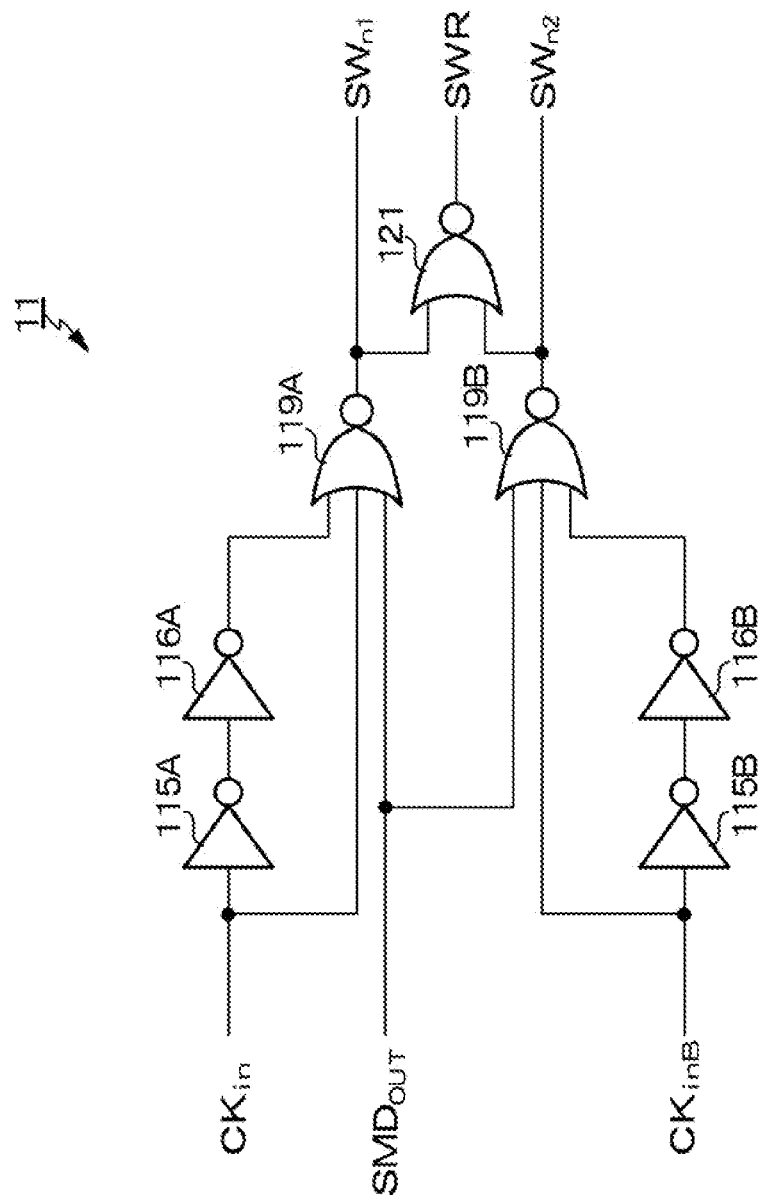
FIG. 29 is a circuit diagram illustrating a circuit example of a control circuit in the clock distribution circuit according to Example 8.

FIG. 29 illustrates a circuit example of the control circuit 11 in the clock distribution circuit 10 according to Example 8. The control circuit 11 according to the present circuit example includes the four inverter circuits 115A, 115B, 116A, and 116B, the two three-input NOR circuits 119A and 119B, the two-input NOR circuit 121, and the two inverter circuits 122 and 123

The clock signal $C_{in}$ externally input is used as the first input to the NOR circuit 119A via the inverter circuit 115A and the inverter circuit 116A and is used directly as the second input to the NOR circuit 119A. The clock signal $C_{inB}$ is used as a first input to the NOR circuit 119B via the inverter circuit 115B and the inverter circuit 116B and is used directly as a second input to the NOR circuit 119B.

The NOR circuit 119A and the NOR circuit 119B each use the output $SMD_{OUT}$ from the synchronous delay circuit 15 as the third input. The outputs from the NOR circuit 119A and the NOR circuit 119B are each derived through the input NOR circuit 121 as the control pulse SWR controlling the N channel MOS transistor 132 in the series connection circuit 13.

Additionally, the output from the NOR circuit 119A is derived directly as the clock pulse $SW_n$ driving the N channel MOS transistor $Qn_{01}$ in the drive circuit 12A and the N channel MOS transistor $Qn_{11}$ in the drive circuit 12B. The output from the NOR circuit 119B is derived directly as the clock pulse $SW_{n2}$ driving the N channel MOS transistor $Qn_{11}$ in the drive circuit 12A and the N channel MOS transistor $Qn_{02}$ in the drive circuit 12B.

Figure 30:
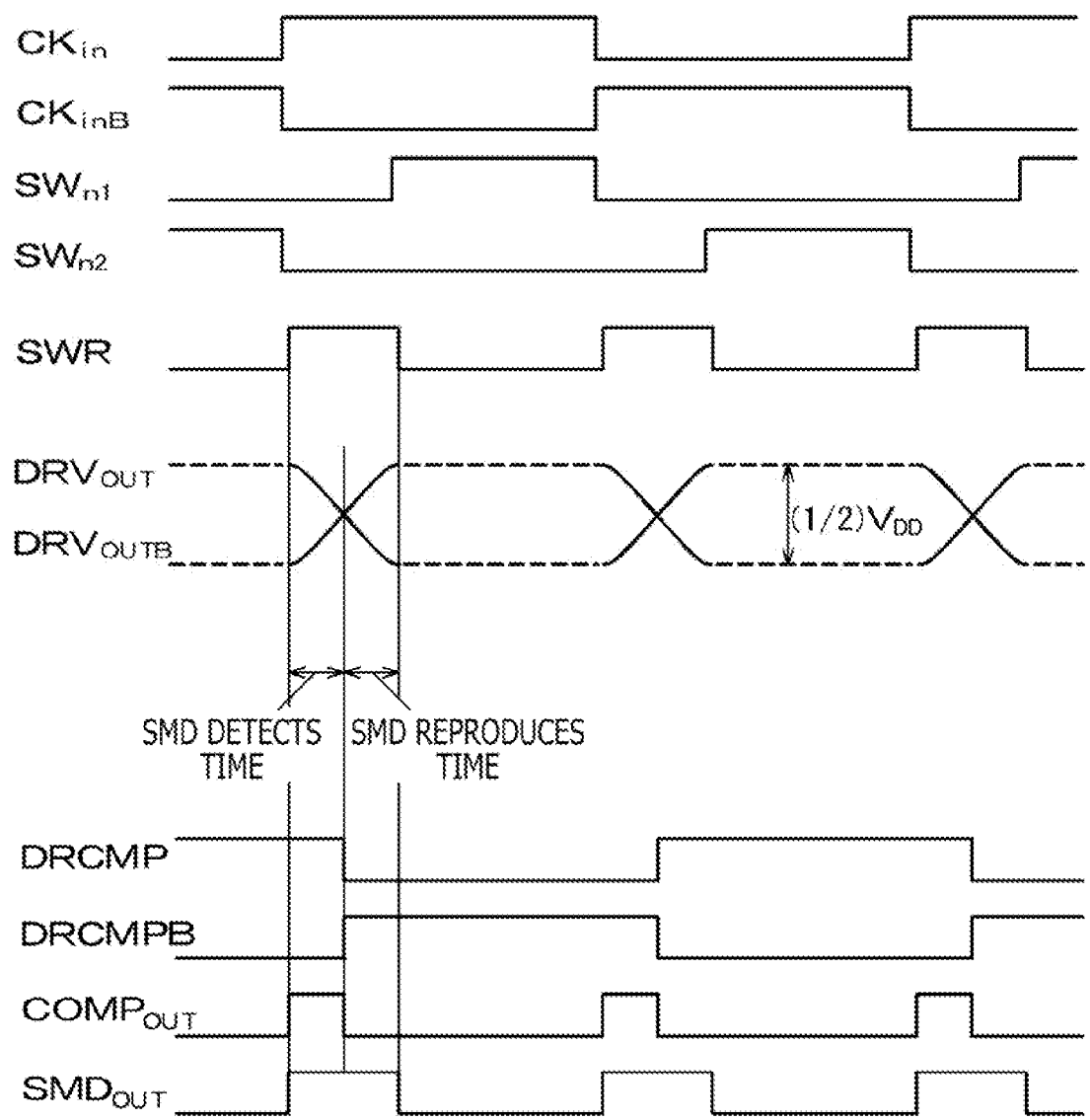
FIG. 30 is a timing chart illustrating a timing relationship among signals from sections of the clock distribution circuit according to Example 8.

FIG. 30 illustrates a timing relationship among signals from sections of the clock distribution circuit 10 according to Example 8 including the control circuit 11 described above. A timing chart in FIG. 30 illustrates a timing relationship among the clock signals $C_{in}$ and $C_{inB}$, the clock pulses $SW_{n1}$ and $SW_{n2}$, the control pulse SWR, the outputs DRV$_{OUT}$ and DRV$_{OUTB}$ from the two drive circuits 12A and 12B, the output COMP$_{OUT}$ from the comparator 141, and the output SMD$_{OUT}$ from the synchronous delay circuit 15.

The output DRV$_{OUT}$ from the drive circuit 12A and The output DRV$_{OUTB}$ from the drive circuit 12B have an amplitude of (½)V$_{DD}$. Note that, with the inductor elements 131A and 131B not provided, the drain electrode of the MOS transistor 132 may be connected directly to the signal line 16A and that the source electrode of the MOS transistor 132 may be connected directly to the signal line 16B.

Example 9

Figure 31:
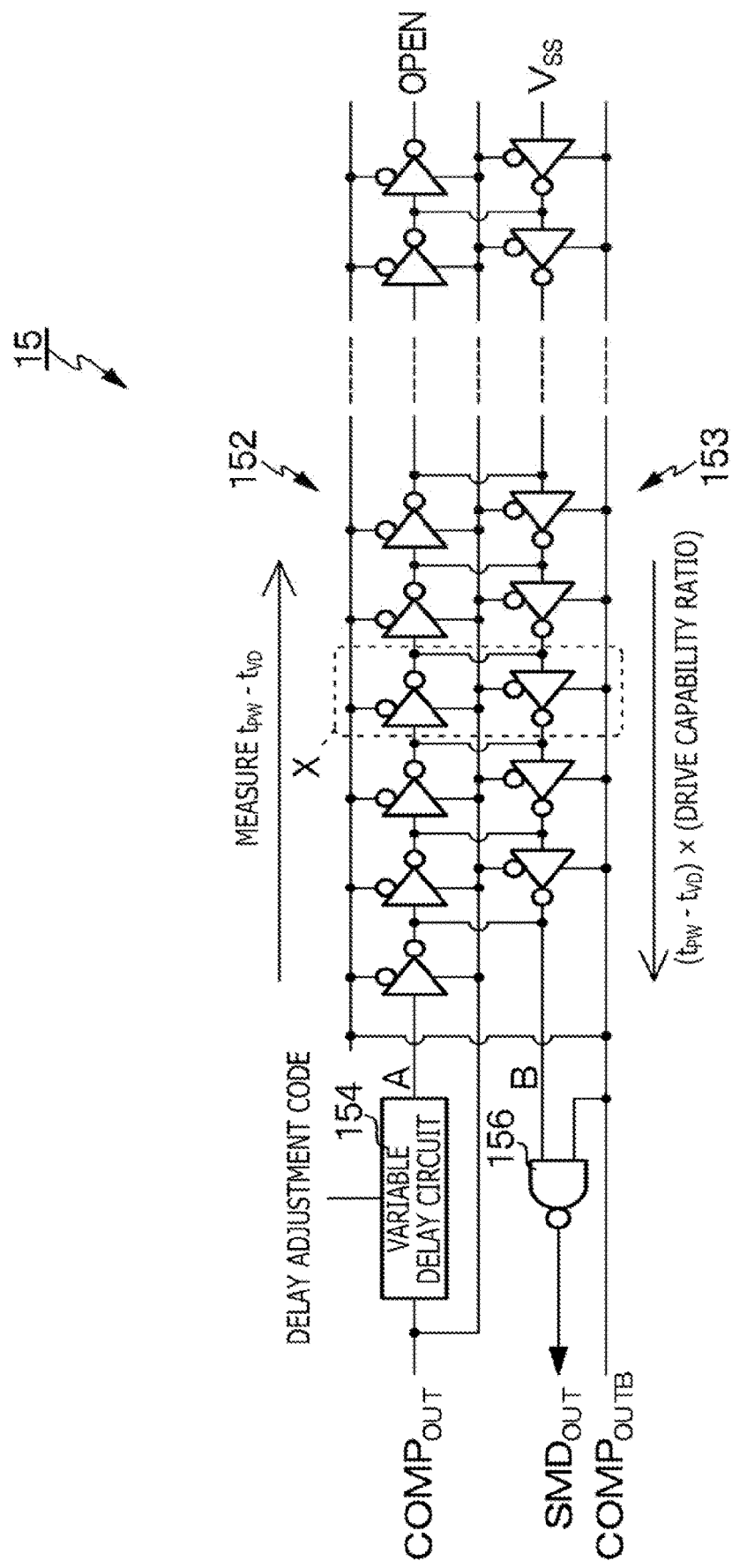
FIG. 31 is a circuit diagram illustrating a circuit example of a synchronous delay circuit according to Example 9.
Figure 32:
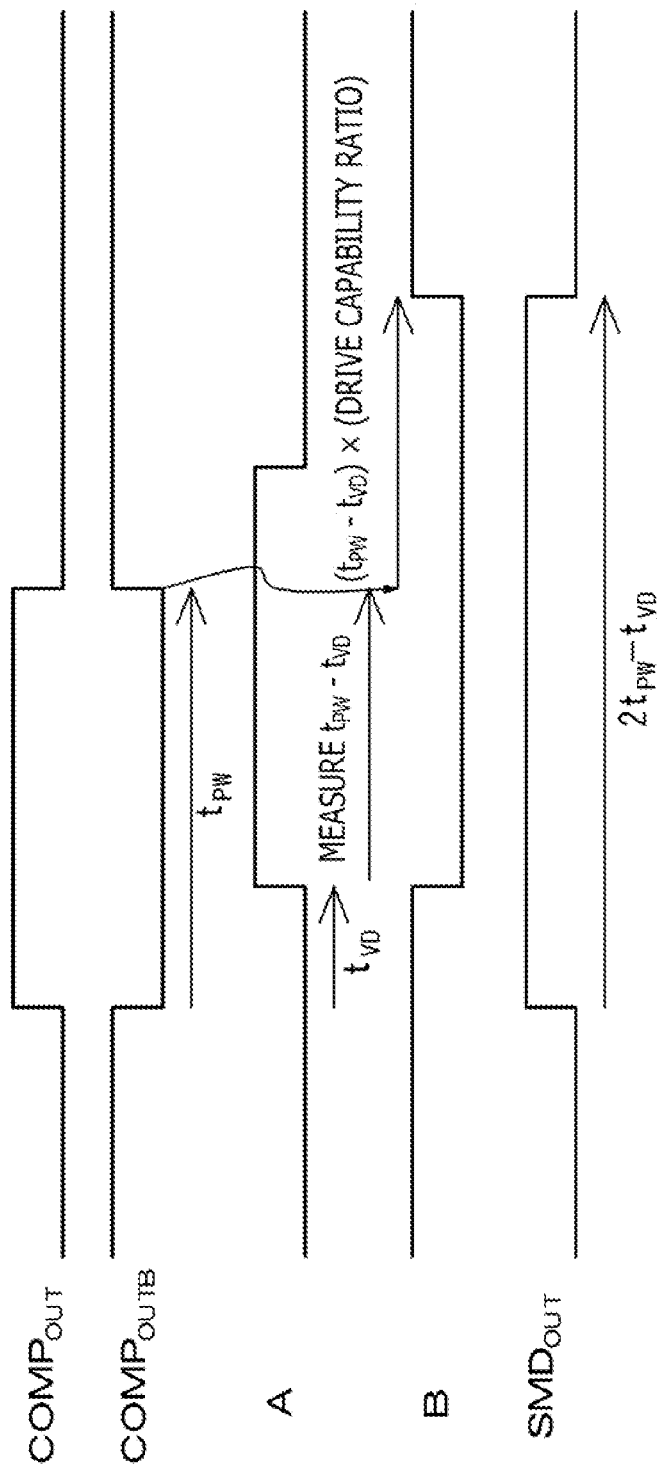
FIG. 32 is a timing chart illustrating a timing relationship among signals from sections in a circuit example of the synchronous delay circuit according to Example 9.

Example 9 is a modified example of the synchronous delay circuit 15, and is a circuit example in which the delay time by the synchronous delay circuit 15 can be adjusted in the forward direction and the backward direction. FIG. 31 illustrates a circuit example of the synchronous delay circuit 15 according to Example 9. Additionally, FIG. 32 illustrates signals from sections in the circuit example of the synchronous delay circuit according to Example 9. A timing chart in FIG. 32 illustrates a timing relationship among the output COMP$_{OUT}$ from the comparator 141, the inverted output COMP$_{OUTX}$ of the output COMP$_{OUT}$, the output A from the variable delay circuit 154, the output B from the delay unit circuit in the final stage of the backward delay circuit 153, and the output SMD$_{OUT}$ from the synchronous delay circuit 15.

In the clock distribution circuit 10 using the LC resonance circuit, in a case where LC resonance has a poor regeneration rate, the clock signal regenerated reaches the peak of resonance in a shorter time; the clock signal is regenerated, in the single phase configuration in Example 1 and the like, after the signal passes through the midpoint of the amplitude and in the differential configuration in Example 6 and the like, after the signal passes through the cross point of the differential signal. In Example 9, the time when the clock signal reaches the peak of resonance can be adjusted.

Figure 33:
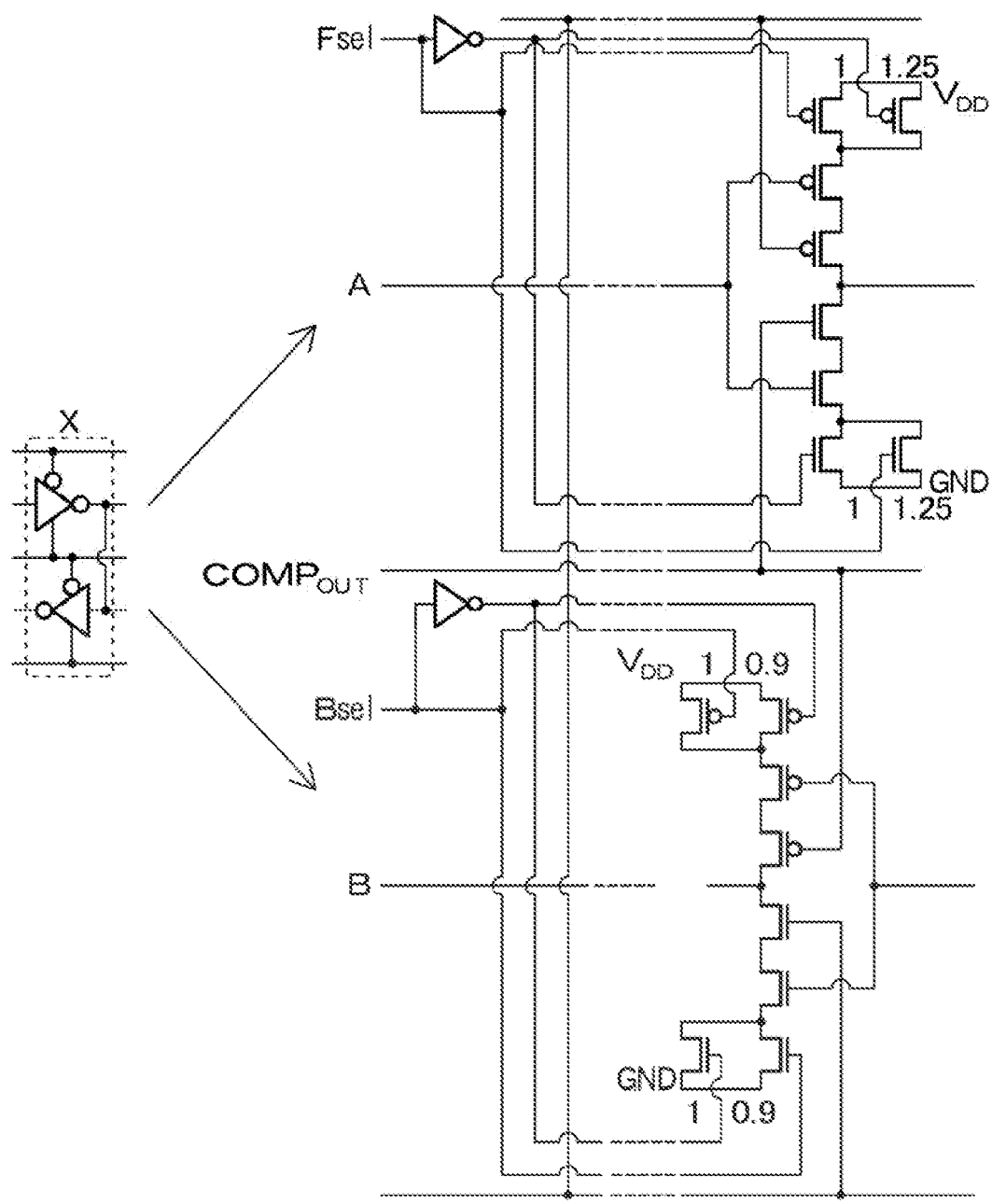
FIG. 33 is a circuit diagram illustrating a relationship between a configuration of a delay unit circuit in the synchronous delay circuit according to Example 9 and a delay ratio.

FIG. 33 illustrates a relationship between the configuration of the delay unit circuit in the synchronous delay circuit 15 according to Example 9 and a delay ratio. In the synchronous delay circuit 15 according to Example 9 illustrated in FIG. 33, the delay ratio can be set to, for example, a drive ratio of 1 and a drive ratio of 1.25 in the forward direction and to a drive ratio of 1 and a drive ratio of 0.9 in the backward direction. Combinations of the drive ratios in the forward direction and the backward direction enable four levels of 1, 0.9, 0.8, and 0.72 to be set for a delay time ratio as indicated in a table in FIG. 34. The table in FIG. 34 indicates a relationship among a forward logic (Fsel) and a backward logic (Bsel) corresponding to delay adjustment codes, the forward drive ratio, the backward drive ratio, and the delay time ratio.

The setting of the delay time ratio can be changed after manufacture of the clock distribution circuit 10 and can also be set for each chip even in a case where the regeneration rate deviates due to a change in variation in process or the like. Note that, also in the synchronous delay circuit 15 according to Example 9, the delay unit circuit (delay element) can be configured using the differential clocked inverter illustrated in FIG. 15A.

Example 10

Figure 35A:
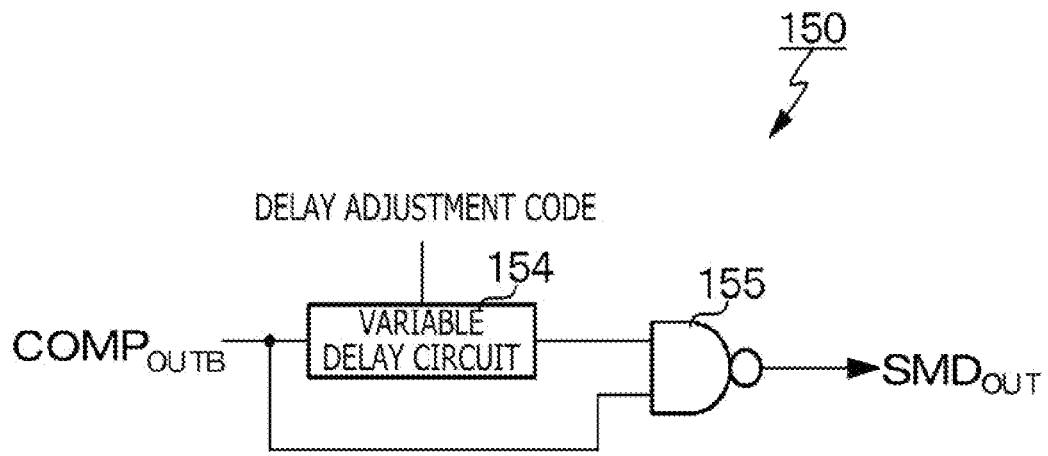
FIG. 35A is a circuit diagram illustrating a circuit example of an alternative circuit of a synchronous delay circuit according to Example 10.

Example 10 is an example of an alternative circuit of the synchronous delay circuit. FIG. 35A illustrates a circuit example of the alternative circuit of the synchronous delay circuit according to Example 10.

An alternative circuit 150 of the synchronous delay circuit in Example 10 has a simplified configuration including the variable delay circuit 154 and the two-input NAND circuit 155. The inverted output COMP$_{OUT}$ from the comparator 141 is used as a backward delay output via the variable delay circuit 154 and then as one input to the NAND circuit 155 and is also used directly as the other input to the NAND circuit 155. Then, the output from the NAND circuit 155 is derived as the output SMD$_{OUT}$ from the alternative circuit 150, which is fed to the control circuit 11.

Figure 35B:
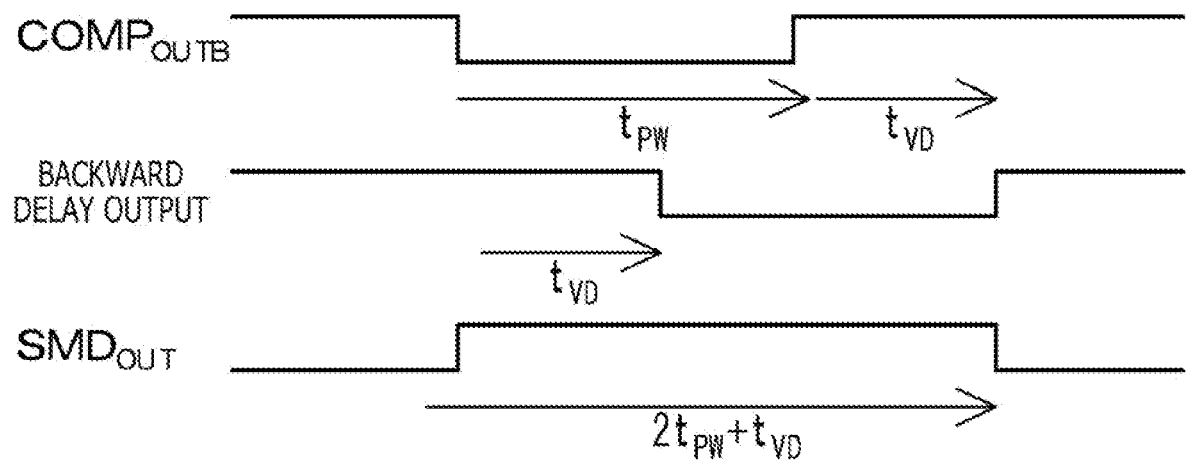
FIG. 35B is a timing chart illustrating a timing relationship among signals from sections in the circuit example of the alternative circuit.

FIG. 35B illustrates a timing relationship among signals from sections of the alternative circuit 150 of the synchronous delay circuit according to Example 10. A timing chart in FIG. 35B illustrates a timing relationship among the inverted output COMP$_{OUT}$B from the comparator 141, the backward delay output (output from the variable delay circuit 154), and the output SMD$_{OUT}$ from the alternative circuit 150.

The inverted output COMP$_{OUTB}$ from the comparator 141 is a result of measurement of a time corresponding to half the period of LC resonance. Thus, the alternative circuit 150 of the synchronous delay circuit according to Example 10 is configured to set a duration until recovery after regeneration. A regeneration time can be actually measured and set in the variable delay circuit 154 using a delay adjustment code, and an optimum value can also be set after manufacture of the clock distribution circuit 10.

Example 11

Figure 36:
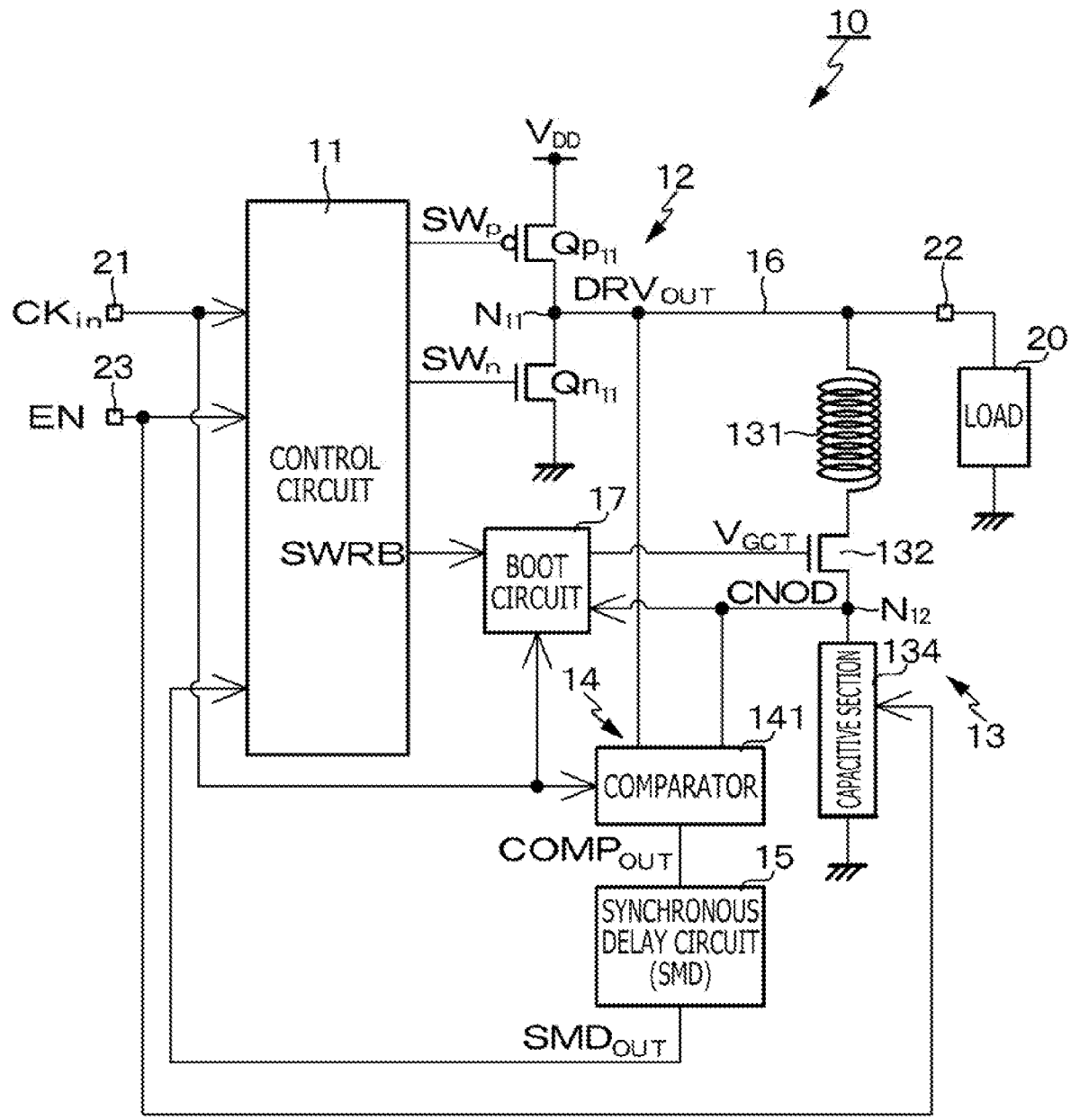
FIG. 36 is a circuit diagram illustrating a circuit configuration of a clock distribution circuit according to Example 11.

Example 11 is a modified example of Example 3, and is an example in which a control pulse for an N channel MOS transistor is controlled. FIG. 36 illustrates a circuit configuration of a clock distribution circuit according to Example 11.

The clock distribution circuit 10 according to Example 11 corresponds to the clock distribution circuit 10 according to Example 3 (see FIG. 10) including a boot circuit 17 adjusting the voltage value of a control pulse SWRB for the N channel MOS transistor 132 for pulse control (in other words, booting the control pulse SWR). Here, the control pulse SWRB is an inverted signal of the control pulse SWR in Example 3.

To provide an ON current for the N channel MOS transistor 132, the boot circuit 17 utilizes (½)V$_{DD}$ corresponding to the potential CNOD of the node N$_{12}$ generated by the capacitive circuit section 134, to boot the control pulse SWRB and apply the booted control pulse SWRB to the gate electrode of the MOS transistor 132 as a control pulse V$_{GCT}$. The boot circuit 17 adjusts the voltage value of the control pulse V$_{GCT}$, for example, from 2V$_{DD}$ to 1.5V$_{DD}$.

(Boot Circuit)

Figure 37:
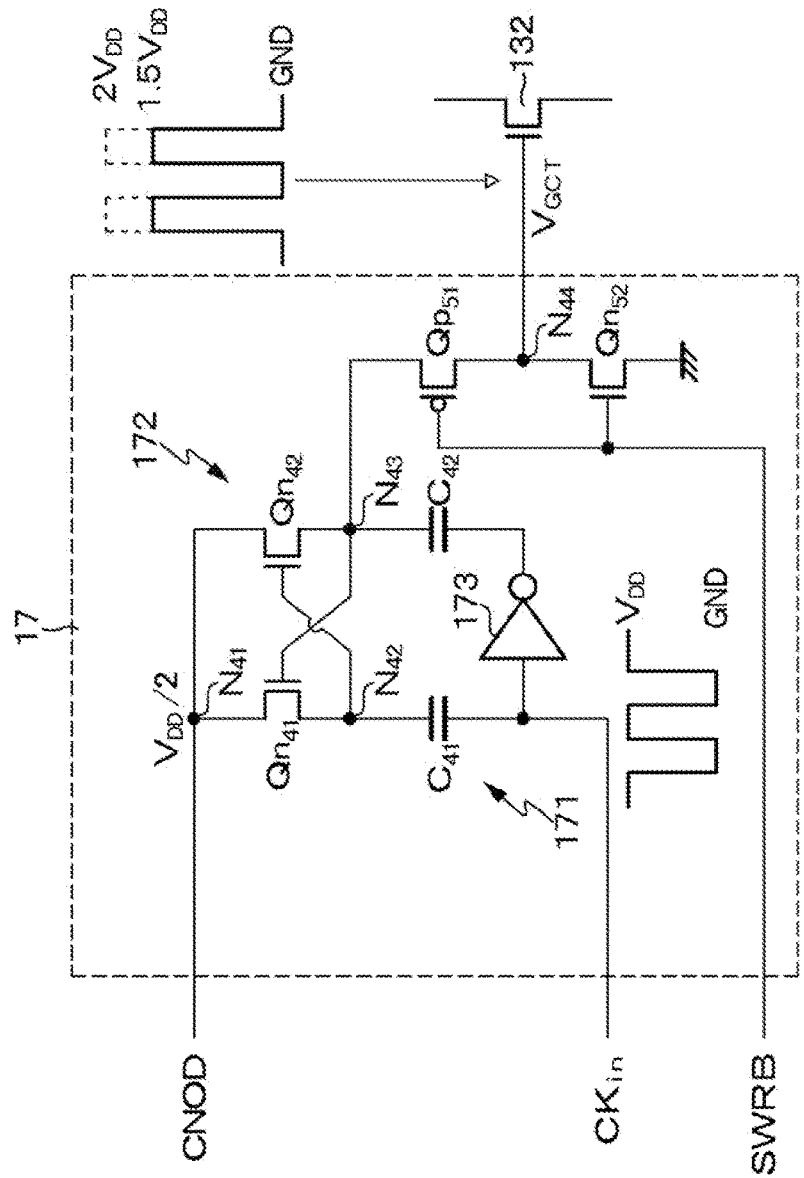
FIG. 37 is a circuit diagram illustrating a circuit example of a boot circuit in the clock distribution circuit according to Example 11.

FIG. 37 illustrates a circuit example of the boot circuit 17 in the clock distribution circuit 10 according to Example 11. The boot circuit 17 according to the present circuit example has a circuit configuration in which (½)V$_{DD}$ corresponding to the potential CNOD of the node N$_{12}$ generated by the capacitive circuit section 134 is utilized to avoid application of an excessive boot voltage.

Specifically, a node N41 provided with (½)V$_{DD}$ corresponding to the potential CNOD of the node N$_{12}$ in the clock distribution circuit 10 connects to a series connection circuit 171 of an N channel MOS transistor Qn$_{41}$ and a capacitive element C$_{41}$ and to a series connection circuit 172 of an N channel MOS transistor QN$_{42}$ and a capacitive element C$_{42}$.

A gate electrode of the MOS transistor $Qn_{41}$ on the series connection circuit 172 side is connected to a common connection node $N_{42}$ common to the MOS transistor $Qn_{41}$ and one end of the capacitive element $C_{41}$. Additionally, a gate electrode of the MOS transistor $QN_{42}$ on a series connection circuit 173 side is connected to a common connection node $N_{43}$ common to the MOS transistor $QN_{42}$ and one end of the capacitive element $C_{42}$.

The inverter circuit 173 is connected between the other end of the capacitive element $C_{41}$ and the other end of the capacitive element $C_{42}$. A clock signal $CK_{in}$ externally input and having an amplitude of GND-$V_{DD}$ is applied to an input end of the inverter circuit 173.

A P channel MOS transistor $Qp_{51}$ and an N channel MOS transistor $Qn_{51}$ are connected in series between the common connection node $N_{43}$ on the series connection circuit 172 side and a fixed potential on a low potential side, for example, the ground potential GND. The control pulse $V_{GCT}$ is derived from the common connection node $N_{44}$ common to the MOS transistor $Qp_{51}$ and the MOS transistor $Qn_{51}$.

This action of the boot circuit 17 adjusts the voltage value of the control pulse $V_{GCT}$, for example, from $2V_{DD}$ to $1.5V_{DD}$ to avoid application of an excessive boot voltage. The control pulse $V_{GCT}$ with the voltage value adjusted is applied to the gate electrode of the N channel MOS transistor 132 for pulse control.

Note that, in the boot circuit 17 configured described above, $(½)V_{DD}$ corresponding to the potential CNOD of the node $N_{12}$ generated by the capacitive circuit section 134 is utilized to avoid application of an excessive boot voltage but that the boot circuit 17 can also be applied to Example 4 in which the potential CNOD of the node $N_{12}$ is $(¼)V_{DD}$.

Example 12

Configuration examples with a small-amplitude output such as Example 2, Example 4, and Example 7 assume that $(½)V_{DD}$ is externally obtained but externally obtaining $(½)V_{DD}$ may be prevented. Example 12 is an example in which a small-amplitude power supply generation circuit internally generating $(½)V_{DD}$ is built in the apparatus.

Here, for a small-amplitude power supply generation circuit 18 with $(½)V_{DD}$, three circuit examples will be illustrated. A first circuit example, a second circuit example, and a third circuit example of the clock distribution circuit 10 are selectively used depending on a chip area and a chip configuration.

First Circuit Example

Figure 38A:
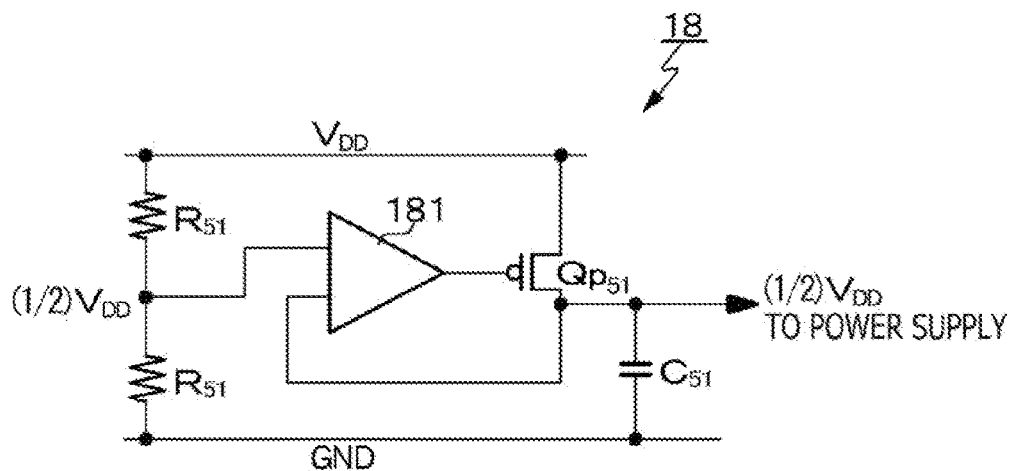
FIG. 38A is a circuit diagram illustrating a first circuit example of a small-amplitude power supply generation circuit in the clock distribution circuit according to Example 12.

FIG. 38A illustrates a circuit diagram of a first circuit example of the small-amplitude power supply generation circuit 18 in the clock distribution circuit 10 in Example 12.

The small-amplitude power supply generation circuit 18 according to the first circuit example uses a linear regulator including a differential amplifier 181, two resistive elements $R_{51}$, $R_{51}$ with the same resistance value, a P channel MOS transistor $Qp_{51}$, and a capacitive element $C_{51}$. The linear regulator is a linear voltage regulator feeding a stable voltage (that is, $(½)V_{DD}$).

Second Circuit Example

Figure 38B:
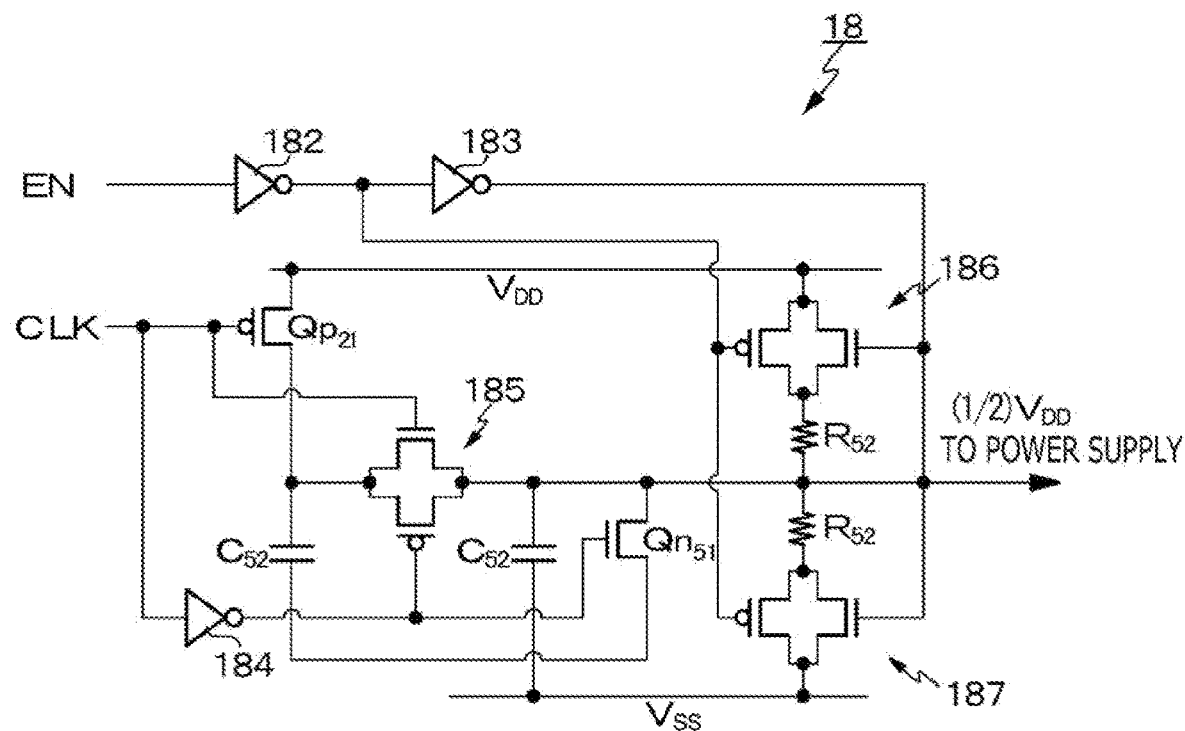
FIG. 38B is a circuit diagram illustrating second circuit example of a small-amplitude power supply generation circuit.

FIG. 38B illustrates a circuit diagram of a second circuit example of the small-amplitude power supply generation circuit 18 in the clock distribution circuit 10 according to Example 12.

The small-amplitude power supply generation circuit 18 according to the second circuit example includes a switched capacitor type DC-DC converter. Specifically, the small-amplitude power supply generation circuit 18 includes three inverter circuits 182, 183, and 184, a P channel MOS transistor $Qp_{52}$, two capacitive elements $C_{52}$, $C_{52}$ with the same capacitance value, three transfer gates 185, 186, and 187, an N channel MOS transistor $Qn_{51}$, and two resistive elements $R_{51}$, $R_{52}$ with the same resistance value.

The operating principle of the switched capacitor circuit is as described with reference to FIG. 12. A drive clock CLK can use the clock signal $C_{in}$ externally input. Here, a case of application to the clock distribution circuit 10 with a single phase configuration has been illustrated. However, in a case of application to the clock distribution circuit 10 with a differential configuration, it is sufficient that two small-amplitude power supply generation circuits 18 according to the second circuit example are arranged and alternately driven using a differential drive clock.

Third Circuit Example

Figure 39A:
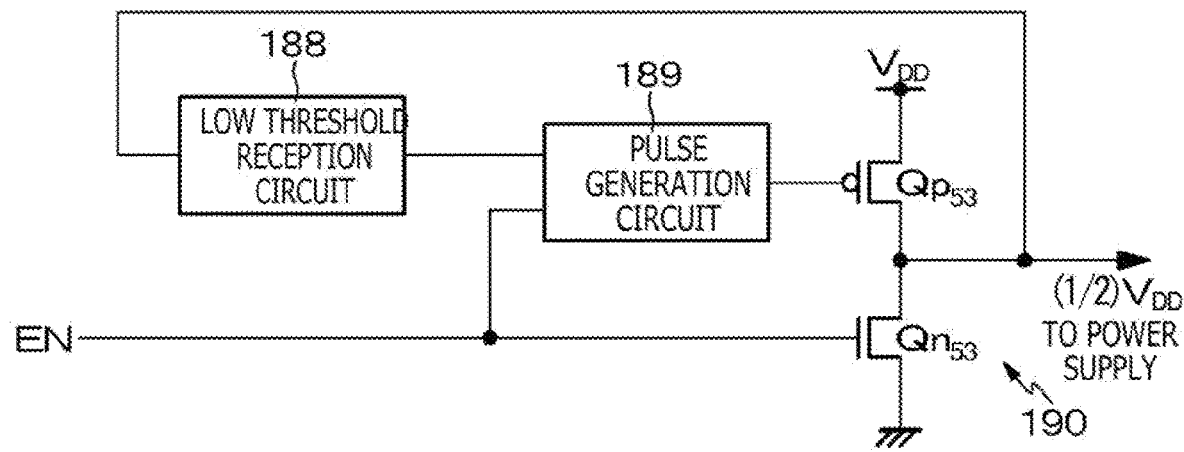
FIG. 39A is a circuit diagram illustrating a third circuit example of a small-amplitude power supply generation circuit in the clock distribution circuit according to Example 12.

FIG. 39A illustrates a circuit diagram of a third circuit example of the small-amplitude power supply generation circuit 18 in the clock distribution circuit 10 according to Example 12.

The small-amplitude power supply generation circuit 18 according to the third circuit example includes a low-threshold reception circuit 187, a pulse generation circuit 188, and an output circuit 190. The output circuit 190 includes a P channel MOS transistor $Qp_{53}$ and an N channel MOS transistor $Qn_{53}$ connected in series between the node with the power supply voltage $V_{DD}$ and the node with the ground potential GND.

Figure 39B:
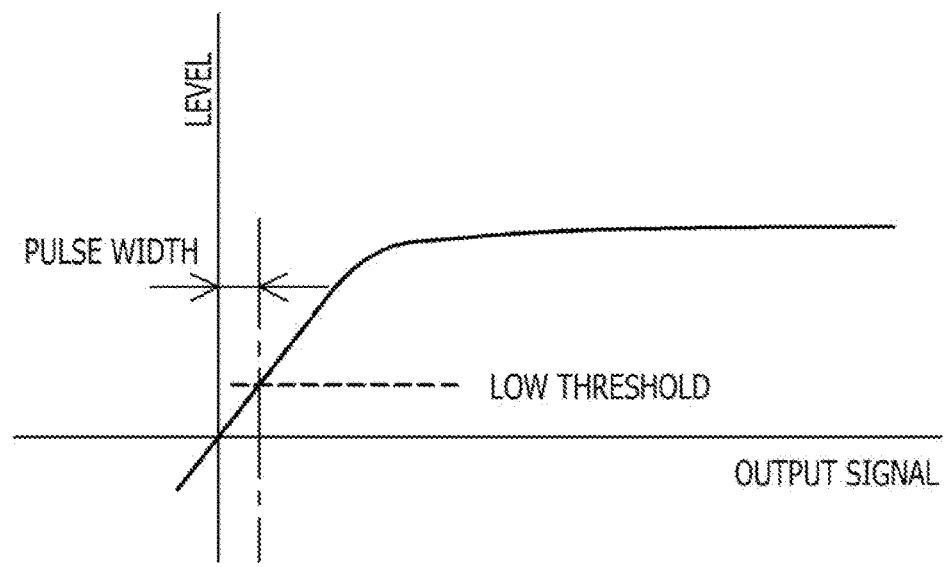
FIG. 39B is a characteristic diagram illustrating a relationship among an output signal, a low threshold, and a pulse width.

In the small-amplitude power supply generation circuit 18 according to the third circuit example configured as described above, the low-threshold reception circuit 187 receives the level of the output signal from the output circuit 190, and once a predetermined low threshold is reached, pulse generation by the pulse generation circuit 188 is stopped. FIG. 39B indicates a relationship among an output signal, a low threshold, and a pulse width.

Example 13

Figure 40:
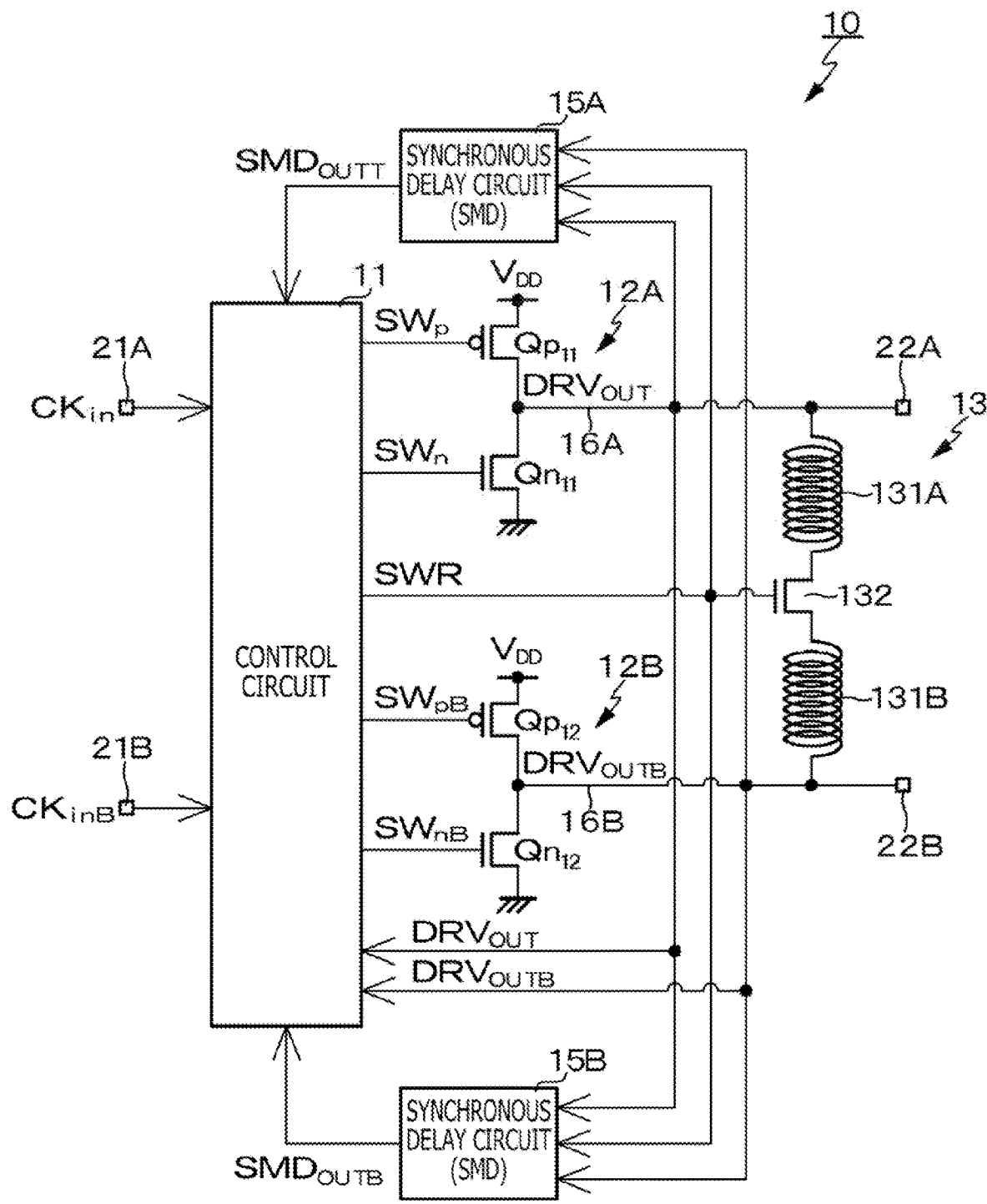
FIG. 40 is a circuit diagram illustrating a circuit configuration of a clock distribution circuit according to Example 13.

Example 13 is a modified example of Example 6 and is an example in which the delay provided by the synchronous delay circuit (SMD) 15 is minimized. FIG. 40 illustrates a circuit configuration of a clock distribution circuit according to Example 13.

The clock distribution circuit 10 according to Example 13 has a differential configuration and includes two synchronous delay circuits 15A and 15B corresponding to the two drive circuits 12A and 12B, and the other components are basically the same as the corresponding components in Example 6 (see FIG. 22).

In the clock distribution circuit 10 according to Example 13, the output $DRV_{OUT}$ from the drive circuit 12A and the output $DRV_{OUTB}$ from the drive circuit 12B are input to the control circuit 11 and also input to the two synchronous delay circuits 15A and 15B. The control pulse SWR from the N channel MOS transistor 132 for pulse control is further input to the two synchronous delay circuits 15A and 15B. The synchronous delay circuit 15A feeds an output $SMD_{OUTT}$ to the control circuit 11, and the synchronous delay circuit 15B feeds an output $SMD_{OUTB}$ to the control circuit 11. The output $SMD_{OUTT}$ and the output $SMD_{OUTB}$ are signals obtained by detecting the time when the intermediate level of the resonance amplitude is reached and reproducing the same time as the detected time.

The control circuit 11 generates the clock pulses $SW_p$ and $SW_n$, the clock pulses $SW_{pB}$ and $SW_{nB}$, and the control pulse SWR On the basis of the clock signals $C_{in}$ and $C_{inB}$, outputs $DRV_{OUT}$ and $DRV_{OUTB}$ from the drive circuits 12A and 12B, and the outputs $SMD_{OUTT}$ and $SMD_{OUTB}$ from the synchronous delay circuits 15A and 15B. Note that the control circuit 11 in the present example has a function corresponding to the comparator 141 in Example 6.

Specific circuit examples of the two synchronous delay circuits 15A and 15B and the control circuit 11 in the clock distribution circuit 10 according to Example 13.
(Synchronous Delay Circuit)

Figure 41:
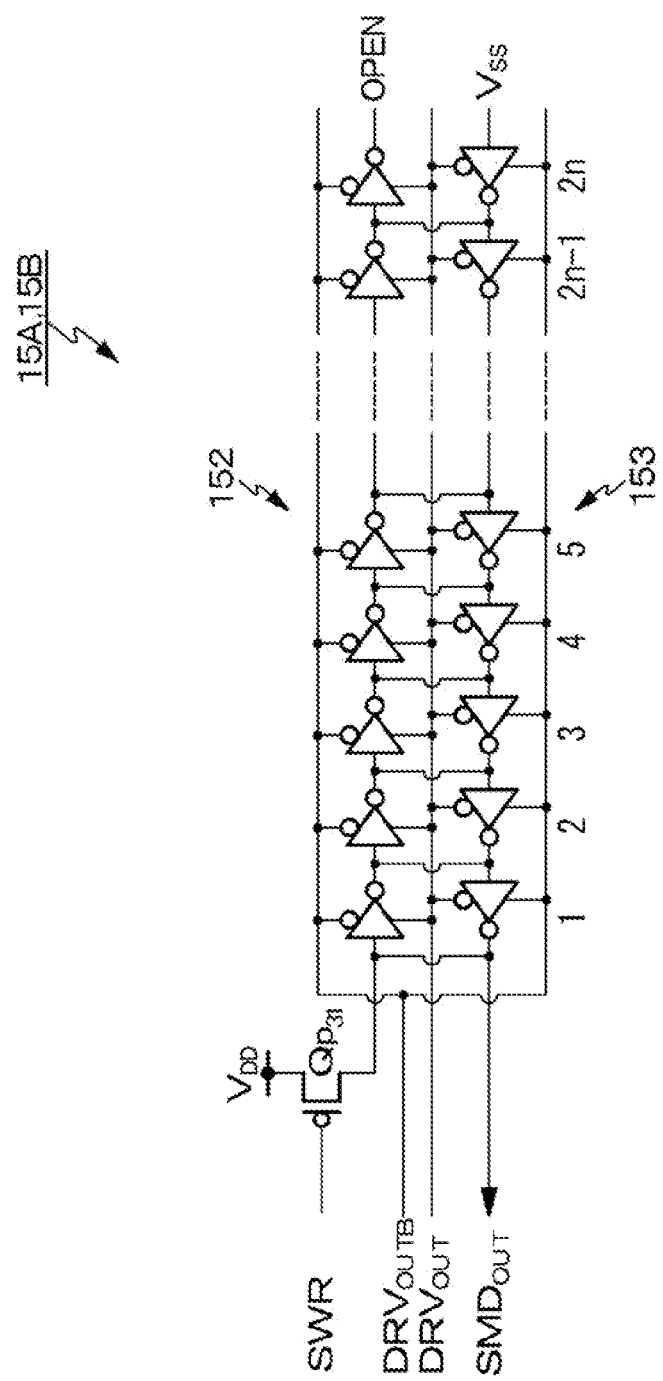
FIG. 41 is a circuit diagram illustrating a circuit example of a synchronous delay circuit in the clock distribution circuit according to Example 13.

FIG. 41 illustrates a circuit example of the two synchronous delay circuits 15A and 15B in the clock distribution circuit 10 according to Example 13. The synchronous delay circuits 15A and 15B according to the present circuit example have a configuration basically similar to the configuration of the synchronous delay circuit 15 in the clock distribution circuit 10 according to Example 3. However, the synchronous delay circuits 15A and 15B according to the present circuit example differ from the synchronous delay circuit 15 according to Example 3 in the following points. Specifically, the P channel MOS transistor $Qp_{31}$ uses, as a gate input, the control pulse SWR for driving the N channel MOS transistor 132 for pulse control. Furthermore, the delay unit circuits in the forward delay circuit 152 and the backward delay circuit 153 use the outputs $DRV_{OUT}$ and $DRV_{OUTB}$ from the drive circuits 12A AND 12B as clock inputs. This configuration can derive the outputs $SMD_{OUTT}$ and $SMD_{OUT}$ while minimizing the delay.

Note that, also in the two synchronous delay circuits 15A and 15B, the delay unit circuits (delay elements) may include the differential clocked inverter illustrated in FIG. 15A. In this case, instead of the outputs $COMP_{OUT}$ and $COMP_{OUTX}$ from the comparator 141, the outputs $DRV_{OUT}$ and $DRV_{OUTB}$ from the drive circuits 12A and 12B are used as clock inputs. Even in a case where the differential clock outputs $DRV_{OUT}$ and $DRV_{OUTB}$ are output with small amplitudes, timings can be accurately detected.
(Control Circuit)

Figure 42:
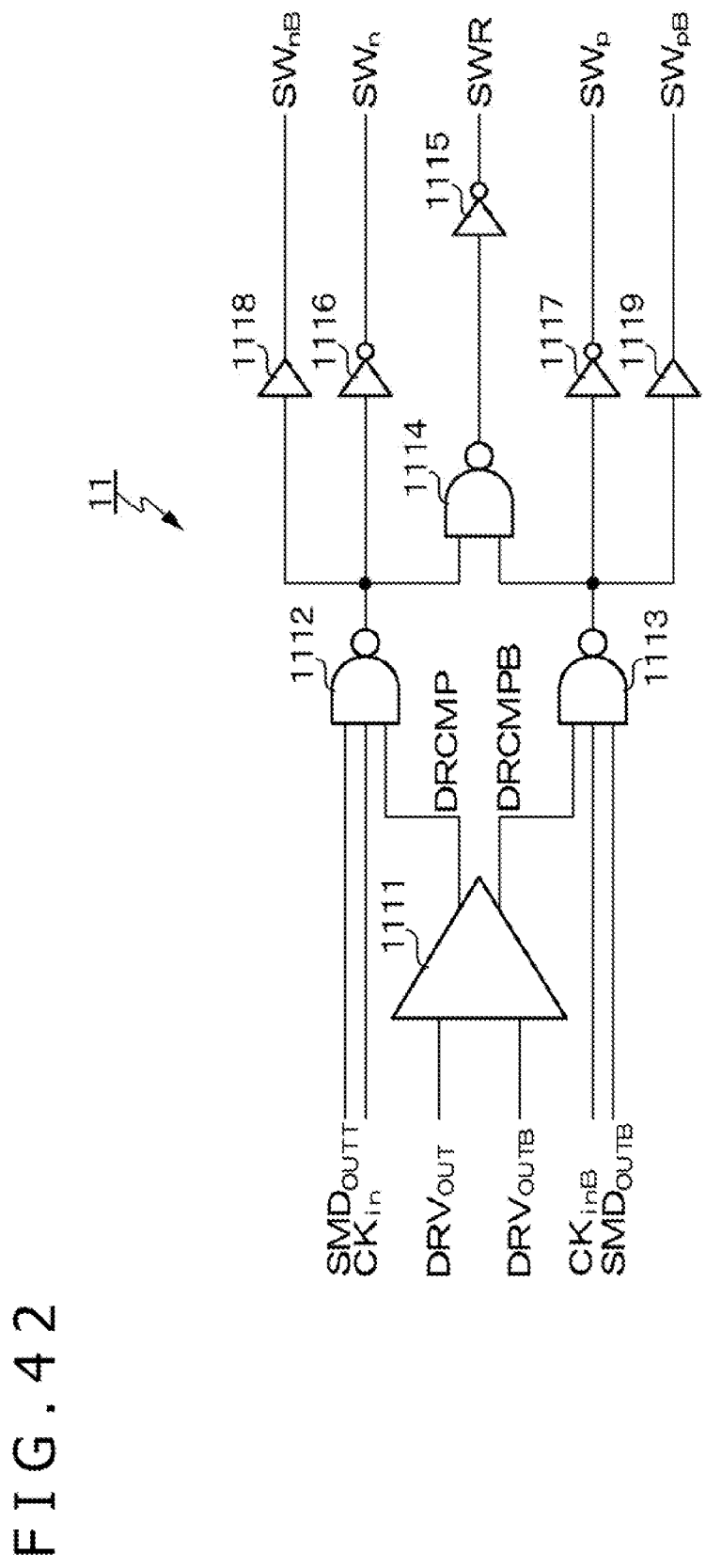
FIG. 42 is a circuit diagram illustrating a circuit example of a control circuit in the clock distribution circuit according to Example 13.

FIG. 42 illustrates a circuit example of the control circuit 11 in the clock distribution circuit 10 according to Example 13. The control circuit 11 according to the present circuit example includes a differential comparator 1111, two three-input NAND circuits 1112 and 1113, one two-input NAND circuit 1114, three inverter circuits 1115, 1116, and 1117, and two buffer circuits 1118 and 1119.

The differential comparator 1111 uses, as differential inputs, the output $DRV_{OUT}$ from the drive circuit 12A corresponding to the potential of the signal line 16A and the output $DRV_{OUTB}$ from the drive circuit 12B corresponding to the potential of the signal line 16B.

The differential outputs DRCMP and DRCMPB from The differential comparator 1111 are used as first inputs to the NAND circuits 1112 and 1113. Note that it is sufficient that the differential comparator 1111 can detect the inversion level of a signal and that an inverter circuit, a NAND circuit, or the like can be used instead of the differential comparator 1111.

The NAND circuits 1112 and 1113 use, as second inputs, the clock signals $C_{in}$ and $C_{inB}$ externally input, and use the outputs $SMD_{OUTT}$ and $SMD_{OUTB}$ from the synchronous delay circuit 15A and 15B as third inputs. The outputs from the NAND circuits 1112 and 1113 are each derived through the NAND circuit 1114 and the inverter circuit 1115 as the control pulse SWR for driving the N channel MOS transistor 132 for pulse control.

Additionally, an output from the NAND circuit 1112 is derived through the inverter circuit 1116 as the clock pulse $SW_n$ for driving the N channel MOS transistor $Qn_{11}$ of the drive circuit 12A. The output from the NAND circuit 1112 is further derived through the buffer circuit 1118 as the clock pulse $SW_{nB}$ for driving the N channel MOS transistor $Qn_{12}$ of the drive circuit 12B.

An output from the NAND circuit 1113 is derived through the inverter circuit 1117 as the clock pulse $SW_p$ for driving the N channel MOS transistor $Qp_{11}$ of the drive circuit 12A. The output from the NAND circuit 1113 is further derived through the buffer circuit 1119 as the clock pulse $SW_{pB}$ for driving the P channel MOS transistor $Qp_{12}$ of the drive circuit 12B.

Figure 43:
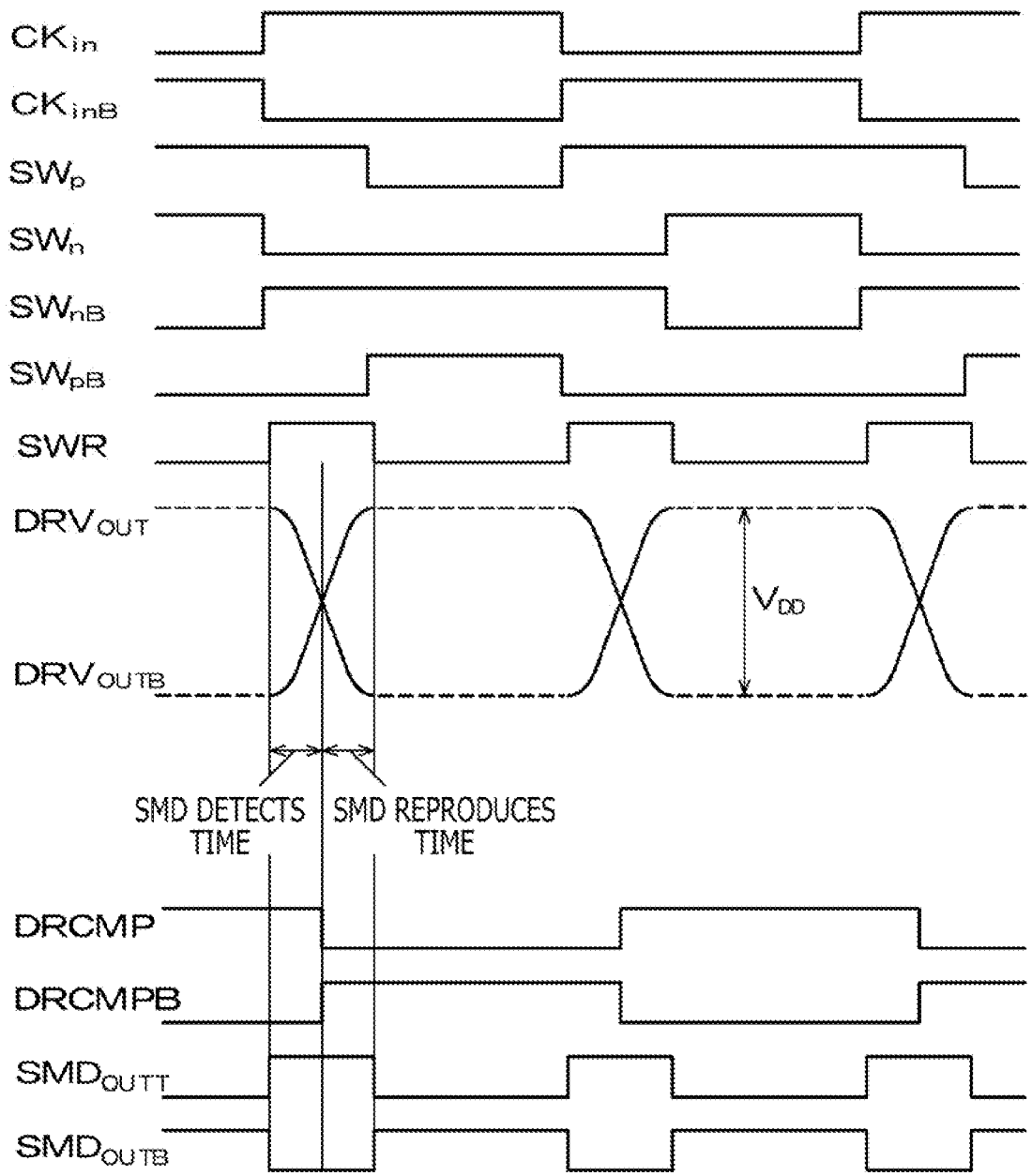
FIG. 43 is a timing chart illustrating a timing relationship among signals from sections in the circuit example of the synchronous delay circuit according to Example 13.

FIG. 43 illustrates a timing relationship among signals from sections of the clock distribution circuit 10 according to Example 13 with the two synchronous delay circuits 15A and 15B and the control circuit 11. A timing chart in FIG. 43 illustrates a timing relationship among the clock signals $C_{in}$ and $C_{inB}$ the clock pulses $SW_p$ and $SW_n$, the control pulse SWR, the outputs $DRV_{OUT}$ and $DRV_{OUTB}$ from the two drive circuits 12A and 12B, the differential outputs DRCMP and DRCMPB from the differential comparator 1111, and the outputs $SMD_{OUTT}$ and $SMD_{OUTB}$ from the synchronous delay circuits 15A and 15B. The output $DRV_{OUT}$ from the drive circuit 12A and The output $DRV_{OUTB}$ from the drive circuit 12B have an amplitude of $(½)V_{DD}$.

Example 14

Figure 44:
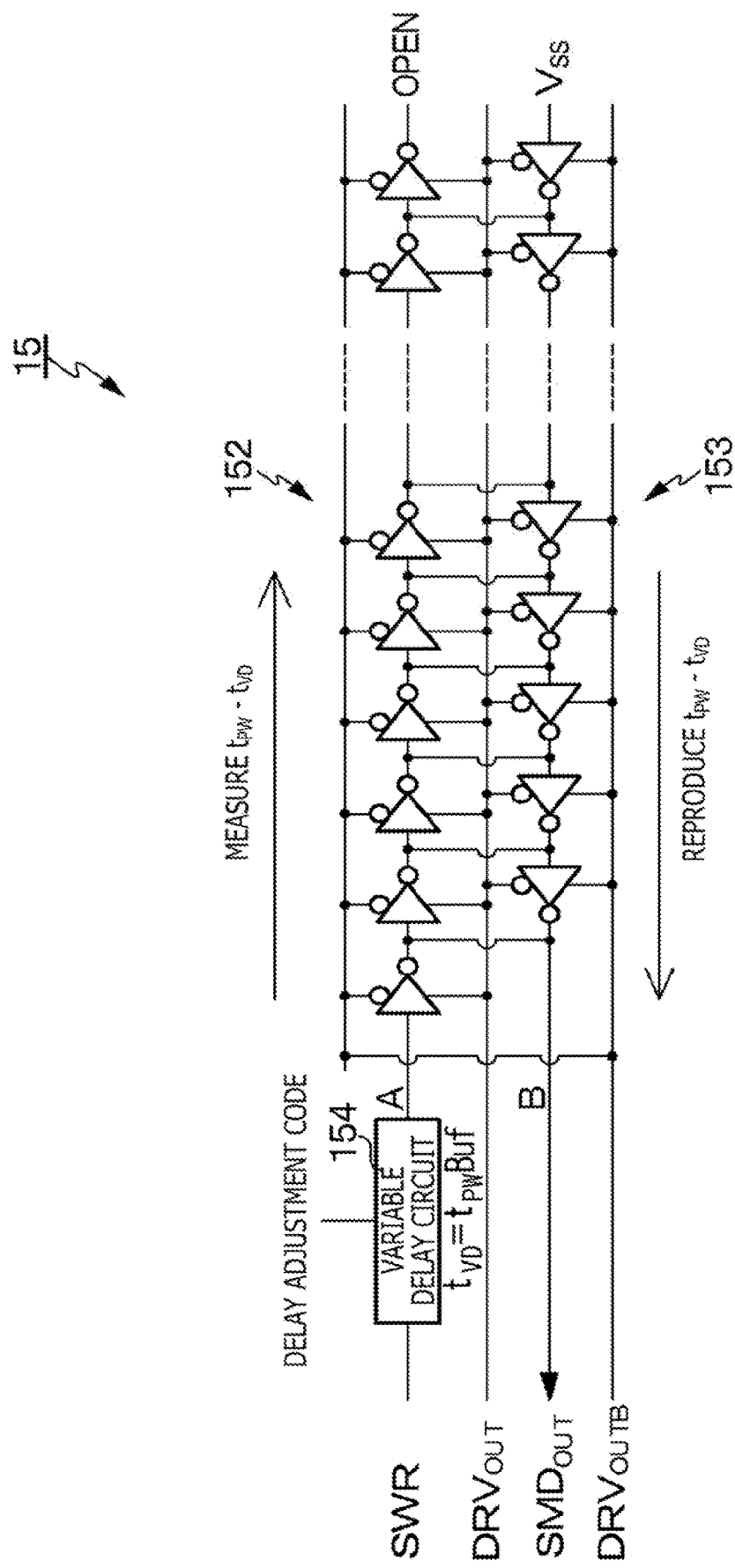
FIG. 44 is a circuit diagram illustrating a circuit example of a synchronous delay circuit in a clock distribution circuit according to Example 14.

Example 14 is a modified example of Example 13 and is an example in which the synchronous delay circuit 15 is directly driven using a clock output. FIG. 44 illustrates a circuit example of the synchronous delay circuit 15 in the clock distribution circuit 10 according to Example 14.

In addition to including a function to adjust the pulse width of the output $SMD_{OUT}$ from the variable delay circuit 154, the synchronous delay circuit 15 according to the present circuit example can adjust the delay time in the forward direction of the synchronous delay circuit 15 and the delay time in the backward direction. Thus, the Q-value of LC resonance indicating degradation or the like can be adjusted after manufacture of the clock distribution circuit 10.

Figure 45:
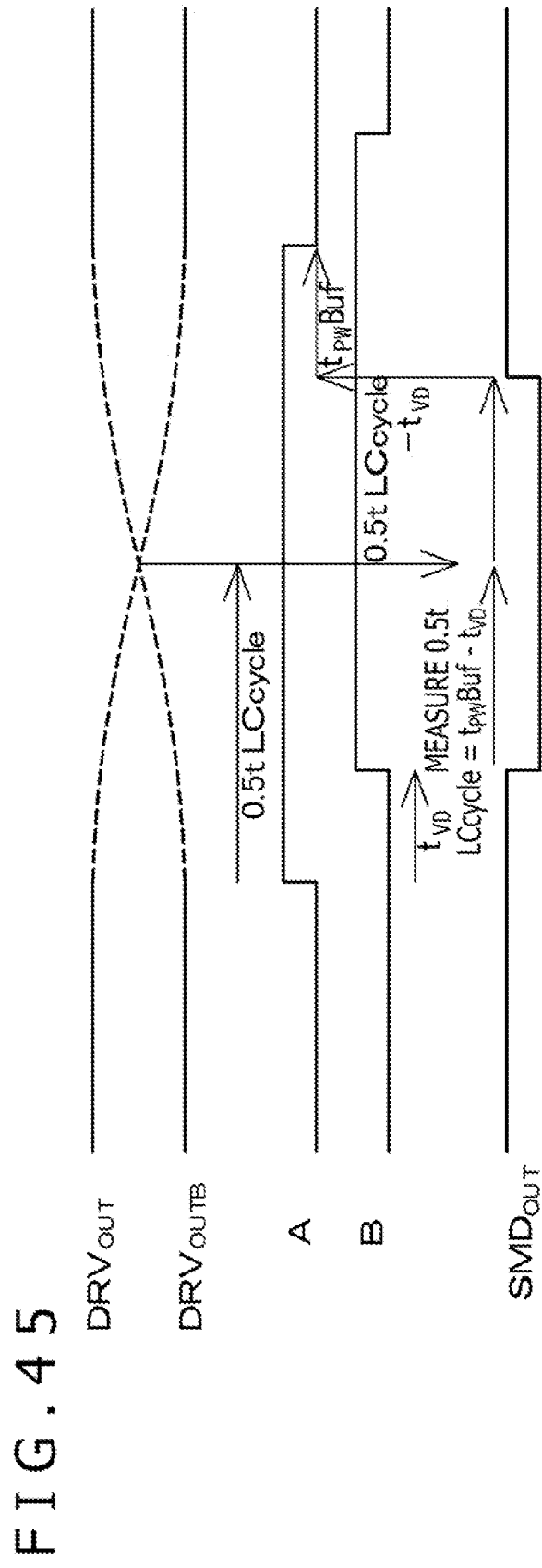
FIG. 45 is a timing chart illustrating a timing relationship among signals from sections in the circuit example of the synchronous delay circuit in the clock distribution circuit according to Example 14.

FIG. 45 illustrates a timing relationship among signals from sections of the synchronous delay circuit 15 in the present circuit example. A timing chart in FIG. 43 indicates a timing relationship among the outputs $DRV_{OUT}$ and $DRV_{OUTB}$ from the two drive circuits 12A and 12B, the potentials of the nodes A and B, and the output $SMD_{OUT}$ from the synchronous delay circuit 15 (15A and 15B).

Example 15

Figure 46:
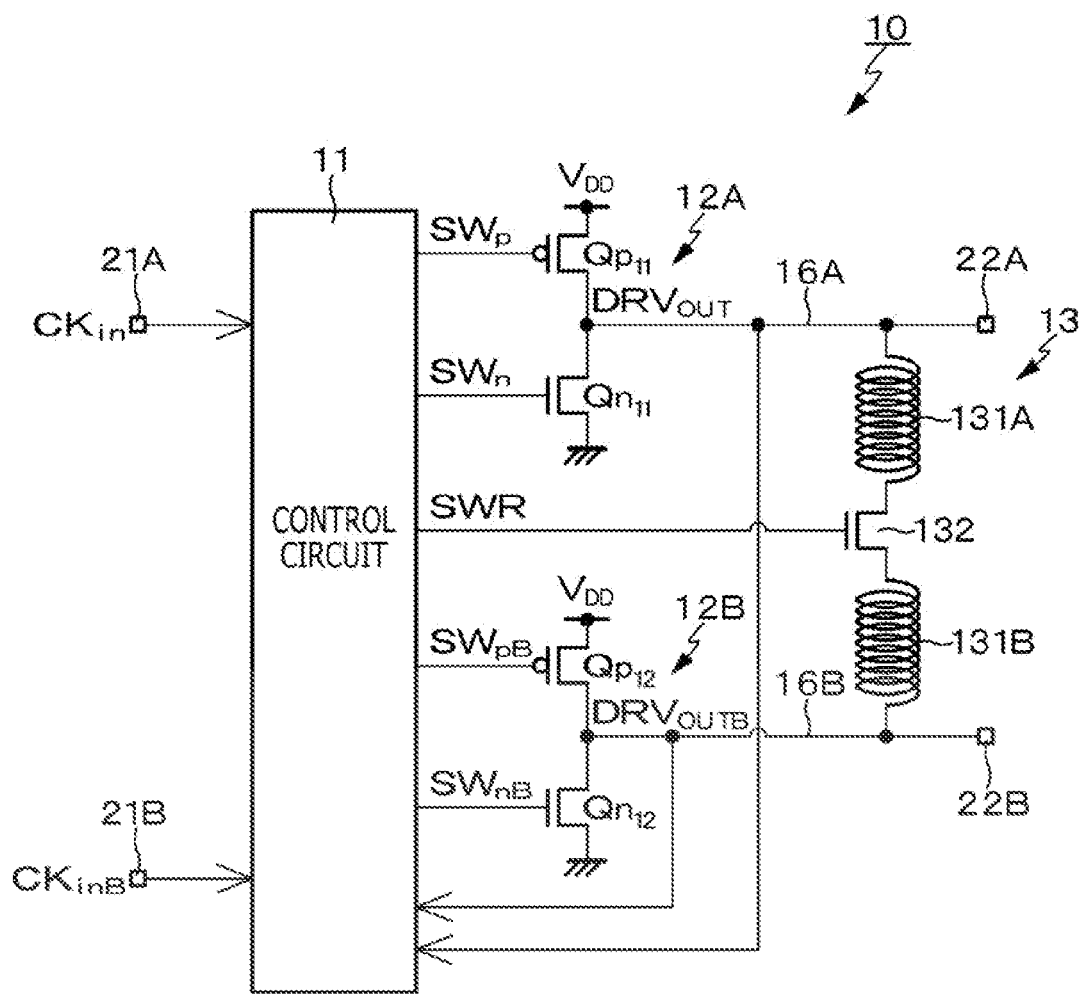
FIG. 46 is a circuit diagram illustrating a circuit configuration of a clock distribution circuit according to Example 15.

Example 15 is a modified example of Example 6 and is an example in which a differential configuration with intermittent resonance is provided and in which no synchronous delay circuit is used, with circuit delay used to generate a pulse width for a control pulse for the N channel MOS transistor for pulse control. FIG. 46 illustrates a circuit configuration of the clock distribution circuit 10 according to Example 15.

The clock distribution circuit 10 according to Example 15 corresponds to Example 6 (see FIG. 22) from which the synchronous delay circuit (SMD) 15 omitted and in which the control circuit 11 is provided with a function corresponding to the comparator 141, with circuit delay used to generate a pulse width for the control pulse SWR. Note that, also in this example, with the inductor elements 131A and 131B not provided, the drain electrode of the MOS transistor 132 may be connected directly to the signal line 16A and that the source electrode of the MOS transistor 132 may be connected directly to the signal line 16B.

The control circuit 11 generates the clock pulses $SW_p$ and $SW_n$, the clock pulses $SW_{pB}$ and $SW_{nB}$, and the control pulse SWR on the basis of the clock signal $C_n$ and $C_{inB}$ and the outputs $DRV_{OUT}$ and $DRV_{OUTB}$ from the drive circuit 12A and 12B.

A specific circuit example of the control circuit 11 in the clock distribution circuit 10 according to Example 15 will be described below.

(Control Circuit)

Figure 47:
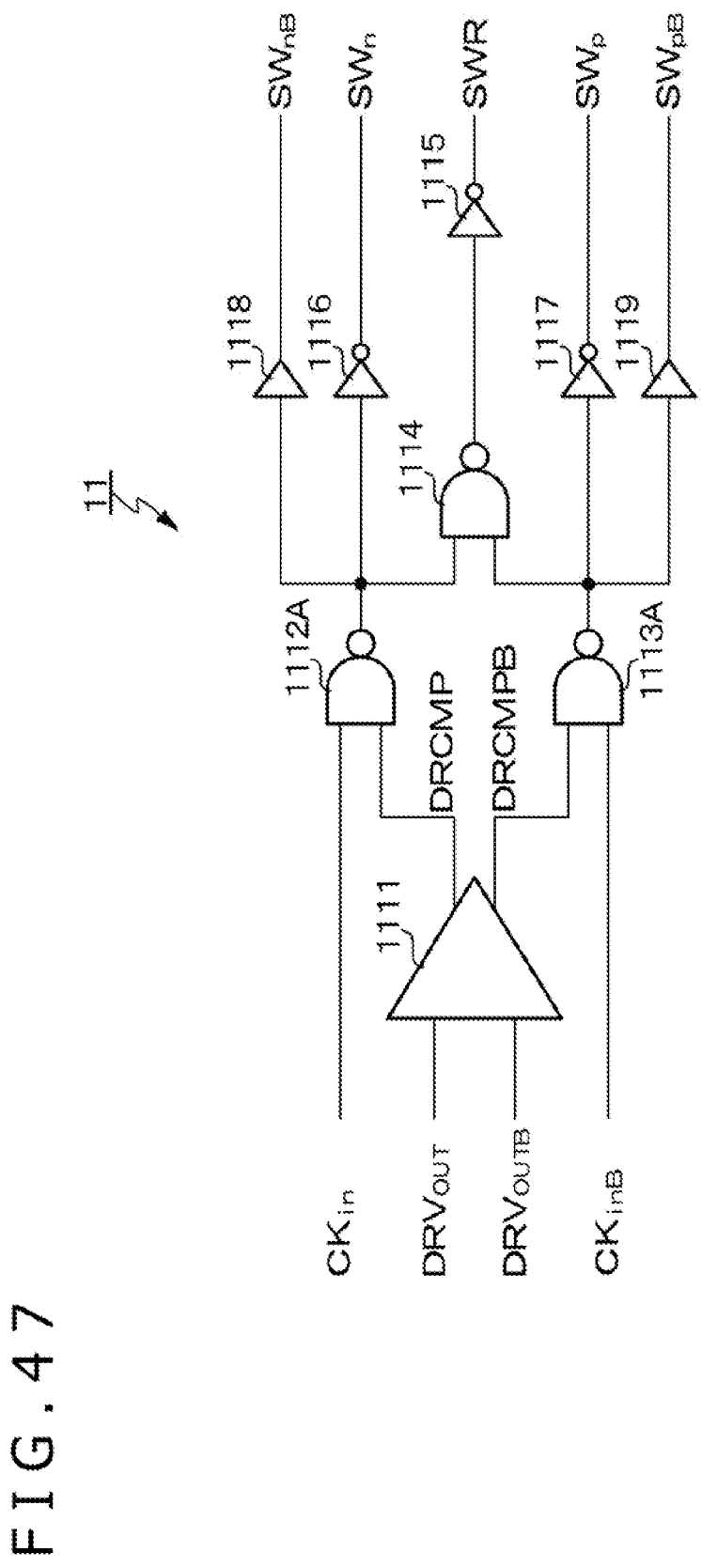
FIG. 47 is a circuit diagram illustrating a circuit example of a control circuit in the clock distribution circuit according to Example 15.

FIG. 47 illustrates a circuit example of the control circuit 11 in the clock distribution circuit 10 according to Example 15. The control circuit 11 according to the present circuit example includes the differential comparator 1111, three two-input NAND circuit 1112A, 1113A, and 1114, three inverter circuits 1115, 1116, and 1117, and two buffer circuits 1118 and 1119.

The differential comparator 1111 use, as differential inputs, the output $DRV_{OUT}$ from the drive circuit 12A corresponding to the potential of the signal line 16A and the output $DRV_{OUTB}$ from the drive circuit 12B corresponding to the potential of the signal line 16B. Note that it is sufficient that the differential comparator 1111 can detect the inversion level of a signal and that an inverter circuit, a NAND circuit, or the like can be used instead of the differential comparator 1111.

The clock signals $C_{in}$ and $C_{inB}$ externally input are used as one input to the NAND circuit 1112A and as one input to the NAND circuit 1113A. The differential outputs DRCMP and DRCMPB from the differential comparator 1111 are used as the other input to the NAND circuit 1112A and as the other input to the NAND circuit 1113A. Then, outputs from the NAND circuits 1112A and 1113A are derived through the NAND circuit 1114 and the inverter circuit 1115 as the control pulse SWR for driving the N channel MOS transistor 132 for pulse control.

The output from the NAND circuit 1112A is derived through the inverter circuit 1116 as the control pulse $SW_n$ for driving the N channel MOS transistor $Qn_{11}$ of the drive circuit 12A. The output from the NAND circuit 1112A is further derived through the buffer circuit 1118 as the control pulse $SW_{nB}$ for driving the N channel MOS transistor $Qn_{12}$ of the drive circuit 12B.

The output from the NAND circuit 1113A is derived through the inverter circuit 1117 as the control pulse $SW_p$ for driving the N channel MOS transistor $Qn_{11}$ of the drive circuit 12A. The output from the NAND circuit 1113A is further derived through the buffer circuit 1119 as the control pulse $SW_{PB}$ for driving the N channel MOS transistor $Qp_{12}$ of the drive circuit 12B.

Figure 48:
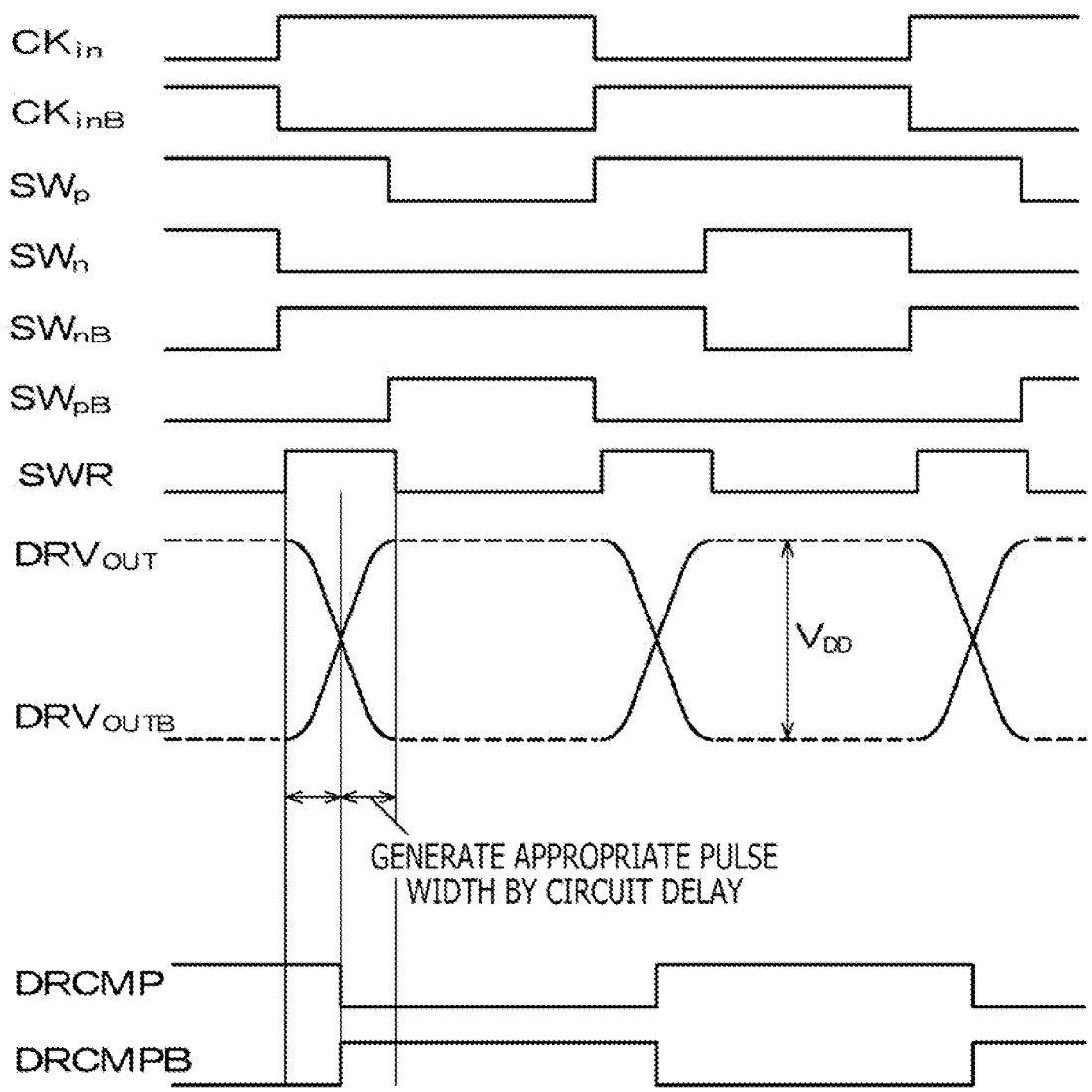
FIG. 48 is a timing chart illustrating a timing relationship among signals from sections of the clock distribution circuit according to Example 15.

FIG. 48 illustrates a timing relationship among signals from sections of the clock distribution circuit 10 according to Example 15 with the control circuit 11 described above. A timing chart in FIG. 48 illustrates a timing relationship among the clock signals $C_{in}$ and $C_{inB}$, the clock pulses $SW_p$ and $SW_n$, the clock pulses $SW_{nB}$ and $SW_{pB}$, the control pulse SWR, the outputs $DRV_{OUT}$ and $DRV_{OUTB}$ from the two drive circuits 12A and 12B, and the differential outputs DRCMP and DRCMPB from the differential comparator 1111. The output $DRV_{CUT}$ from the drive circuit 12A and The output $DRV_{OUTB}$ from the drive circuit 12B have an amplitude of $V_{DD}$.

As illustrated in the timing chart in FIG. 48, the control circuit 11 generates an appropriate pulse width from the cross point between the $DRV_{OUT}$ and $DRV_{OUTB}$ from the two drive circuits 12A and 12B. Thus, the clock distribution circuit 10 is configured such that the synchronous delay circuit (SMD) 15 is omitted and such that circuit delay is used to generate a pulse width for the control pulse SWR, enabling a reduction in circuit scale of the clock distribution circuit 10 as a whole.

Note that the case of application to the clock distribution circuit 10 using the power supply voltage $V_{DD}$ and providing a large amplitude but that the techniques of the present example can be similarly applied to the clock distribution circuit 10 using the power supply voltage $(½)V_{DD}$ and providing a small amplitude, as described in Example 7 etc.

Example 16

Figure 49:
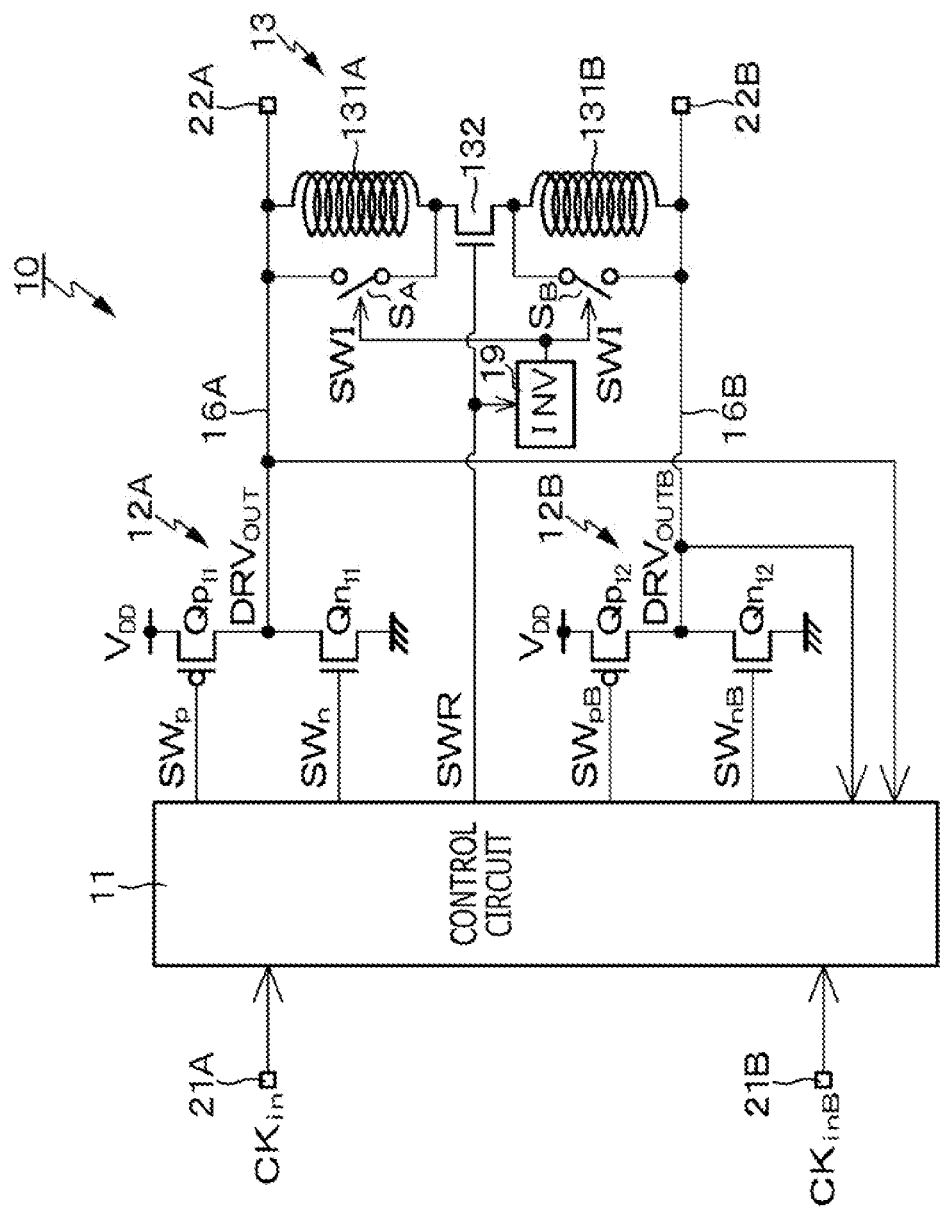
FIG. 49 is a circuit diagram illustrating a circuit configuration of a clock distribution circuit according to Example 16.

Example 16 is an example in which the opposite ends of the inductor element are selectively short-circuited. FIG. 49 illustrates a circuit configuration of the clock distribution circuit 10 according to Example 16.

In addition to the components of Example 6 (see FIG. 22), the clock distribution circuit 10 according to Example 16 includes switch elements $S_A$ and $S_B$ short-circuiting the opposite ends of the inductor element 131A and 131B and an inverter circuit 19.

The inverter circuit 19 inverts the logic of the control pulse SWR driving the N channel MOS transistor 132 for pulse control, and feeds the inverted logic to the switch elements $S_A$ and $S_B$ as a switch control signal SWI driving the switch elements $S_A$ and $S_B$. The switch elements $S_A$ and $S_B$ respond to the switch control signal SWI, and when the control pulse SWR is in an inactive state (at a low level), come into the on (closed) state, short-circuiting the opposite ends of the inductor element 131A and 131B.

Note that, also in this example, with the inductor elements 131A and 131B not provided, the drain electrode of the MOS transistor 132 may be connected directly to the signal line 22A and that the source electrode of the MOS transistor 132 may be connected directly to the signal line 22B. Alternatively, also in this example, with the inductor elements 131A and 131B not provided, the drain electrode of the MOS transistor 132 may be connected to the signal line 16A with the switch element $S_A$ in the on (closed) state and that the source electrode of the MOS transistor 132 may be connected to the signal line 16B with the switch element $S_B$ in the on state. For control of the switch elements $S_A$ and $S_B$, the inverter circuit 19 may be replaced with a logic circuit such as an AND circuit to generate a switch control signal to control the switch elements $S_A$ and $S_B$ independently of the control pulse SWR.

Figure 50:
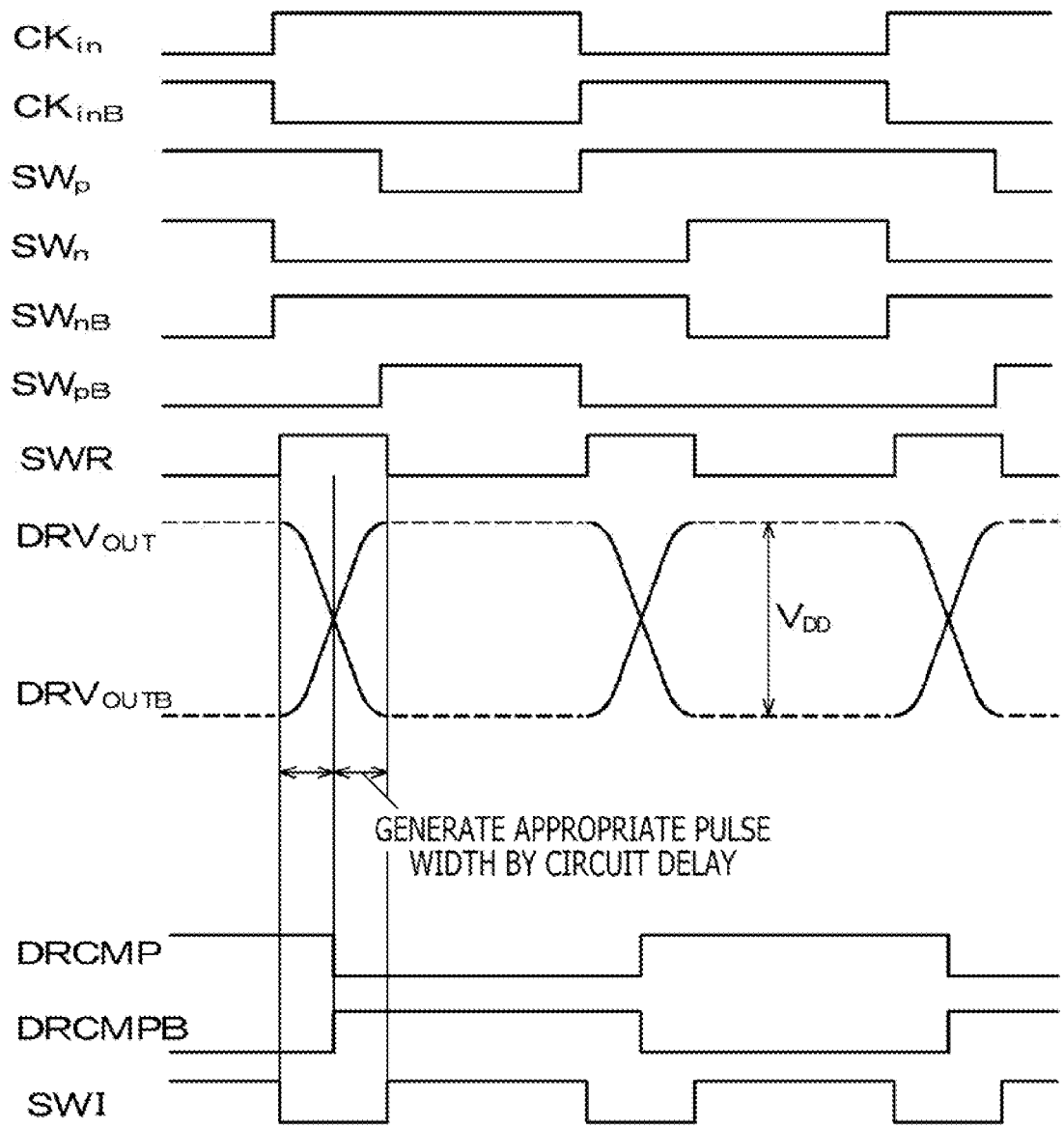
FIG. 50 is a timing chart illustrating a timing relationship among signals from sections of the clock distribution circuit according to Example 16.

FIG. 50 illustrates a timing relationship among signals from sections of the clock distribution circuit 10 according to Example 16. A timing chart in FIG. 50 illustrates a timing relationship among the clock signals $C_{in}$ and $C_{inB}$, the clock pulses $SW_p$ and $SW_n$, the clock pulses $SW_{nB}$ and $SW_{pB}$, the control pulse SWR, the outputs $DRV_{OUT}$ and $DRV_{OUTB}$ from the two drive circuits 12A and 12B, the differential outputs DRCMP and DRCMPB from the differential comparator 1111, and the switch control signal SWI.

As described above, when the control pulse SWR is in the inactive state, the switch elements $S_A$ and $S_B$ short-circuit the opposite ends of the inductor elements 131A and 131B, allowing excess power consumption in the inductor elements 131A and 131B to be suppressed. This enables reduced consumed power. Note that, here, the case has been illustrated in which the techniques in the present example are applied to the clock distribution circuit according to Example 15 (see FIG. 46) but that no such limitation is intended and that the techniques can be similarly applied to the clock distribution circuits according to all of the other Examples.

Second Embodiment

In the first embodiment, the intermittent resonance circuit based on pulse control has been described. In contrast, in the second embodiment, a clock distribution circuit will be described that includes an LC resonance circuit using no pulse control. First, a known example of the clock distribution circuit including the LC resonance circuit using no pulse control will be described.

Figure 51A:
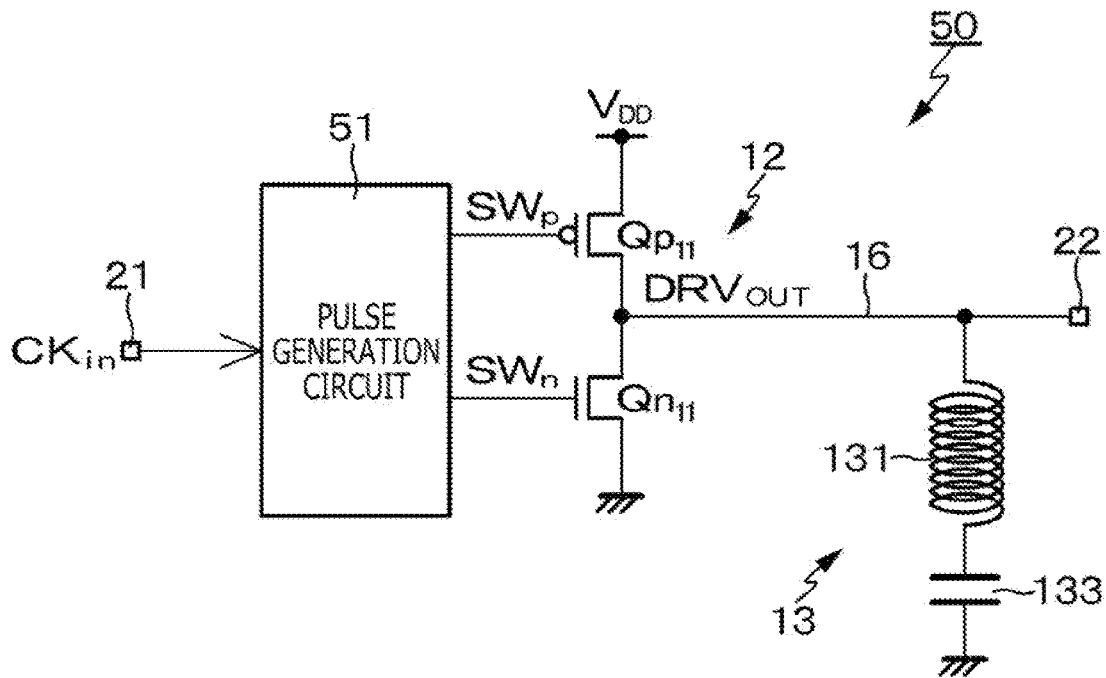
FIG. 51A is a circuit diagram illustrating a circuit configuration in a known example of a clock distribution circuit with an LC resonance circuit using no pulse control.
Figure 51B:
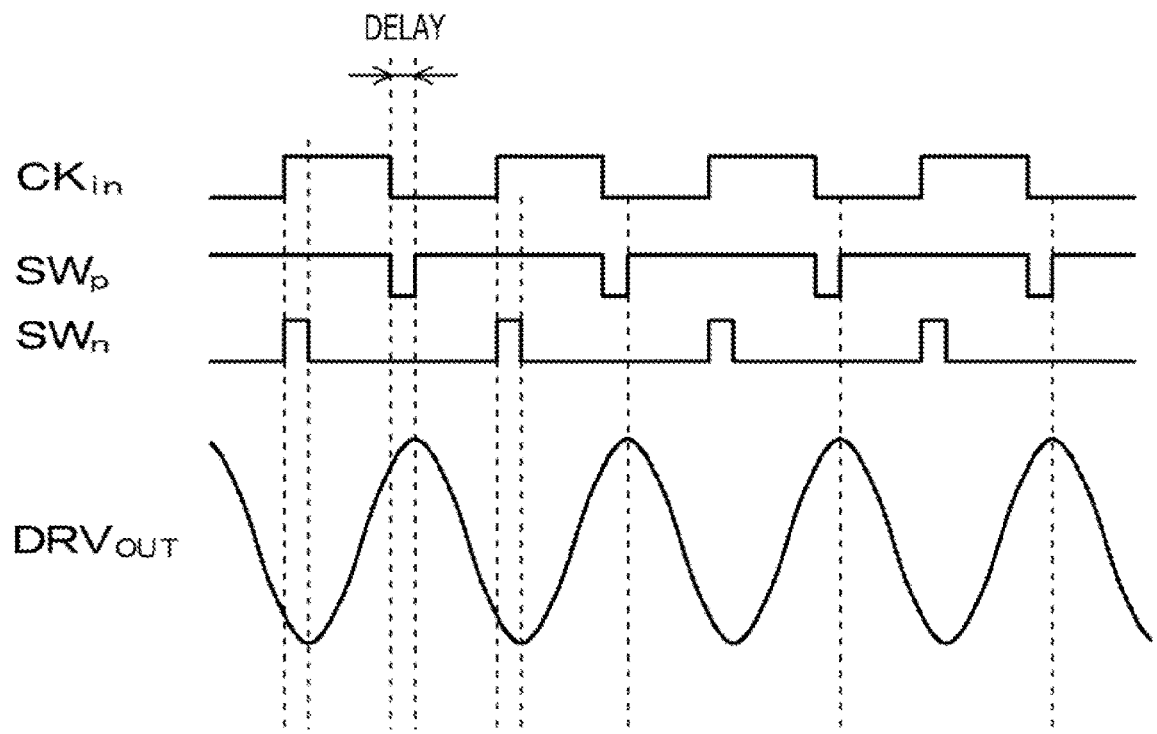
FIG. 51B is a timing chart illustrating a timing relationship among signals from sections of the clock distribution circuit according to the known example.

FIG. 51A illustrates a circuit configuration of the clock distribution circuit according to the known example, and FIG. 51B illustrates a timing relationship among signals from sections of the clock distribution circuit.

A clock distribution circuit 50 in the known example includes a pulse generation circuit 51, the drive circuit 12, and the series connection circuit 13. On the basis of the clock signal $C_{in}$ externally input via the circuit input terminal 21, the pulse generation circuit 51 generates the clock pulses $SW_p$ and $SW_n$, driving the P channel MOS transistor $Qp_{11}$ and the N channel MOS transistor $Qn_{11}$ in the drive circuit 12.

In the clock distribution circuit 50 according to the known example, the MOS transistor 132 (see FIG. 1) of the series connection circuit 13 connected between the signal line 16 and the ground potential GND is omitted to provide a configuration of LC resonance using no pulse control. Omission of the MOS transistor 132 prevents a decrease in resonance efficiency using simple control.

However, in the clock distribution circuit 50 according to the known technique, in the generation of the clock pulses $SW_p$ and $SW_n$ by the pulse generation circuit 51, the clock width corresponds to a delay in the clock pulses $SW_p$ and $SW_n$, degrading characteristics as illustrated in the clock in FIG. 51B.

Thus, in the second embodiment of the present disclosure, for prevention of characteristic degradation of the clock distribution circuit with LC resonance using no pulse control from, the clock pulses $SW_p$ and $SW_n$, are generated at a negative timings with respect to timings for the rising and falling of the clock signal $C_{in}$ externally input. A specific example of a clock distribution circuit of a second embodiment will be described.

Example 17

Figure 52A:
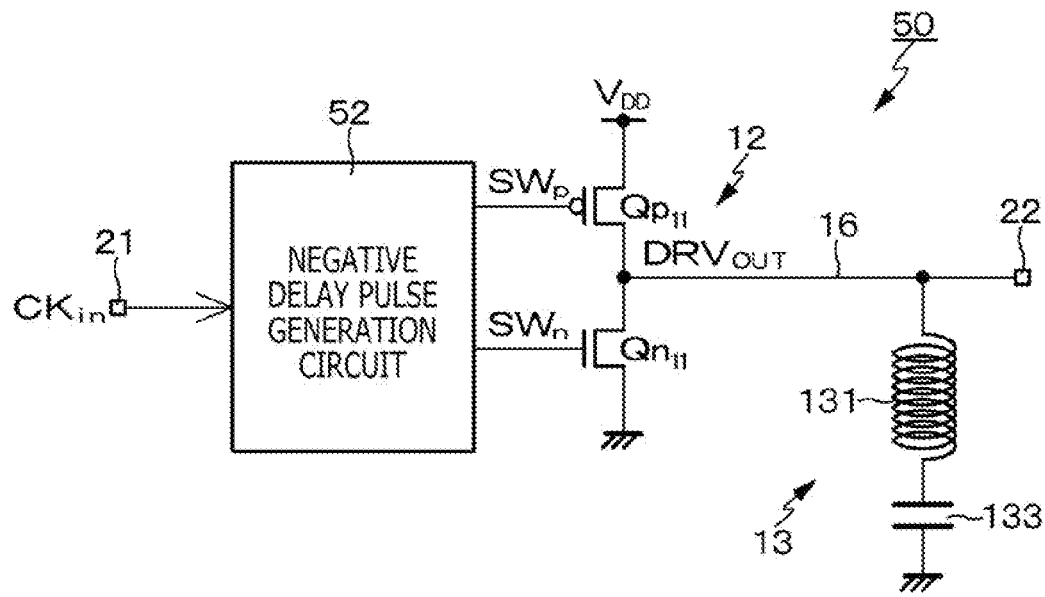
FIG. 52A is a circuit diagram illustrating a circuit configuration of a clock distribution circuit according to Example 17.
Figure 52B:
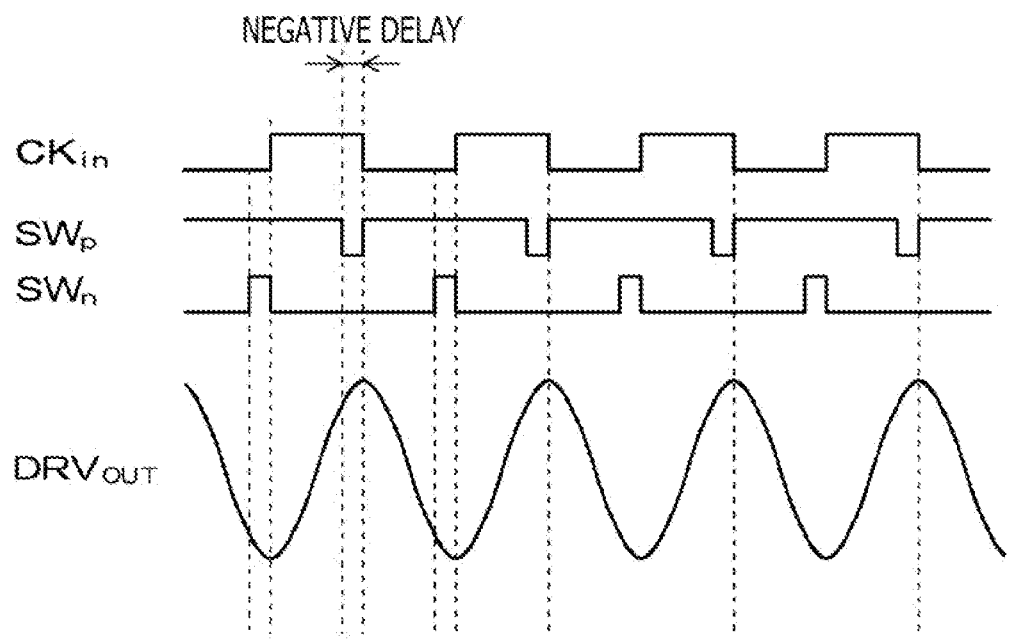
FIG. 52B is a timing chart illustrating a timing relationship among signals from sections of the clock distribution circuit according to Example 17.

Example 17 is an example in which a negative delay pulse generation circuit is used to generate the clock pulses $SW_p$ and $SW_n$. FIG. 52A illustrates a circuit configuration of a clock distribution circuit according to Example 17, and FIG. 52B illustrates a timing relationship among signals from sections of the clock distribution circuit according to Example 17.

The clock distribution circuit 50 according to Example 17 is configured to use a negative delay pulse generation circuit 52 as a circuit generating the clock pulses $SW_p$ and $SW_n$ driving the P channel MOS transistor $Qp_{11}$ and the N channel MOS transistor $Qn_{11}$ on the basis of the clock signal $C_{in}$ externally input. As illustrated in a timing chart in FIG. 52B, the negative delay pulse generation circuit 52 performs generation at negative timings with respect to timings for the rising and falling of the clock signal $C_{in}$, that is, generates negative delay clock pulses $SW_p$ and $SW_n$.

Thus, by generating the clock pulses $SW_p$ and $SW_n$ with negative delays with respect to timings for the rising and falling of the clock signal $C_{in}$, a possible decrease in resonance efficiency can be prevented by easy control without degradation of characteristics attributed to delays in clock pulses $SW_p$ and $SW_n$.

A synchronous delay circuit (SMD) can be used as the negative delay pulse generation circuit 52. The principle of the synchronous delay circuit (SMD) is as illustrated in FIG. 4. Additionally, for a synchronous delay circuit, for example, a circuit configuration illustrated in FIG. 6 can be used. The use of this synchronous delay circuit (SMD) allows generation of the clock pulses $SW_p$ and $SW_n$ with negative delays with respect to timings for the rising and falling of the clock signal $C_{in}$.

Modified Examples

The techniques of the present disclosure have been described on the basis of the preferred embodiments, but are not intended to be limited to the embodiments. The configuration and structure of the clock distribution circuit described in each of the above-described embodiments are illustrative and can be changed as appropriate. For example, each of the above-described embodiments assumes that the inductor element is formed in a chip (semiconductor substrate) in which the clock distribution circuit is formed. However, the inductor element may be formed outside the chip.

Additionally, the clock distribution circuit according to each of the above-described embodiments can be used to distribute the clock to other circuits present within one chip or to other circuits present outside the chip. Besides, in the examples of the differential configuration, the differential configuration allows duty to be easily adjusted and makes frequency variable, and thus the clock distribution circuit may be used in a double edge trigger system with the frequency reduced by half. Additionally, the techniques of the present disclosure may be configured in multiple layers and used with the clock frequently turned on and off by clock gating.

Additionally, as illustrated in FIG. 53, in a transmission system including a transmission section 60 and a reception section 70 connected by a transmission cable (communication cable) 80, the clock distribution circuit 10 (50) according to each embodiment can be built in the transmission section 60 to distribute, through the transmission cable 80, the clock to a circuit built in the reception section 70.

In the transmission system, typically, a terminating resistor $R_x$ is attached to a terminal of the transmission cable 80 in order to prevent unwanted reflection of signals at the terminal of the cable. In clock distribution by the clock distribution circuit 10 (50) according to each embodiment, the terminating resistor $R_x$ may or may not be attached. In a case where the terminating resistor $R_x$ is not attached, the power consumption of the system as a whole can be reduced by an amount corresponding to power consumption at the terminating resistor $R_x$.

Additionally, the clock distribution circuit 10 according to the first embodiment uses an LC resonance circuit causing intermittent resonance, allowing the period of LC resonance to be optionally set. Thus, the clock distribution circuit 10 according to the first embodiment can be utilized for data transmission as well as for clock transmission.

Besides, in Example 6 according to the first embodiment and a modified example of Example 6, in regard to a power reduction effect, the differential configuration doubles the wiring capacity to cause an approximately twofold increase in power, and application of an intermittent resonance circuit enables a reduction by a factor of approximately 0.35 to approximately 0.4, and a further reducing the output amplitude enables a reduction by a factor of approximately 0.6. In addition, by applying the clock distribution circuit to a double edge trigger system and reducing the clock frequency to half, the increase in power can be reduced by a factor of approximately 0.7. Thus, a rough estimation indicates that, compared to a single phase clock, this configuration can reduce the power by a factor of approximately 0.3 to approximately 0.34 (=2×(0.35 to 0.4)×0.6×0.7). By clock gating the above configuration, the clock can be easily turned on and off, and the power can be reduced by a factor of approximately 0.34 to approximately 0.4. The combination of these low-power configurations can be changed according to system requirements, enabling power reduction depending on the combination.

<System Equipped with Clock Distribution Circuit>

The semiconductor circuit apparatus of the present disclosure described above (that is, the clock distribution circuit) can be used as the clock distribution circuit in various systems equipped with the clock distribution circuit. Specific applied examples are illustrated below in which the clock distribution circuit 10 (50) according to each of the embodiments described above is applied to systems that can use the clock distribution circuit.

Applied Example 1

Applied Example 1 is an example of application to a memory such as a DRAM. FIG. 54 illustrates a configuration of a system according to Applied Example 1. In a memory 100 according to Applied Example 1 illustrated in FIG. 54, the clock distribution circuit 10 (50) according to each of the embodiments described above can be applied to clock distribution of write clock (WCK) generation units 101 and 102 provided in the memory 100.

Applied Example 2

Figure 55:
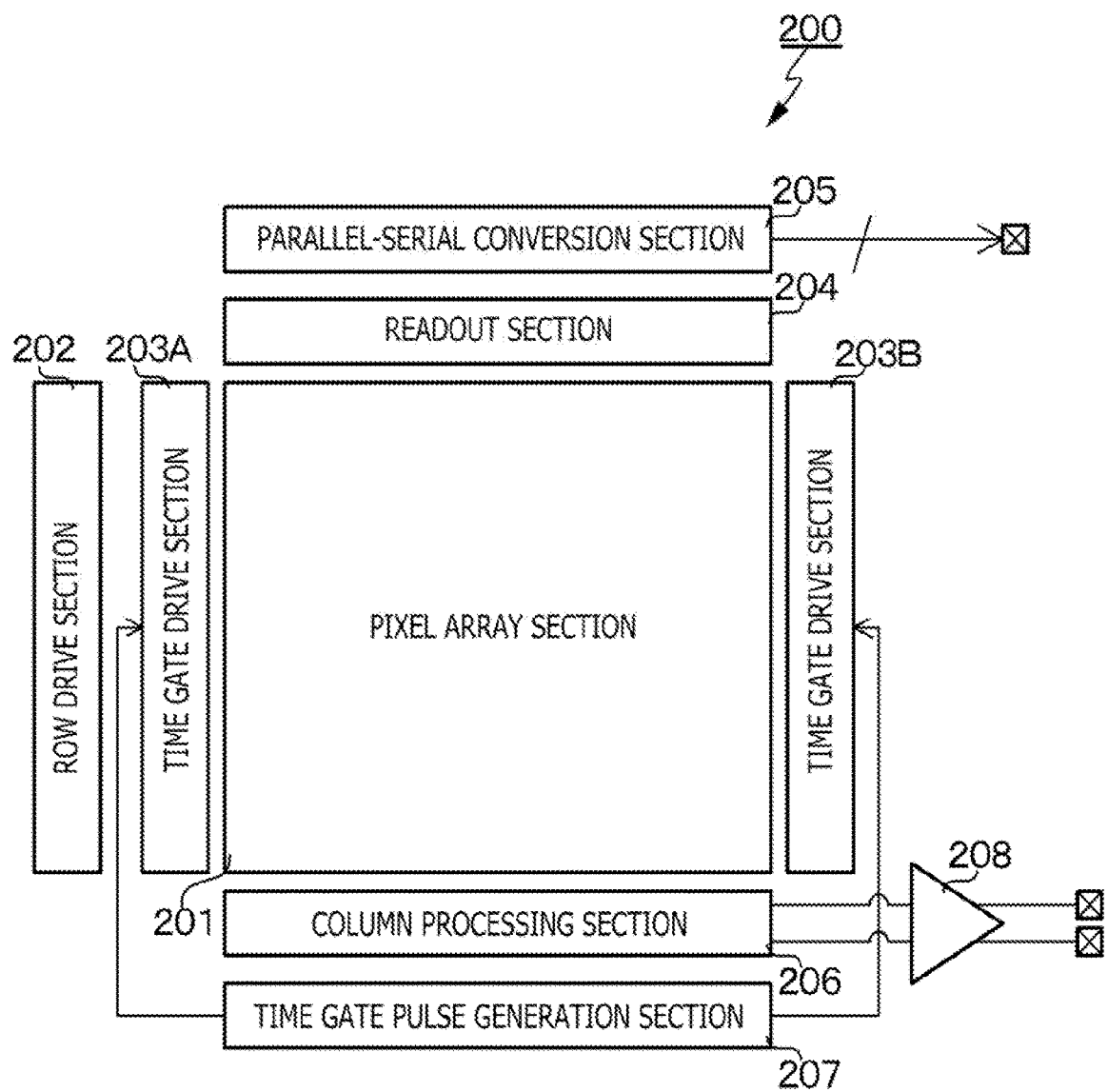
FIG. 55 is a schematic configuration diagram illustrating a configuration of a system according to Applied Example 2.

Applied Example 2 is an example of application to a TOF (time of flight) sensor. FIG. 55 illustrates a configuration of a system according to Applied Example 2. A TOF sensor 200 according to Applied Example 2 includes a pixel array section 201, a row drive section 202, a time gate drive sections 203A and 203B, a readout section 204, a parallel-serial conversion section 205, a column processing section 206, a time gate pulse generation section 207, and a differential amplifier 208. In the TOF sensor 200, the clock distribution circuit 10 (50) according to each of the embodiments described above can be applied to clock distribution of the time gate drive sections 203A and 203B.

Applied Example 3

Figure 56:
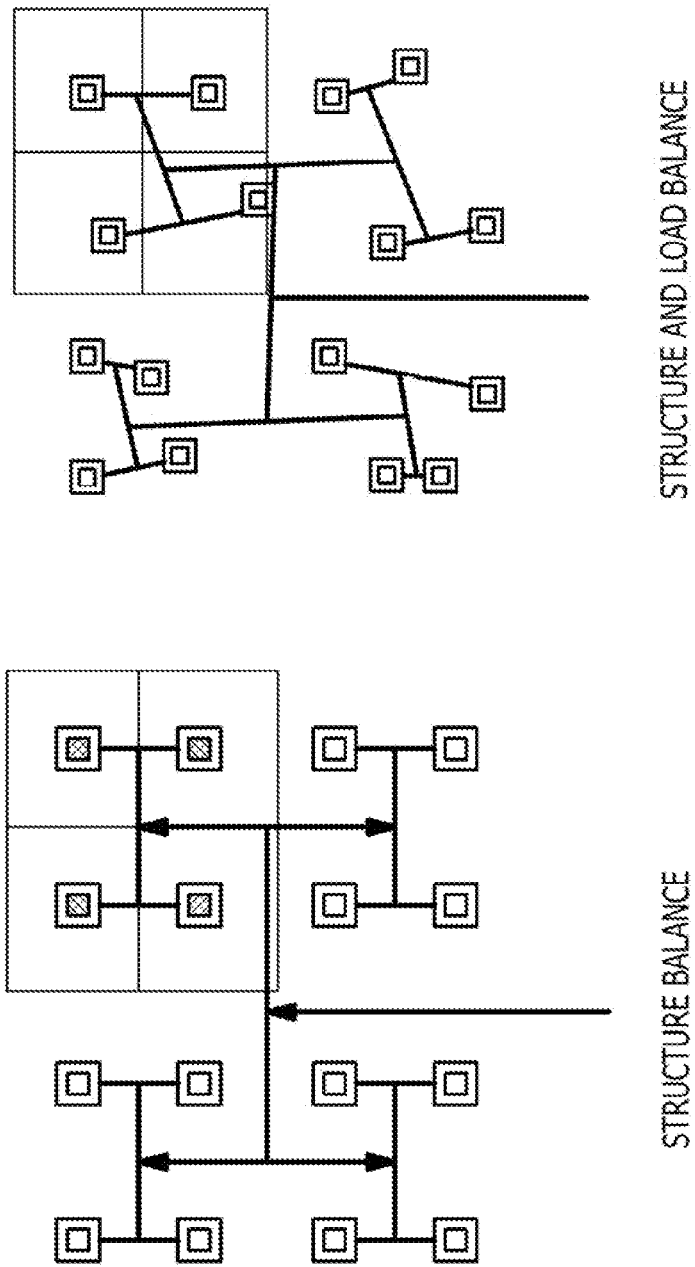
FIG. 56 is a descriptive diagram of a configuration of a system according to Applied Example 3.

Applied Example 3 is an example of application to a large-scale logic LSI. FIG. 56 illustrates a configuration of a system according to Applied Example 3. FIG. 56 illustrates an example of generation of a clock tree based on a structure and load balance (H tree). The clock distribution circuit 10 (50) according to each of the embodiments described above can be applied to clock distribution inside the large-scale logic LSI according to Applied Example 3.

Applied Example 4

Figure 57:
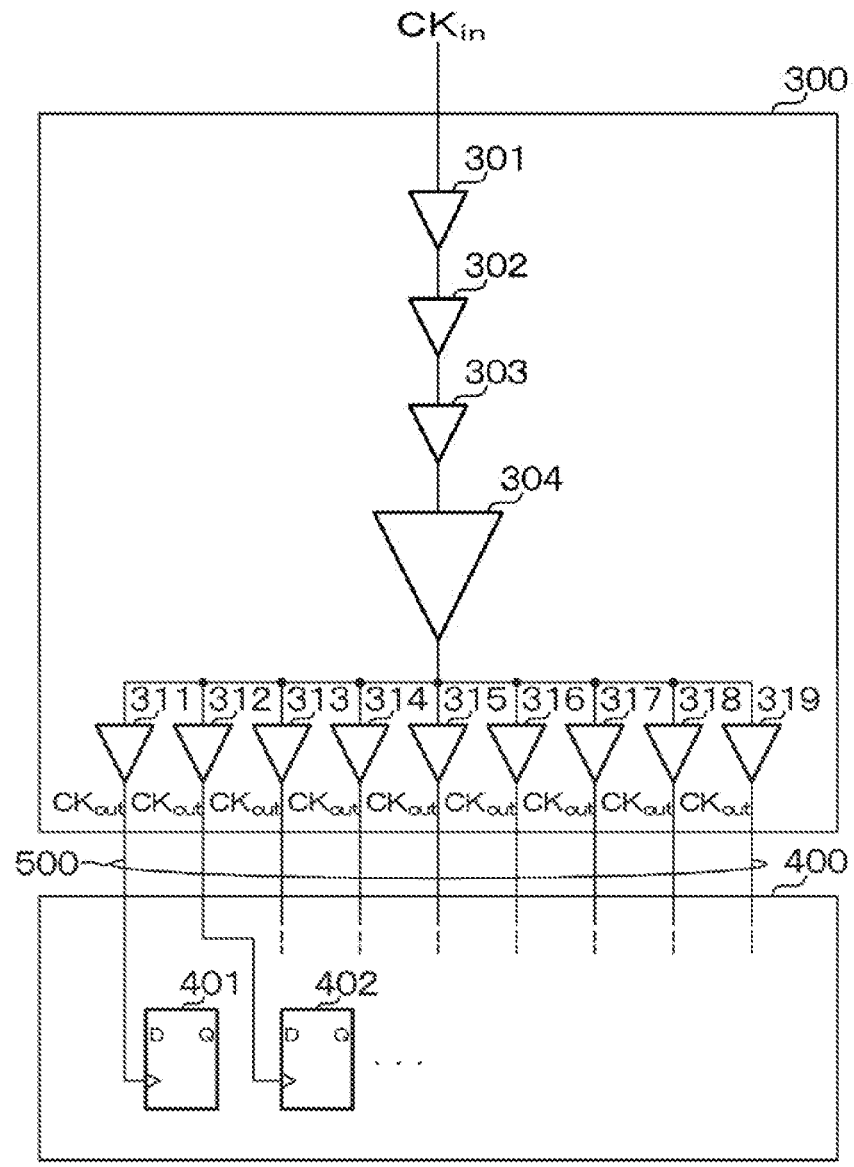
FIG. 57 is a block diagram illustrating a configuration of a system according to Applied Example 4.

Applied Example 4 is also an example of application to a large-scale logic LSI. FIG. 57 illustrates a configuration of a system according to Applied Example 4. A large-scale logic LSI according to Applied Example 4 includes a clock distribution circuit 300 and a synchronous operation circuit 400.

The clock distribution circuit 300 includes a plurality of normal buffer circuits 301 to 303, a large buffer circuit 304, and a plurality of buffer circuits 311 to 319. The clock distribution circuit 300 distributes the clock signal $CK_{in}$ into a plurality of clock signals CKout and outputs the clock signals CKout to a synchronous operation circuit 400 via a signal line group 500. The synchronous operation circuit 400 includes a plurality of flip flops 401, 402, . . . and executes predetermined signal processing in synchronism with the clock signal CKout fed from the clock distribution circuit 300.

In a large-scale logic LSI according to Applied Example 4 configured as described above, for example, the clock distribution circuit 10 (50) according to each of the embodiments described above can be applied to the large buffer circuit 304 of the clock distribution circuit 300.

Applied Example 5

Figure 58A:
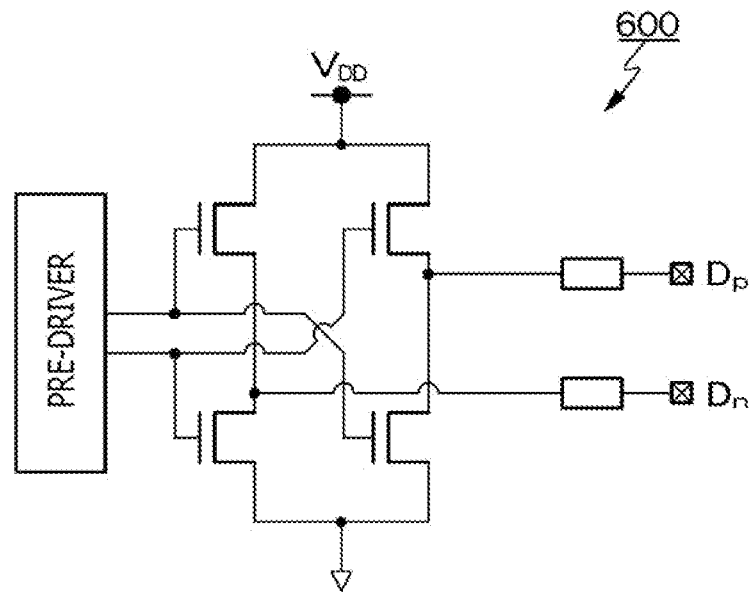
FIGS. 58A and 58B is circuit diagrams illustrating configurations of systems according to Applied Example 5.
Figure 58B:
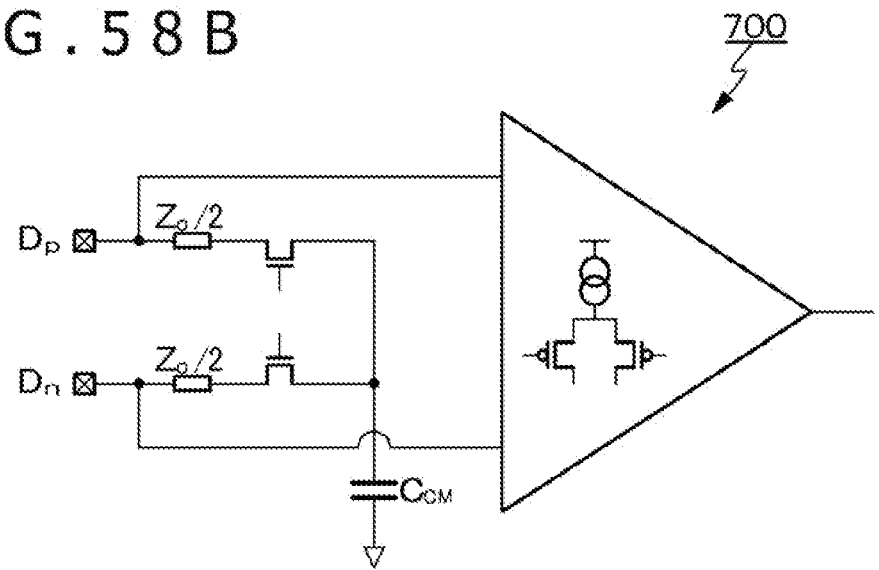

Applied Example 5 is an example of application to a high-speed interface output circuit. For example, in the above-described transmission system (see FIG. 53), when a transmission circuit 600 illustrated in FIG. 58A is used on the transmission section 60 side and a reception circuit illustrated in FIG. 58B is used on the reception section 70 side, the clock distribution circuit 10 (50) according to each of the embodiments described above can be applied to an output circuit of the transmission circuit 600.

In the transmission circuit 600, a terminating resistor ($Z_o/2$ connected in parallel) corresponding to the terminating resistor $R_x$ in FIG. 53 can be disconnected, and at this time, application of the clock distribution circuit 10 (50) according to each of the above-described embodiments enables a reduction in power consumption. Additionally, even in a case where the terminating resistor is not disconnected, application of the clock distribution circuit 10 (50) enables a reduction in power consumption during signal switching.

<Configuration that can be Taken by Present Disclosure>

Note that the present disclosure can take the following configurations.

<<A. Semiconductor Circuit Apparatus>>

[A-1]

A semiconductor circuit apparatus including:

a control circuit controlling a clock signal externally input;

a drive circuit performing a switching operation according to a pulse signal provided by the control circuit;

a series connection circuit including an inductor element, a switch element, and a capacitive element connected in series between a signal line and a fixed potential node, the series connection circuit forming an LC resonance circuit; and a level detection circuit having an input end connected to the signal line, in which an output from the level detection circuit is fed back to the control circuit.

[A-2]

The semiconductor circuit apparatus according to [A-1] described above, in which the level detection circuit detects an intermediate transition position of LC resonance.

[A-3]

The semiconductor circuit apparatus according to [A-2] described above, in which the level detection circuit includes a comparator at a first input end connected to a signal line and at a second input end connected to a node between the inductor element and the capacitive element.

[A-4]

The semiconductor circuit apparatus according to [A-3] described above, in which the comparator detects an intermediate transition point of LS resonance.

[A-5]

The semiconductor circuit apparatus according to [A-4] described above, in which the intermediate transition point of LC resonance corresponds to a level of a half of a power supply voltage.

[A-6]

The semiconductor circuit apparatus according to [A-4] described above, in which the intermediate transition point of LC resonance corresponds to a level of a quarter of the power supply voltage.

[A-7]

The semiconductor circuit apparatus according to any one of [A-1] to [A-6] described above, in which a synchronous delay circuit is provided in a feedback path from the level detection circuit to the control circuit, and the synchronous delay circuit detects a time when an intermediate transition point of a resonance amplitude is reached and reproduces a time identical to the time detected.

[A-8]

The semiconductor circuit apparatus according to any one of [A-1] to [A-7] described above, in which a pull-up element of the drive circuit includes an N channel MOS transistor.

[A-9]

The semiconductor circuit apparatus according to [A-1] described above, in which two drive circuits and two signal lines are provided, and the two drive circuits output a differential signal.

[A-10]

The semiconductor circuit apparatus according to [A-9] described above, in which the level detection circuit detects the level of a quarter of the power supply voltage.

[A-11]

The semiconductor circuit apparatus according to [A-9] or [A-10] described above, in which pull-up elements of the two drive circuits each include an N channel MOS transistor.

[A-12]

The semiconductor circuit apparatus according to [A-7] described above, in which the synchronous delay circuit is enabled to adjust a delay time in a forward direction and in a backward direction.

[A-13]

The semiconductor circuit apparatus according to [A-1] described above, in which the switch element includes an N channel MOS transistor, and the semiconductor circuit apparatus includes a circuit adjusting a voltage value of a control pulse driving the switch element.

[A-14]

The semiconductor circuit apparatus according to [A-6] described above, in which when the intermediate transition position of LC resonance corresponds to the level of a quarter of the power supply voltage, the semiconductor circuit apparatus internally includes a small-amplitude power supply generation circuit generating a power supply voltage.

[A-15]

The semiconductor circuit apparatus according to [A-9] described above, in which two synchronous delay circuits are provided corresponding to the two drive circuits, and the two synchronous delay circuits detect a time when an intermediate transition position of a resonance amplitude is reached and reproduces a time identical to the time detected, on the basis of outputs from the two drive circuits and a control pulse driving the switch element.

[A-16]

The semiconductor circuit apparatus according to [A-9] described above, in which the control circuit generates a control pulse driving the switch element on the basis of the clock signal externally input and each of the outputs from the two drive circuits.

[A-17]

The semiconductor circuit apparatus according to any one of [A-1] to [A-16] described above, in which, when the control pulse driving the switch element is in an inactive state, opposite ends of the inductor element are short-circuited.

[A-18]

The semiconductor circuit apparatus according to any one of [A-1] to [A-17] described above, in which the semiconductor circuit apparatus includes a clock distribution circuit distributing a clock signal through the signal line.

<<B. System Equipped with Semiconductor Circuit Apparatus>>

[B-1]

A system equipped with a semiconductor circuit apparatus, the semiconductor circuit apparatus including a control circuit controlling a clock signal externally input, a drive circuit performing a switching operation according to a pulse signal provided by the control circuit, a series connection circuit including an inductor element, a switch element, and a capacitive element connected in series between a signal line and a fixed potential node, the series connection circuit forming an LC resonance circuit, and a level detection circuit including an input end connected to the signal line, in which an output from the level detection circuit is fed back to the control circuit.

[B-2]

The system according to [B-1] described above, in which the level detection circuit detects an intermediate transition position of LC resonance.

[B-3]

The system according to [B-2] described above, in which the level detection circuit includes a comparator at a first input end connected to a signal line and at a second input end connected to a node between the inductor element and the capacitive element.

[B-4]

The system according to [B-3] described above, in which the comparator detects an intermediate transition point of LS resonance.

[B-5]

The system according to [B-4] described above, in which the intermediate transition point of LC resonance corresponds to a level of a half of a power supply voltage.

[B-6]

The system according to [B-4] described above, in which the intermediate transition point of LC resonance corresponds to a level of a quarter of the power supply voltage.

[B-7]

The system according to any one of [B-1] to [B-6] described above, in which a synchronous delay circuit is provided in a feedback path from the level detection circuit to the control circuit, and the synchronous delay circuit detects a time when an intermediate transition point of a resonance amplitude is reached and reproduces a time identical to the time detected.

[B-8]

The system according to any one of [B-1] to [B-7] described above, in which a pull-up element of the drive circuit includes an N channel MOS transistor.

[B-9]

The system according to [B-1] described above, in which two drive circuits and two signal lines are provided, and the two drive circuits output a differential signal.

[B-10]

The system according to [B-9] described above, in which the level detection circuit detects the level of a quarter of the power supply voltage.

[B-11]

The system according to [B-9] or [B-10] described above, in which pull-up elements of the two drive circuits each include an N channel MOS transistor.

[B-12]

The system according to [B-7] described above, in which the synchronous delay circuit is enabled to adjust a delay time in a forward direction and in a backward direction.

[B-13]

The system according to [B-1] described above, in which the switch element includes an N channel MOS transistor, and the system includes a circuit adjusting a voltage value of a control pulse driving the switch element.

[B-14]

The system according to [B-6] described above, in which when the intermediate transition position of LC resonance corresponds to the level of a quarter of the power supply voltage, the system internally includes a small-amplitude power supply generation circuit generating a power supply voltage.

[B-15]

The system according to [B-9] described above, in which two synchronous delay circuits are provided corresponding to the two drive circuits, and the two synchronous delay circuits detect a time when an intermediate transition position of a resonance amplitude is reached and reproduces a time identical to the time detected, on the basis of outputs from the two drive circuits and a control pulse driving the switch element.

[B-16]

The system according to [B-9] described above, in which the control circuit generates a control pulse driving the switch element on the basis of the clock signal externally input and each of the outputs from the two drive circuits.

[B-17]

The system according to any one of [B-1] to [B-16] described above, in which, when the control pulse driving the switch element is in an inactive state, opposite ends of the inductor element are short-circuited.

[B-18]

The system according to any one of [B-1] to [B-17] described above, in which the semiconductor circuit apparatus includes a clock distribution circuit distributing a clock signal through the signal line.

REFERENCE SIGNS LIST

10 . . . Clock distribution circuit, 11 . . . Control circuit, 12, 12A, 12B . . . Drive circuit, 13 . . . Series connection circuit, 14 . . . Level detection circuit, 15, 15A, 15B . . . Synchronous delay circuit (SMD), 16, 16A, 16B . . . Signal line, 17 . . . Boot circuit, 18 . . . Small-amplitude power supply generation circuit, 20 . . . Load, 21, 21A, 21B . . . Circuit input terminal, 22, 22A, 22B . . . Circuit output terminal, 131, 131A, 131B . . . Inductor element, 132 . . . N channel MOS transistor, 133 . . . Capacitive element, 134 . . . Capacitive circuit section, 141 . . . Comparator

The invention claimed is:

1. A semiconductor circuit apparatus comprising:
a control circuit controlling a clock signal externally input;
a drive circuit performing a switching operation according to a pulse signal provided by the control circuit;
a series connection circuit including an inductor element, a switch element, and a capacitive element connected in series between a signal line and a fixed potential node, the series connection circuit forming an LC resonance circuit; and
a level detection circuit having an input end connected to the signal line,
wherein an output from the level detection circuit is fed back to the control circuit.

2. The semiconductor circuit apparatus according to claim 1, wherein the level detection circuit detects an intermediate transition position of LC resonance.

3. The semiconductor circuit apparatus according to claim 2, wherein the level detection circuit includes a comparator at a first input end connected to a signal line and at a second input end connected to a node between the inductor element and the capacitive element.

4. The semiconductor circuit apparatus according to claim 3, wherein the comparator detects an intermediate transition point of LS resonance.

5. The semiconductor circuit apparatus according to claim 4, wherein the intermediate transition point of LC resonance corresponds to a level of a half of a power supply voltage.

6. The semiconductor circuit apparatus according to claim 4, wherein the intermediate transition point of LC resonance corresponds to a level of a quarter of the power supply voltage.

7. The semiconductor circuit apparatus according to claim 6, wherein when the intermediate transition position of LC resonance corresponds to the level of a quarter of the power supply voltage, the semiconductor circuit apparatus internally includes a small-amplitude power supply generation circuit generating a power supply voltage.

8. The semiconductor circuit apparatus according to claim 1, wherein a synchronous delay circuit is provided in a feedback path from the level detection circuit to the control circuit, and the synchronous delay circuit detects a time when an intermediate transition point of a resonance amplitude is reached and reproduces a time identical to the time detected.

9. The semiconductor circuit apparatus according to claim 8, wherein the synchronous delay circuit is enabled to adjust a delay time in a forward direction and in a backward direction.

10. The semiconductor circuit apparatus according to claim 1, wherein a pull-up element of the drive circuit includes an N channel MOS transistor.

11. The semiconductor circuit apparatus according to claim 1, wherein
two drive circuits and two signal lines are provided, and the two drive circuits output a differential signal.

12. The semiconductor circuit apparatus according to claim 11, wherein the level detection circuit detects the level of a quarter of the power supply voltage.

13. The semiconductor circuit apparatus according to claim 11, wherein pull-up elements of the two drive circuits each include an N channel MOS transistor.

14. The semiconductor circuit apparatus according to claim 11, wherein
two synchronous delay circuits are provided corresponding to the two drive circuits, and
the two synchronous delay circuits detect a time when an intermediate transition position of a resonance amplitude is reached and reproduces a time identical to the time detected, on a basis of outputs from the two drive circuits and a control pulse driving the switch element.

15. The semiconductor circuit apparatus according to claim 11, wherein the control circuit generates a control pulse driving the switch element on a basis of the clock signal externally input and each of the outputs from the two drive circuits.

16. The semiconductor circuit apparatus according to claim 1, wherein
the switch element includes an N channel MOS transistor, and
the semiconductor circuit apparatus includes a circuit adjusting a voltage value of a control pulse driving the switch element.

17. The semiconductor circuit apparatus according to claim 1, wherein, when the control pulse driving the switch element is in an inactive state, opposite ends of the inductor element are short-circuited.

18. The semiconductor circuit apparatus according to claim 1, wherein the semiconductor circuit apparatus includes a clock distribution circuit distributing a clock signal through the signal line.

19. A system equipped with a semiconductor circuit apparatus,
the semiconductor circuit apparatus including
a control circuit controlling a clock signal externally input,
a drive circuit performing a switching operation according to a pulse signal provided by the control circuit,
a series connection circuit including an inductor element, a switch element, and a capacitive element connected in series between a signal line and a fixed potential node, the series connection circuit forming an LC resonance circuit, and
a level detection circuit including an input end connected to the signal line,
wherein an output from the level detection circuit is fed back to the control circuit.

20. The system according to claim 19, wherein the semiconductor circuit apparatus includes a clock distribution circuit distributing a clock signal through the signal line.

* * * * *